US008921918B2

(12) United States Patent
Shim et al.

(10) Patent No.: US 8,921,918 B2
(45) Date of Patent: Dec. 30, 2014

(54) THREE-DIMENSIONAL SEMICONDUCTOR DEVICES

(75) Inventors: Jae-Joo Shim, Suwon-si (KR);
Kyoung-Hoon Kim, Yongin-si (KR);
Woonkyung Lee, Seongnam-si (KR);
Wonseok Cho, Suwon-si (KR);
Hoosung Cho, Yongin-si (KR); Jintaek Park, Hwaseong-si (KR); Jong-Yeon Kim, Seoul (KR); Sung-Min Hwang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 166 days.

(21) Appl. No.: 13/280,759

(22) Filed: Oct. 25, 2011

(65) Prior Publication Data

US 2012/0098050 A1   Apr. 26, 2012

(30) Foreign Application Priority Data

Oct. 25, 2010 (KR) .......................... 10-2010-0104114
Nov. 29, 2010 (KR) .......................... 10-2010-0119905

(51) Int. Cl.
*H01L 29/792* (2006.01)
*H01L 27/115* (2006.01)

(52) U.S. Cl.
CPC .... H01L 27/11578 (2013.01); H01L 27/11582 (2013.01); H01L 29/7926 (2013.01)
USPC ....................................................... 257/324

(58) Field of Classification Search
CPC ........ H01L 29/792; H01L 29/78; H01L 27/11
USPC ........... 257/324, 331, 314; 438/128, 287, 288
See application file for complete search history.

(56) References Cited

U.S. PATENT DOCUMENTS

| 7,067,871 | B2* | 6/2006 | Ozawa ........................ 257/315 |
| 7,602,028 | B2 | 10/2009 | Son et al. |
| 7,732,317 | B2* | 6/2010 | Shin et al. ..................... 438/597 |
| 7,867,831 | B2* | 1/2011 | Shin et al. ..................... 438/128 |
| 7,994,011 | B2* | 8/2011 | Park et al. ..................... 438/287 |
| 2009/0267128 | A1* | 10/2009 | Maejima ....................... 257/314 |
| 2009/0296476 | A1 | 12/2009 | Shin et al. |
| 2010/0254191 | A1* | 10/2010 | Son et al. ................. 365/185.05 |
| 2010/0314678 | A1* | 12/2010 | Lim et al. ..................... 257/324 |
| 2011/0012189 | A1* | 1/2011 | Jeong et al. ................... 257/324 |
| 2011/0255335 | A1* | 10/2011 | Grossi ..................... 365/185.01 |

FOREIGN PATENT DOCUMENTS

| JP | 2008-098641 | 4/2008 |
| JP | 2008-263029 | 10/2008 |
| JP | 2009-266945 | 11/2009 |
| KR | 100806339 | 2/2008 |
| KR | 1020090123476 | 12/2009 |
| KR | 1020100075098 | 7/2010 |

* cited by examiner

*Primary Examiner* — Matthew Landau
*Assistant Examiner* — Damon Hillman
(74) *Attorney, Agent, or Firm* — Myers Bigel Sibley & Sajovec, PA

(57) ABSTRACT

Three-dimensional semiconductor devices may be provided. The devices may include a stack-structure including gate patterns and an insulation pattern. The stack-structure may further include a first portion and a second portion, and the second portion of the stack-structure may have a narrower width than the first portion. The devices may also include an active pattern that penetrates the stack-structure. The devices may further include a common source region adjacent the stack-structure. The devices may additionally include a strapping contact plug on the common source region.

20 Claims, 44 Drawing Sheets

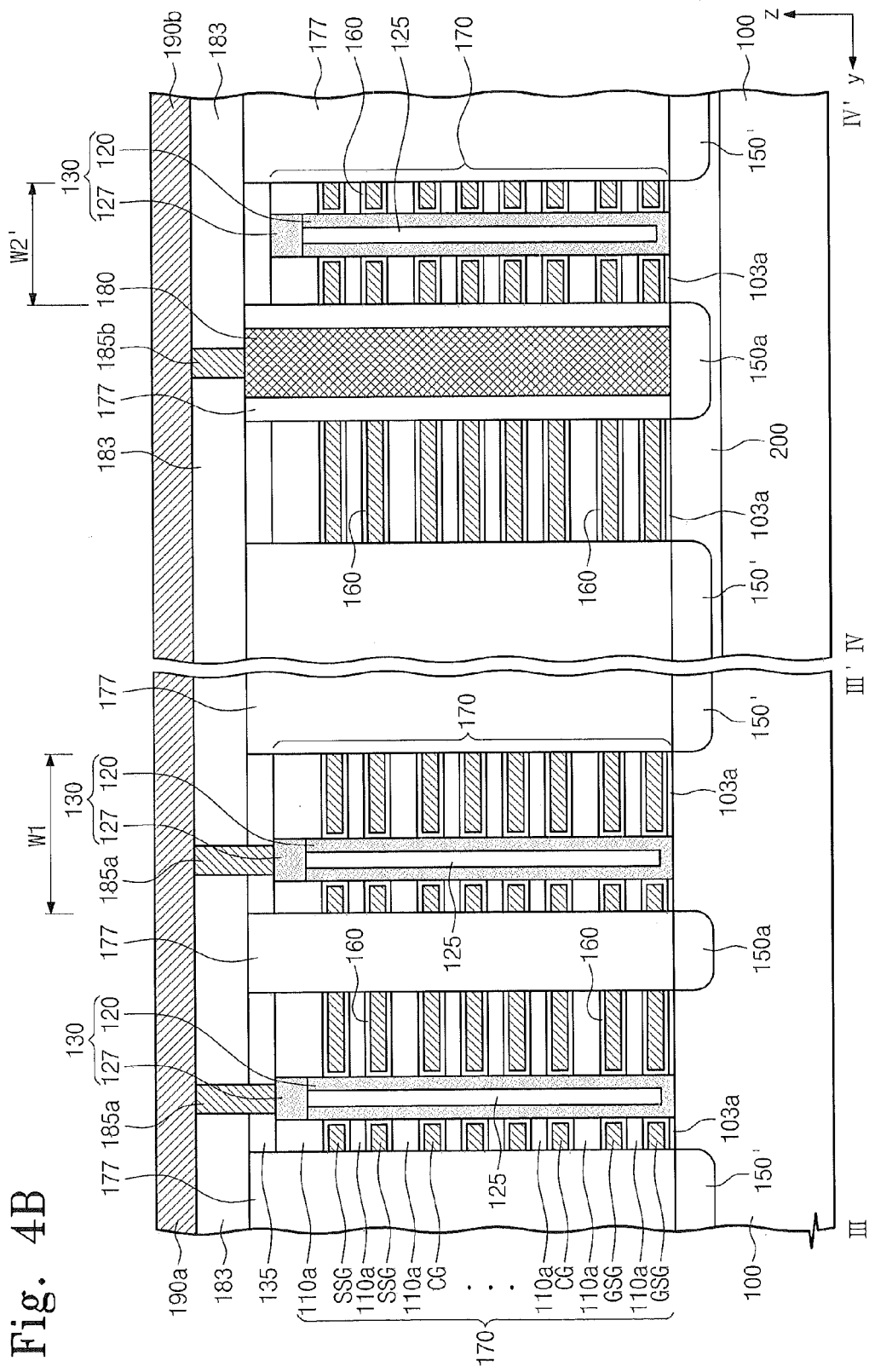

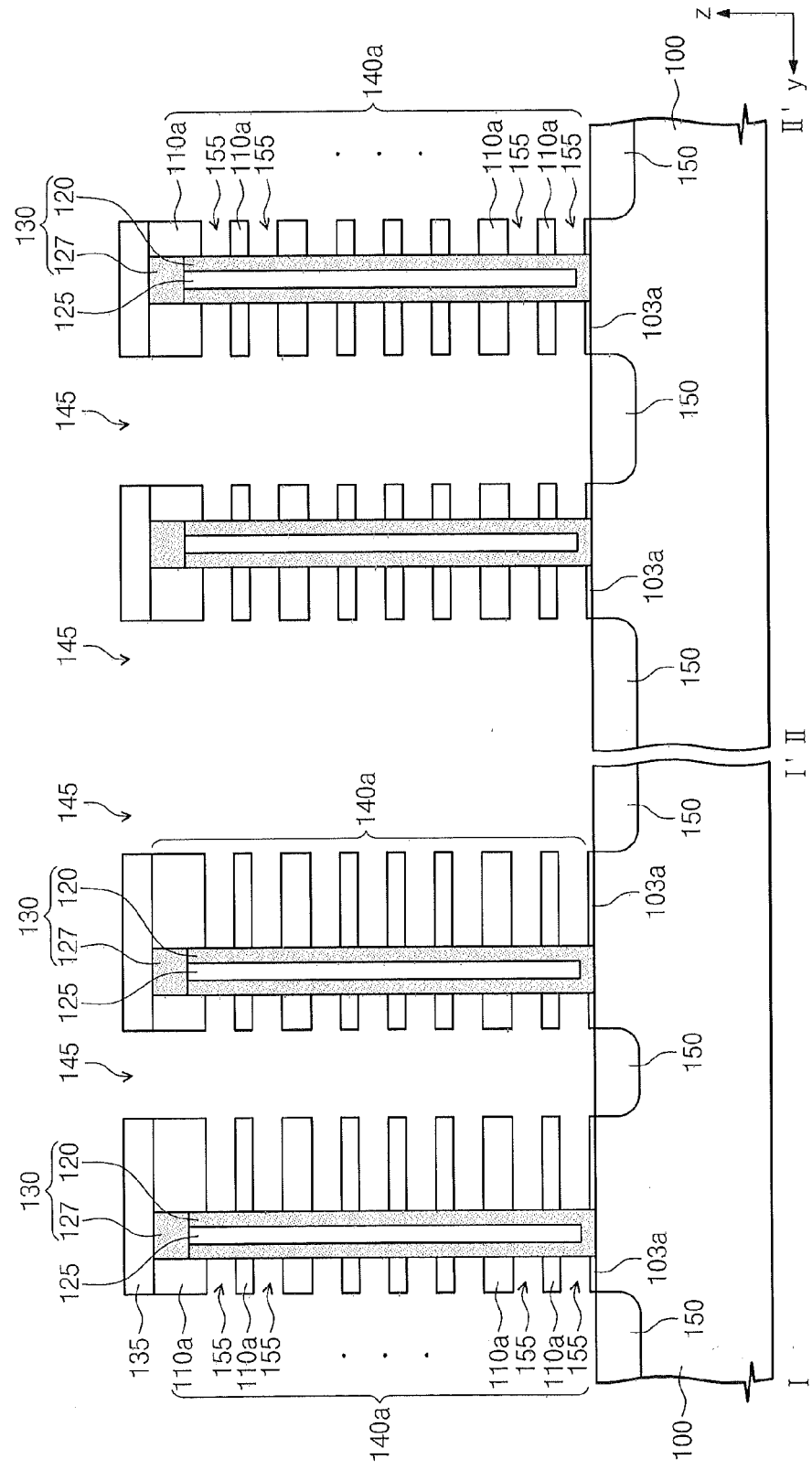

THREE-DIMENSIONAL SEMICONDUCTOR DEVICES

CROSS-REFERENCE TO RELATED APPLICATIONS

This U.S. non-provisional patent application claims priority under 35 U.S.C. §119 to Korean Patent Application Nos. 10-2010-0104114 and 10-2010-0119905, filed on Oct. 25, 2010 and Nov. 29, 2010, respectively, the disclosures of which are hereby incorporated by reference in their entireties.

BACKGROUND

The present disclosure herein relates to semiconductor devices and, more particularly, to three-dimensional semiconductor devices.

Semiconductor devices may be attractive to the electronics industry because of their small size, multi-function capabilities, and/or low fabrication costs. For example, high-performance semiconductor devices and/or low-cost semiconductor devices have experienced increased demand with the development of the electronics industry. In order to address these demands, semiconductor devices have become more highly-integrated. In particular, the integration density of semiconductor memory devices has increased to store more logic data.

A planar area occupied by a unit memory cell may directly affect the integration density of two-dimensional semiconductor memory devices. In other words, the integration density of the two-dimensional semiconductor memory devices may be influenced by a minimum feature size that relates to a process technology for forming fine patterns. However, there may be limitations in improving the process technology for forming the fine patterns. Additionally, high-cost equipment or apparatuses may be required to form the fine patterns. Thus, the costs of fabricating highly-integrated semiconductor memory devices may be relatively high.

Three-dimensional semiconductor memory devices have been proposed to address some of the above limitations. The three-dimensional semiconductor memory devices include a plurality of memory cells that are three-dimensionally arrayed. However, in fabrication of the three-dimensional semiconductor memory devices, various problems may occur due to structural configurations thereof. As a result, reliability and/or electrical characteristics of the three-dimensional semiconductor memory devices may be relatively weak.

SUMMARY

According to some embodiments, three-dimensional semiconductor memory devices may include a stack-structure extending in a first direction on a substrate. The stack-structure may include gate patterns and insulation patterns that are alternately and repeatedly stacked. The stack-structure may also include a first portion and a second portion. The second portion of the stack-structure may have a narrower width than the first portion in a second direction substantially perpendicular to the first direction. The devices may also include a plurality of vertical active patterns penetrating the stack-structure. The devices may further include a multi-layered dielectric layer between a sidewall of one of the plurality of vertical active patterns and corresponding ones of the gate patterns. The devices may additionally include a common source region in the substrate adjacent one side of the stack-structure. The devices may also include a strapping contact plug on the common source region. The strapping contact plug may be adjacent the second portion of the stack-structure.

In some embodiments, the first portion of the stack-structure may have opposing first and second sidewalls extending substantially in parallel with the first direction. The second portion of the stack-structure may have opposing first and second sidewalls. Also, the first sidewall of the second portion of the stack-structure may be recessed toward the second sidewall of the second portion of the stack-structure to have a concave shape when viewed from a plan view. Moreover, the strapping contact plug may be adjacent the first sidewall of the second portion of the stack-structure.

In some embodiments, the second sidewalls of the first and second portions of the stack-structure may define a substantially flat sidewall that extends substantially in the first direction.

In some embodiments, the second sidewall of the second portion of the stack-structure may be recessed toward the first sidewall of the second portion of the stack-structure to have a concave shape when viewed from a plan view.

In some embodiments, the common source region may extend substantially in the first direction. Also, the common source region may include a non-landing portion adjacent the first portion of the stack-structure and a landing portion adjacent the second portion of the stack-structure. Additionally, the landing portion and the non-landing portion each may have a width in the second direction. Moreover, the width of the landing portion may be greater than that of the non-landing portion.

In some embodiments, the devices may further include an isolation pattern on the common source region. Also, the strapping contact plug may penetrate the isolation pattern to be electrically connected to the common source region.

In some embodiments, the devices may further include an insulating spacer on a sidewall of the stack-structure. Also, a portion of the insulating spacer may be between the strapping contact plug and the second portion of the stack-structure. Additionally, the strapping contact plug may contact the insulating spacer.

In some embodiments, the devices may further include a bit line electrically connected to an upper end of the one of the plurality of vertical active patterns, and a strapping line electrically connected to the strapping contact plug.

In some embodiments, the bit line and the strapping line may be substantially coplanar; and the bit line and the strapping line may extend substantially in the second direction.

In some embodiments, the multi-layered dielectric layer may cover top and bottom surfaces of the corresponding ones of the gate patterns.

According to some embodiments, three-dimensional semiconductor memory devices may include a plurality of stack-structures extending in parallel in a first direction on a substrate. The plurality of stack-structures may be separated from each other in a second direction substantially perpendicular to the first direction, and each of the plurality of stack-structures may include gate patterns and insulation patterns that are alternately and repeatedly stacked. The devices may also include a plurality of vertical active patterns penetrating respective ones of the plurality of stack-structures. The devices may further include a plurality of multi-layered dielectric layers between respective sidewalls of the plurality of vertical active patterns and respective ones of the gate patterns. The devices may additionally include a plurality of common source regions formed in the substrate under trenches defined between the plurality of stack-structures. The devices may also include a strapping contact plug electrically connected to one of the plurality of common source regions. The strapping contact plug may be between a pair of the plurality of stack-structures. Also, at least one stack-structure in the pair of the plurality of stack-structures may include a first portion and a second portion. Moreover, the first and second portions each may have a width substantially in the second direction, and the width of the second portion may be less than that of the first portion. Furthermore, the strapping contact plug may be adjacent one side of the second portion.

In some embodiments, the one of the plurality of common source regions that is electrically connected to the strapping contact plug may include a non-landing portion and a landing portion. The landing portion may have a greater width than the non-landing portion in the second direction. Also, the landing portion may be one among a plurality of landing portions arrayed in the second direction along with a plurality of second portions of the plurality of stack-structures.

In some embodiments, the strapping contact plug may include a plurality of strapping contact plugs, and the plurality of strapping contact plugs may be electrically connected to respective ones of the plurality of common source regions. Also, each of the plurality of stack-structures may include a first portion and a second portion. Moreover, the plurality of strapping contact plugs and the second portions of the stack-structures may be alternately and repeatedly arrayed in the second direction.

In some embodiments, the devices may further include a connection doped region in the substrate to electrically connect the plurality of common source regions to each other. The connection doped region may extend in the second direction. The devices may also further include a strapping line electrically connected to a top surface of the strapping contact plug. The strapping line may extend substantially in the second direction. Also, a quantity of strapping contact plugs connected to the strapping line may be less than a quantity of the common source regions.

In some embodiments, the devices may further include a pair of insulating spacers on opposing sidewalls of each of the trenches. Also, one of the trenches may be on the one of the plurality of common source regions that is electrically connected to the strapping contact plug. The one of the trenches may include a first region adjacent the first portion of the at least one stack-structure and a second region adjacent the second portion of the at least one stack-structure. Also, the pair of insulating spacers may contact each other in the first region, and may be separated from each other in the second region to define a hole surrounded by the pair of insulating spacers. Moreover, the strapping contact plug may be in the hole.

According to some embodiments, three-dimensional semiconductor devices may include first and second stack structures that each include gate patterns and an insulating pattern between the gate patterns. The devices may also include first and second active patterns penetrating the first and second stack structures, respectively. The devices may further include a common source region between the first and second stack structures. The devices may additionally include a strapping contact plug on an expanded area of the common source region that is between first and second smaller areas of the common source region. The devices may also include a strapping line on the first and second stack structures and on the strapping contact plug.

In some embodiments, the expanded area of the common source region may border a recessed area in the first stack structure. Also, a distance between the first and second stack structures may be greater in the expanded area of the common source region than in the first and second smaller areas of the common source region.

In some embodiments, the expanded area of the common source region may border first and second recessed areas in the first and second stack structures, respectively. Also, a distance between the first and second stack structures may be greater in the expanded area of the common source region than in the first and second smaller areas of the common source region.

In some embodiments, the devices may further include a metal-semiconductor compound material pattern between the strapping contact plug and the common source region.

In some embodiments, the devices may further include first and second insulating spacers on first and second sidewalls of the strapping contact plug such that the first and second insulating spacers may be between the strapping contact plug and the first and second stack structures, respectively.

BRIEF DESCRIPTION OF THE DRAWINGS

The above and other features and advantages of the disclosure will become more apparent in view of the attached drawings and accompanying detailed description.

FIG. 4B is a merged cross-sectional view taken along lines III-III' and IV-IV' of FIG. 4A;

FIGS. 5A to 5F are merged cross-sectional views taken along lines I-I' and II-II' of FIG. 1A that illustrate methods of fabricating a three-dimensional semiconductor memory device according to some embodiments;

FIGS. 10A to 17A are merged cross-sectional views taken along lines I-I' and II-II' of FIG. 8A that illustrate methods of fabricating a three-dimensional semiconductor memory device according to some embodiments;

FIGS. 10B to 17B are cross-sectional views taken along lines III-III' of FIG. 8A that illustrate methods of fabricating a three-dimensional semiconductor memory device according to some embodiments;

DETAILED DESCRIPTION

Figure 1A:
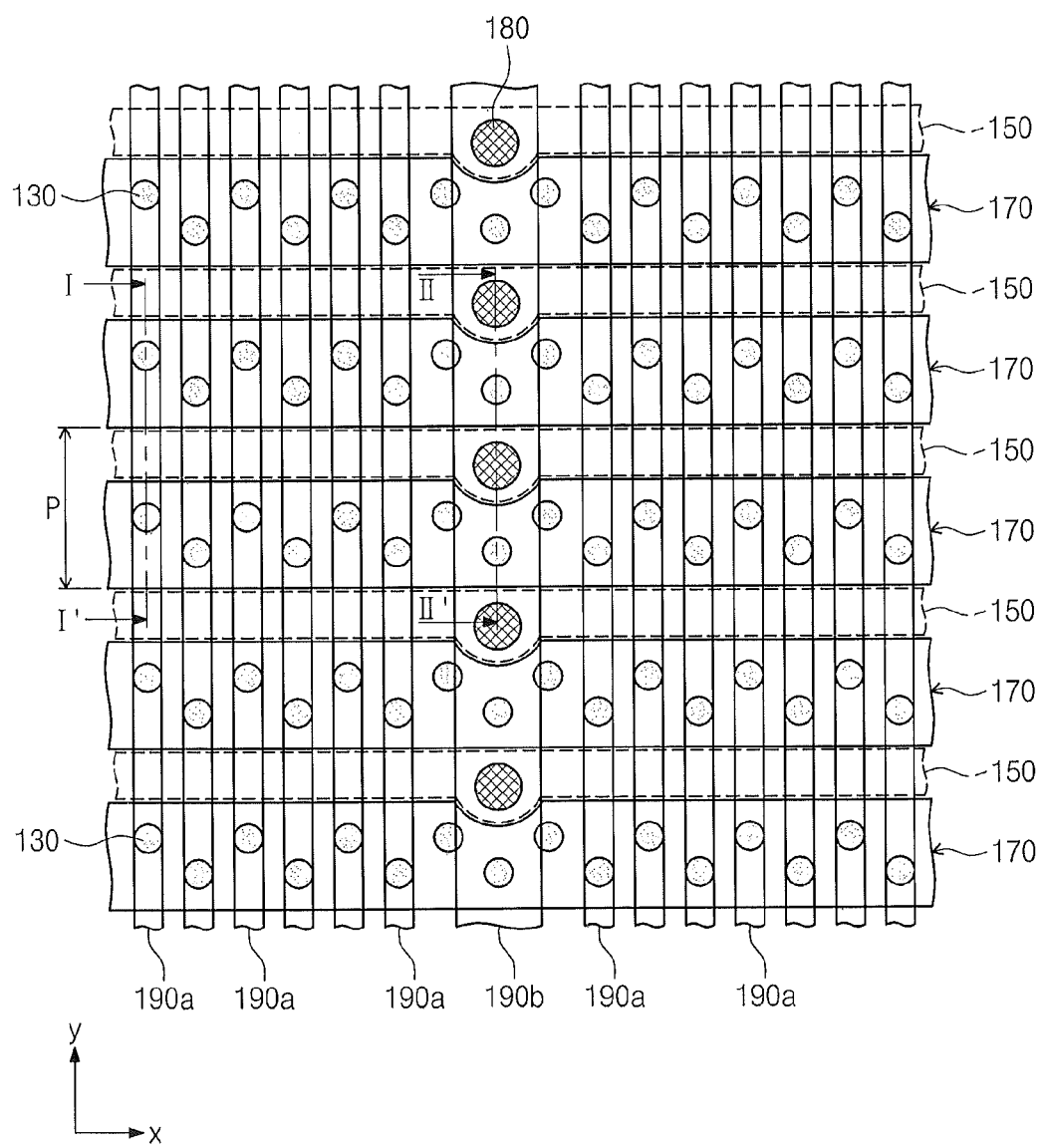
FIG. 1A is a plan view illustrating a three-dimensional semiconductor memory device according to some embodiments.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

Example embodiments are described herein with reference to cross-section illustrations that are schematic illustrations of idealized example embodiments (and intermediate structures). As such, variations from the shapes of the illustrations as a result, for example, of manufacturing techniques and/or tolerances, are to be expected. Thus, example embodiments may not be construed as limited to the particular shapes of regions illustrated herein but may be construed to include deviations in shapes that result, for example, from manufacturing.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that, although the terms first, second, etc. may be used herein to describe various elements, these elements should not be limited by these terms. These terms are only used to distinguish one element from another. Thus, a first element could be termed a second element without departing from the teachings of the present embodiments.

Unless otherwise defined, all terms (including technical and scientific terms) used herein have the same meaning as commonly understood by one of ordinary skill in the art to which these embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
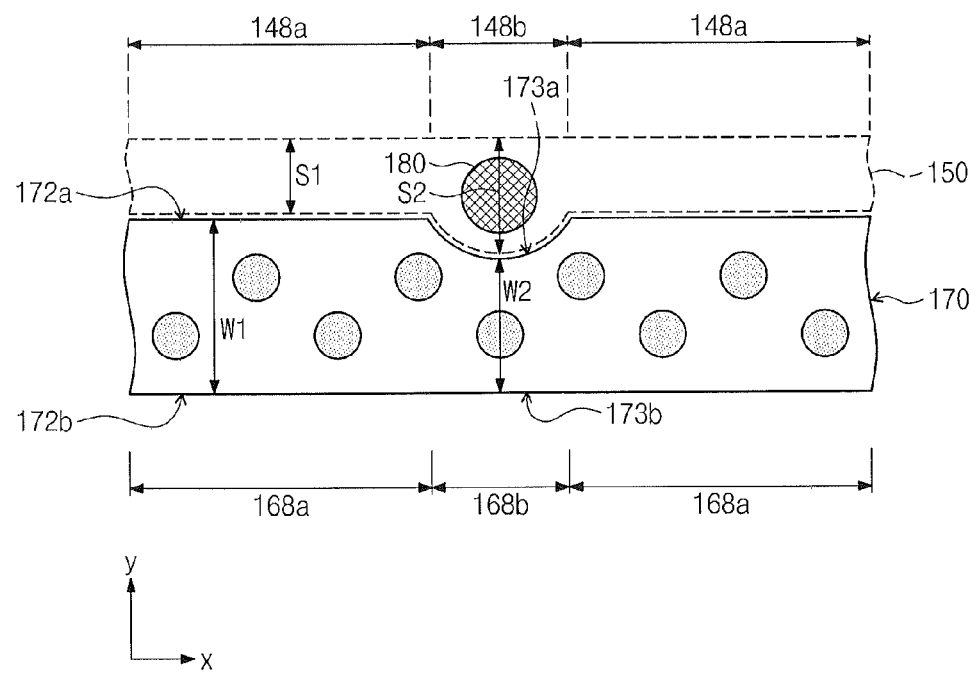
FIG. 1B is an enlarged view illustrating a portion of FIG. 1A.
Figure 1C:
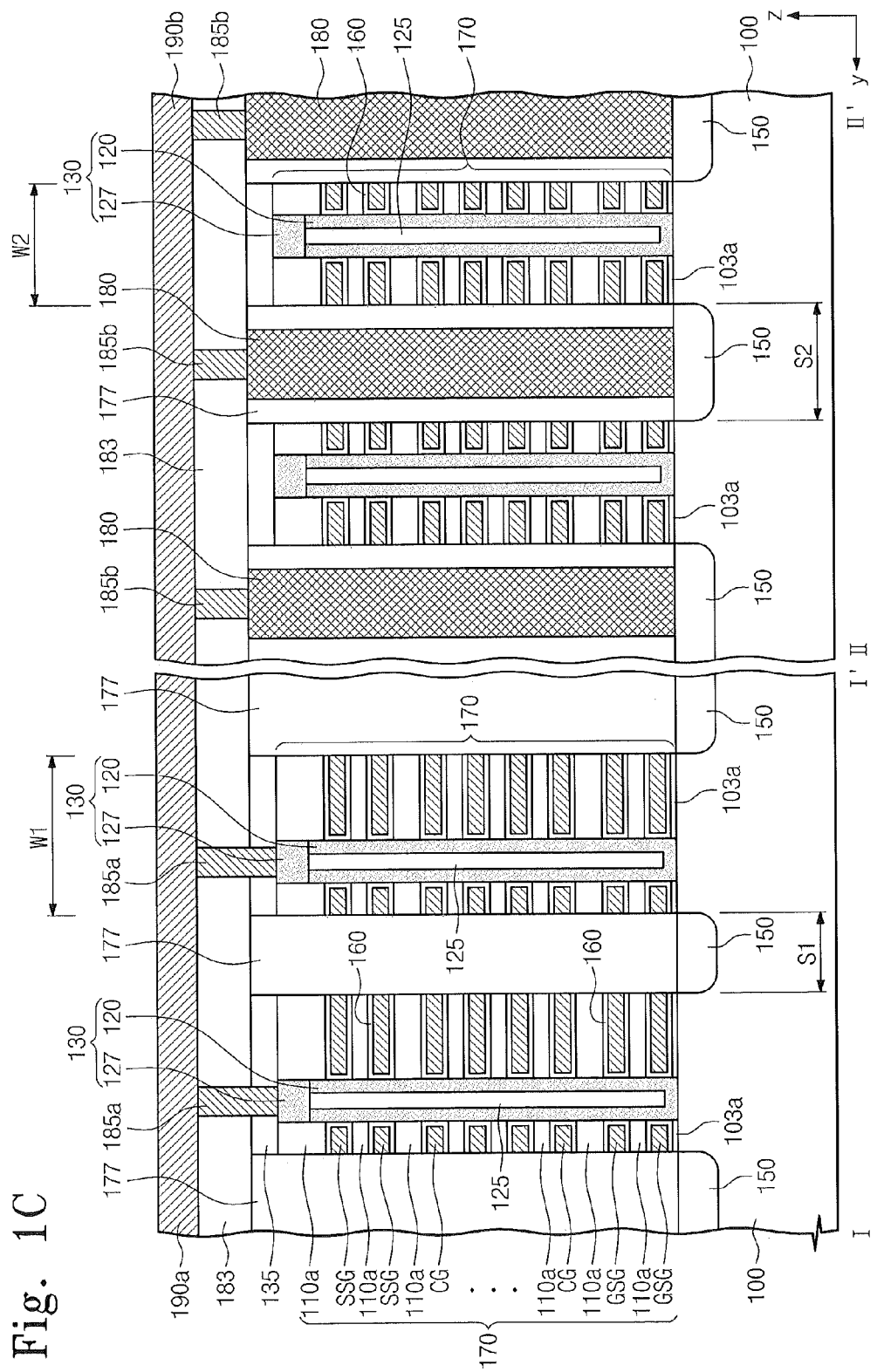
FIG. 1C is a merged cross-sectional view taken along lines I-I' and II-II' of FIG. 1A.

FIG. 1A is a plan view illustrating a three-dimensional semiconductor memory device according to some embodiments, FIG. 1B is an enlarged view illustrating a portion of FIG. 1A, and FIG. 1C is a merged cross-sectional view taken along lines I-I' and II-II' of FIG. 1A.

Referring to FIGS. 1A and 1C, a plurality of stack-structures 170 may be disposed on a semiconductor substrate (i.e., "a substrate") 100. The plurality of stack-structures 170 may extend substantially parallel with each other in a first direction, as illustrated in FIG. 1A. The first direction may be substantially parallel to a top surface of the substrate 100. The first direction may be substantially parallel with the direction of the x-axis in FIG. 1A. The substrate 100 may be doped with dopants of a first conductivity type.

Each of the stack-structures 170 may include gate patterns GSG, CG and SSG and insulation patterns 110a which are alternately and repeatedly stacked. The gate patterns GSG, CG, and SSG in each of the stack-structures 170 may include at least one ground selection gate pattern (GSG), a plurality of cell gate patterns (CG) sequentially stacked on the ground selection gate pattern (GSG), and at least one string selection gate pattern (SSG) stacked on a topmost cell gate pattern (CG) among the plurality of cell gate patterns CG. According to some example embodiments, a plurality of ground selection gate patterns (GSG) may be stacked between a bottom cell gate pattern (CG) among the plurality of cell gate patterns (CG) and the substrate 100. In addition, a plurality of string selection gate patterns (SSG) may be stacked on the topmost cell gate pattern (CG). However, the inventive concept is not limited to the embodiments described above. For example, each of the stack-structures 170 may include a single ground selection gate pattern (GSG) and a single string selection gate pattern (SSG).

Referring to FIG. 1C, individual ones of the insulation patterns 110a in each of the stack-structures 170 may have an appropriate thickness to improve/optimize and/or adjust characteristics of three-dimensional semiconductor memory devices according to some embodiments. For example, the insulation pattern 110a between the bottommost cell gate pattern (CG) and the ground selection gate pattern (GSG) therebelow may be thicker than the insulation pattern 110a between the plurality of cell gate patterns (CG). Similarly, the insulation pattern 110a between the topmost cell gate pattern (CG) and the string selection gate pattern (SSG) thereon may also be thicker than the insulation pattern 110a between the plurality of cell gate patterns (CG). However, the inventive concept is not limited to the above embodiments. In other words, the thickness of the insulation patterns 110a may be designed in various forms.

Each of the insulation patterns 110a may include an oxide layer. The corresponding gate patterns GSG, CG, or SSG may include a conductive material layer. For example, each of the corresponding gate patterns GSG, CG, and SSG may include at least one of a doped semiconductor (e.g., a doped silicon layer or the like), a metal layer (e.g., a tungsten layer, a copper layer, an aluminum layer, or the like), a conductive metal nitride layer (e.g., a titanium nitride layer, a tantalum nitride layer, or the like) and a transition metal layer (e.g., a titanium layer, a tantalum layer, or the like).

Referring still to FIGS. 1A-1C, a plurality of vertical active patterns 130 may penetrate each of the stack-structures 170. Each of the vertical active patterns 130 may be in contact with the substrate 100. Referring to FIG. 1C, in some embodiments, each of the vertical active patterns 130 may include a vertical semiconductor pattern 120 having a pipe shape or a macaroni shape. Accordingly, each of the vertical active patterns 130 may have an empty space therein. The empty space in each of the vertical active patterns 130 may be filled with a filling dielectric pattern 125. Each of the vertical active patterns 130 may further include a capping semiconductor pattern 127 disposed on the vertical semiconductor pattern 120 and on the filling dielectric pattern 125. The vertical semiconductor patterns 120 and the capping semiconductor patterns 127 may include the same semiconductor element as the substrate 100. For example, if the substrate 100 is a silicon substrate, the vertical semiconductor patterns 120 and the capping semiconductor patterns 127 may include silicon atoms. The vertical semiconductor patterns 120 may be doped with dopants having the same conductivity as the substrate 100. Alternatively, the vertical semiconductor patterns 120 may be formed of an undoped semiconductor layer. A drain region may be formed in at least a portion of each of the capping semiconductor patterns 127. The drain region may be doped with dopants of a second conductivity type (e.g., a type different from the dopants of the first conductivity type that dope the substrate 100).

A multi-layered dielectric layer 160 may be disposed between one of the vertical active patterns 130 and one of the corresponding gate patterns GSG, CG, or SSG. The multi-layered dielectric layer 160 may include a tunnel dielectric layer, a charge storage layer, and a blocking dielectric layer. The tunnel dielectric layer may be adjacent (e.g., directly adjacent) a sidewall of the corresponding vertical active pattern 130, and the blocking dielectric layer may be adjacent (e.g., directly adjacent) the corresponding one of the gate patterns GSG, CG, and SSG. The charge storage layer may be disposed between the tunnel dielectric layer and the blocking dielectric layer. The tunnel dielectric layer may include an oxide material and/or an oxynitride material. The blocking dielectric layer may include a high-k dielectric layer (e.g., a metal oxide layer such as a hafnium oxide layer and/or an aluminum oxide layer) having a dielectric constant that is higher than that of the tunnel dielectric layer. In addition, the blocking dielectric layer may further include a barrier dielectric layer having an energy band gap that is greater than that of the high-k dielectric layer. The barrier dielectric layer may be disposed between the high-k dielectric layer and the charge storage layer. The charge storage layer may include a dielectric material having traps which are capable of storing charges. For example, the charge storage layer may include an oxide layer and/or a metal oxide layer. If the multi-layered dielectric layer 160 is between the cell gate patterns (CG) and the vertical active patterns 130, then it may be used as a data storage element (e.g., for storing logic data). If the multi-layered dielectric layer 160 is between the selection gate patterns GSG or SSG and the vertical active patterns 130, then it may be used as a selection transistor gate dielectric layer. At least a portion of the multi-layered dielectric layer 160 may laterally extend to cover a bottom surface and a top surface of each of the gate patterns GSG, CG, and SSG. According to some example embodiments, each of the tunnel dielectric layer, the charge storage layer, and the blocking dielectric layer in the multi-layered dielectric layer 160 may laterally extend to cover a bottom surface and a top surface of each of the gate patterns GSG, CG and SSG, as illustrated by the multi-layered dielectric layer 160 in FIG. 1C.

Each of the vertical active patterns 130 may form a single vertical cell string. The vertical cell string may include a plurality of cell transistors that are sequentially stacked and electrically connected in series. In some embodiments, the vertical cell string may include at least one ground selection transistor, a plurality of cell transistors, and at least one string selection transistor, which are sequentially stacked. The ground selection transistor, the plurality of cell transistors, and the string selection transistor may be electrically connected in series. In each of the vertical cell strings, the cell transistors may be defined at cross points of the vertical active pattern 130 and the cell gate patterns (CG). Further, the ground selection transistors may be defined at cross points of the vertical active pattern 130 and the ground selection gate patterns (GSG), and the string selection transistors may be defined at cross points of the vertical active pattern 130 and the string selection gate patterns (SSG). Each of the ground selection transistors, the cell transistors, and the string selection transistors in the vertical cell string may include a vertical channel region that is defined at a sidewall of the vertical active pattern 130. The ground selection transistor having the bottommost ground selection gate pattern (GSG) may further include a horizontal channel region that is defined in the substrate 100 below the bottommost ground selection gate pattern (GSG).

Referring to FIG. 1C, a plurality of buffer dielectric patterns 103a may be disposed between the stack-structures 170 and the substrate 100. The buffer dielectric patterns 103a may be adjacent opposing sidewalls of the vertical active patterns 130. As such, the vertical active patterns 130 may protrude/extend between ones of the buffer dielectric patterns 103a toward the substrate 100. In other words, even though the buffer dielectric patterns 103a may contact portions of the substrate 100, the vertical active patterns 130 may still contact other (e.g., adjacent) portions of the substrate 100. Each of the buffer dielectric patterns 103a may include an oxide material. Still referring to FIG. 1C, a capping dielectric pattern 135 may be disposed on each of the stack-structures 170 and on the vertical active pattern 130 penetrating the same. Opposing sidewalls of the capping dielectric pattern 135 may be vertically self-aligned with opposing sidewalls of the stack-structure 170 thereunder. Each of the capping dielectric patterns 135 may include an oxide material, a nitride material, and/or an oxynitride material.

Referring still to FIGS. 1A-1C, a common source region 150 may be formed in the substrate 100 between adjacent ones of the stack-structures 170. Referring to FIGS. 1A and 1C, different common source regions 150 may be disposed in the substrate 100 adjacent different sides of each of the stack-structures 170. The common source regions 150 may extend in the first direction. The common source regions 150 may be spaced apart from each other in a second direction substantially perpendicular to the first direction. The second direction may be substantially parallel to the top surface of the substrate 100. The second direction may correspond to the direction of the y-axis of FIG. 1A. The stack-structures 170 and the common source regions 150 may be alternately and repeatedly arrayed in the second direction. The common source regions 150 may be doped with dopants of the second conductivity type. In other words, the common source regions 150 may be doped with dopants that have a different conductivity type from the substrate 100 and the same conductivity type as the drain regions.

Referring to FIG. 1C, spaces between adjacent ones of the stack-structures 170 may be filled with isolation patterns 177. In other words, the isolation patterns 177 may be disposed on each of the common source regions 150. Top surfaces of the isolation patterns 177 may be substantially coplanar with top surfaces of the capping dielectric patterns 135. The isolation patterns 177 may include an oxide material, a nitride material, and/or an oxynitride material.

Referring still to FIGS. 1A-1C, strapping contact plugs 180 may penetrate the isolation patterns 177 to be electrically connected to the common source regions 150. At least one stack-structure 170 among a pair of the stack-structures 170 adjacent opposing sidewalls of the strapping contact plugs 180 may include a first portion and a second portion having a width that is less than that of the first portion, when viewed from a plan view. FIG. 1B is an enlarged plan view illustrating a portion of FIG. 1A. In other words, FIG. 1B is an enlarged view illustrating one of the stack-structures 170 of FIG. 1A and the common source region 150 adjacent the stack-structure 170.

Referring to FIGS. 1A and 1B, the plurality of stack-structures 170 may extend in parallel in the first direction. Further, the plurality of stack-structures 170 may be arrayed in the second direction with a uniform pitch size.

Referring to FIG. 1B, the stack-structure 170 may include the first portion 168a and the second portion 168b. The first and second portions 168a and 168b may be arrayed in the first direction. The first and second portions 168a and 168b may have widths in the second direction. The second portion 168b may have a width which is less than that of the first portion 168a. The first portion 168a may have a first width W1 having a substantially uniform value throughout the whole region thereof. In contrast, the width of the second portion 168B may vary according to positions in the first direction. A minimum width of the second portion 168b may be defined as a second width W2. In some embodiments, the second width W2 of the second portion 168b may correspond to a width of a substantial central portion of the second portion 168b.

As illustrated in FIG. 1B, the first portion 168a of the stack-structure 170 may extend in the first direction and may have opposing first and second sidewalls 172a and 172b. Similarly, the second portion 168b of the stack-structure 170 may have opposing first and second sidewalls 173a and 173b. The first and second sidewalls 172a and 172b of the first portion 168a may be connected to the first sidewall 173a and second sidewalls 173b of the second portion 168b, respectively. When viewed from a plan view, the first sidewall 173a of the second portion 168b may have a substantially concave shape and a substantially rounded shape. In other words, the first sidewall 173a of the second portion 168b may be recessed toward the second sidewall 173b of the second portion 168b.

In some embodiments, the second sidewall 173b of the second portion 168b and the second sidewall 172b of the first portion 168a may together constitute a single flat sidewall that extends in the first direction.

As further illustrated in FIG. 1B, the common source region 150 adjacent the stack-structure 170 having the first and second portions 168a and 168b may include a non-landing portion 148a and a landing portion 148b. The non-landing portion 148a (of the common source region 150) may be located adjacent the first portion 168a of the stack-structure 170, and the landing portion 148b (of the common source region 150) may be located adjacent the second portion 168b of the stack-structure 170. The strapping contact plug 180 may be electrically connected to the landing portion 148b. The landing portion 148b may have a width (e.g., a distance along the y-axis) that is greater than that of the non-landing portion 148a. Like the first and second portions 168a and 168b of the stack-structure 170, the non-landing portion 148a (of the common source region 150) may have a substantially uniform width S1 throughout the whole region thereof, and a width of the landing portion 148b (of the common source region 150) may vary according to a position in the first direction. The landing portion 148b of the common source region 150 may include a region having a maximum width S2 due to the second portion 168b of the stack-structure 170. A sum of the first width W1 of the first portion 168a and the width S1 of the non-landing portion 148a may be substantially equal to a sum of the second width W2 of the second portion 168b and the maximum width S2 of the landing portion 148b. In some embodiments, the strapping contact plug 180 may directly contact the landing portion 148b. Alternatively, metal-semiconductor compound material patterns may be formed on top surfaces of the common source regions 150, and the strapping contact plugs 180 may contact respective ones of the metal-semiconductor compound material patterns. The metal-semiconductor compound material patterns may be disposed under the isolation patterns 177. In some embodiments, each of the metal-semiconductor compound material patterns may be a metal silicide layer.

Referring again to FIGS. 1A and 1B, each of the plurality of stack-structures 170 may have the first and second portions 168a and 168b, and each of the common source regions 150 may include the non-landing portion 148a and the landing portion 148b. The plurality of strapping contact plugs 180 may penetrate the isolation patterns 177 and may be electrically connected to respective ones of the common source regions 150. The second portions 168b of the stack-structures 170 and the strapping contact plugs 180 may be alternately and repeatedly arrayed in the second direction.

Referring to FIG. 1C, an interlayer dielectric layer 183 may be disposed on the strapping contact plugs 180, the isolation patterns 177, and the vertical active patterns 130. A plurality of bit lines 190a may be disposed on the interlayer dielectric layer 183. The bit lines 190a may be electrically connected to upper portions (e.g., portions farther from the substrate 100) of the vertical active patterns 130. Additionally, a strapping line 190b may be disposed on the interlayer dielectric layer 183. The strapping line 190b may be electrically connected to top surfaces of the strapping contact plugs 180.

In some embodiments, the bit lines 190a and the strapping line 190b may be positioned at substantially the same level from a top surface of the substrate 100, as illustrated in FIG. 1C. The bit lines 190a and the strapping line 190b may extend in the second direction to be substantially parallel to each other, as illustrated in FIG. 1A.

Each of the bit lines 190a may be electrically connected to the vertical active patterns 130 disposed thereunder through first conductive plugs 185a. The first conductive plugs 185a may penetrate the interlayer dielectric layer 183 and the capping dielectric patterns 135 that are disposed between the bit lines 190a and the vertical active patterns 130. The strapping line 190b may be electrically connected to the strapping contact plugs 180 through second conductive plugs 185b. The second conductive plugs 185b may penetrate the interlayer dielectric layer 183 that is disposed between the strapping line 190b and the strapping contact plugs 180. The first and second conductive plugs 185a and 185b may include at least one of a metal layer (e.g., a tungsten layer, a copper layer, or an aluminum layer), a conductive metal nitride layer (e.g., a titanium nitride layer or a tantalum nitride layer), and a transition metal layer (e.g., a titanium layer or a tantalum layer). The bit lines 190a and the strapping line 190b may include at least one of a metal layer (e.g., a tungsten layer, a copper layer, or an aluminum layer), a conductive metal nitride layer (e.g., a titanium nitride layer or a tantalum nitride layer), and a transition metal layer (e.g., a titanium layer or a tantalum layer).

In some embodiments, the vertical active patterns 130 disposed under the strapping line 190b may correspond to dummy vertical active patterns. In addition, the vertical active patterns 130 adjacent both sidewalls of the strapping line 190b may also correspond to the dummy vertical active patterns. The dummy vertical active patterns may not constitute the vertical cell strings. The first conductive plugs 185a may not be formed on the dummy vertical active patterns. This is for reducing/preventing the dummy vertical active patterns from acting as actual vertical active patterns of the vertical cell strings. The dummy vertical active patterns may not be electrically connected to the bit lines 190a. Some of the dummy vertical active patterns may penetrate the second portions 168b of the stack-structures 170.

According to some embodiments of the three-dimensional semiconductor memory devices, the common source regions 150 may be electrically connected to the strapping line 190b through respective strapping contact plugs 180. As a result, the electrical resistance of the common source regions 150 may decrease to improve reliability of the three-dimensional semiconductor memory devices. Further, each of the stack-structures 170 may include the first portion 168a and the second portion 168b that is narrower than the first portion 168a. Thus, each of the common source regions 150 may have enough of a (e.g., an improved or increased) planar area to contact the strapping contact plug 180. As a result, it may be relatively easy to electrically connect the strapping contact plug 180 to the common source region 150 with a reduction/minimization of distances between the stack-structures 170. For example, although the stack-structures 170 may be arrayed to have a substantially uniform pitch P (as illustrated in FIG. 1A), the width S2 of the landing portion 148b of one of the common source regions 150 may be increased/maximized. Accordingly, highly-integrated three-dimensional semiconductor memory devices may be provided with an improved/optimized layout scheme.

In some embodiments of the three-dimensional semiconductor memory devices, all layers constituting the multi-layered dielectric layer 160 may horizontally extend to cover the top surfaces and the bottom surfaces of the respective gate patterns GSG, CG, and SSG. Alternatively, in some embodiments, the multi-layered dielectric layer 160 may have different configurations.

Figure 2A:
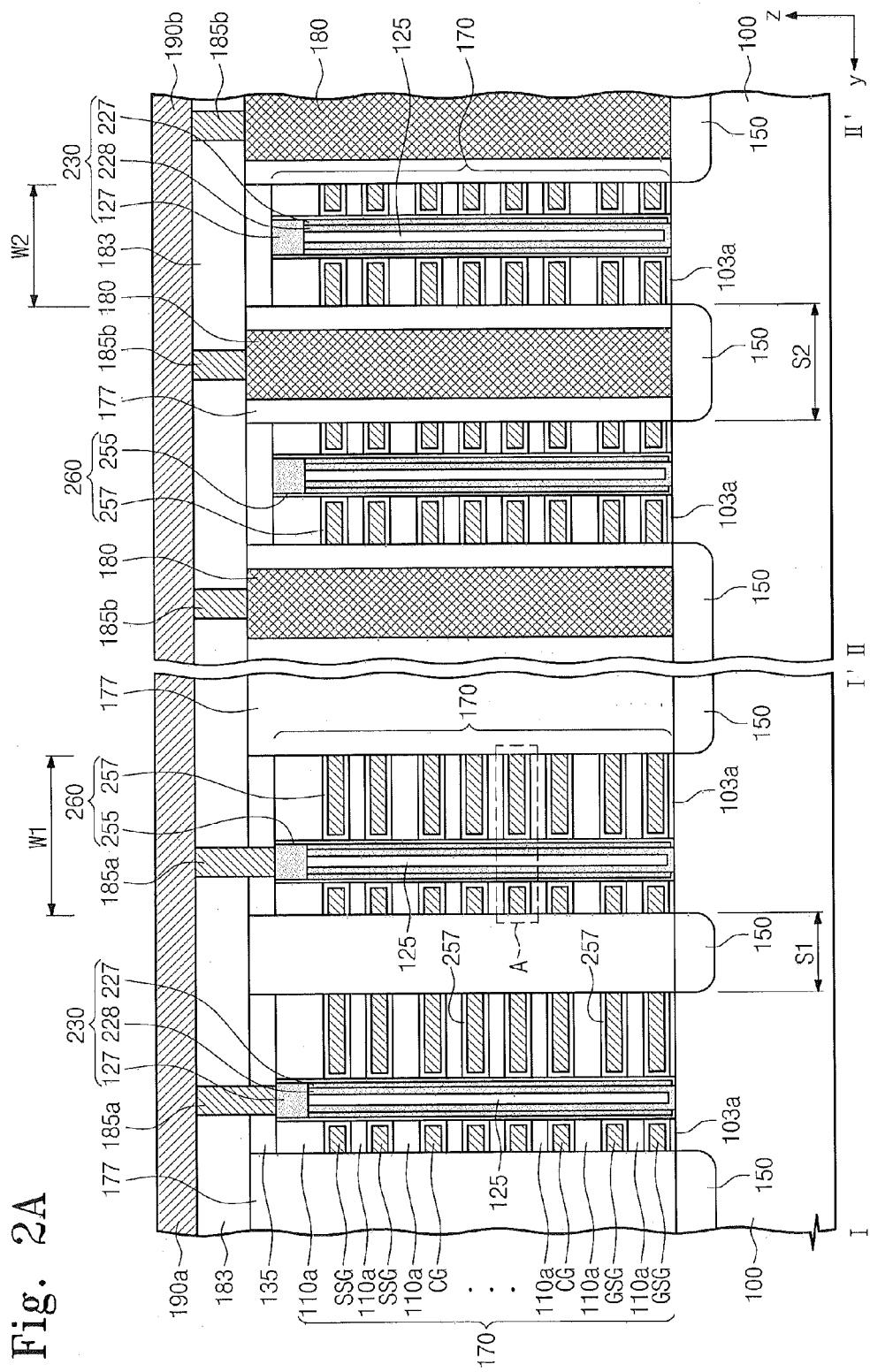
FIG. 2A is a merged cross-sectional view taken along lines I-I' and II-II' of FIG. 1A to illustrate a three-dimensional semiconductor memory device according to some embodiments.
Figure 2B:
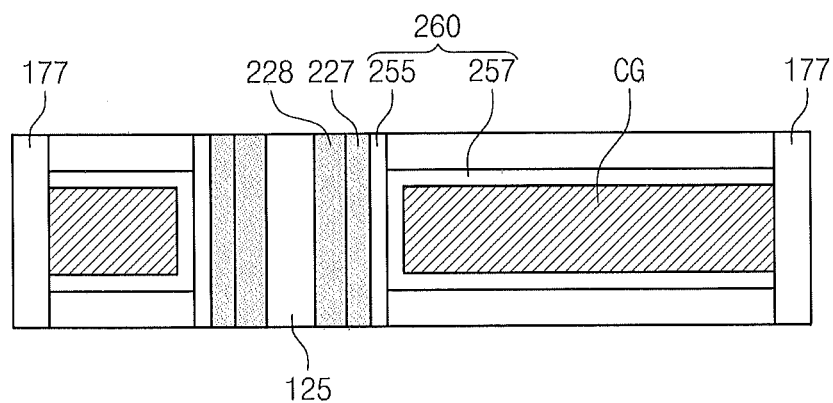
FIG. 2B is an enlarged view illustrating a portion 'A' of FIG. 2A.

FIG. 2A is a merged cross-sectional view taken along lines I-I' and II-II' of FIG. 1A illustrating a three-dimensional semiconductor memory device according to some embodiments, and FIG. 2B is an enlarged view illustrating a portion 'A' of FIG. 2A.

Referring to FIGS. 2A and 2B, a multi-layered dielectric layer 260 between vertical active patterns 230 and respective gate patterns GSG, CG, and SSG may include a tunnel dielectric layer, a charge storage layer, and a blocking dielectric layer. The tunnel dielectric layer, the charge storage layer, and the blocking dielectric layer of the multi-layered dielectric layer 260 may be formed of the same material layers as the tunnel dielectric layer, the charge storage layer, and the blocking dielectric layer, respectively, of the multi-layered dielectric layer 160 illustrated in FIG. 1C.

The multi-layered dielectric layer 260 may include a first sub-layer 255 and a second sub-layer 257. The first sub-layer 255 may vertically extend to intervene between the vertical active patterns 230 and the insulation patterns 110a. The second sub-layer 257 may horizontally extend to cover the top surfaces and the bottom surfaces of the respective gate patterns GSG, CG, and SSG. The first sub-layer 255 may include at least a portion of the tunnel dielectric layer, and the second sub-layer 257 may include at least a portion of the blocking dielectric layer. Either of the first and second sub-layers 255 and 257 may include the charge storage layer. In some embodiments, the first sub-layer 255 may include the tunnel dielectric layer, the charge storage layer, and the barrier dielectric layer (e.g., a portion of the blocking dielectric layer), and the second sub-layer 257 may include the high-k dielectric layer (e.g., another portion of the blocking dielectric layer). However, in some embodiments, the first and second sub-layers 255 and 257 may have different combinations (e.g., different combinations of the charge storage layer and the barrier dielectric layer, etc.).

Each of the vertical active patterns 230 may include a first vertical semiconductor pattern 227 and a second vertical semiconductor pattern 228. The first vertical semiconductor pattern 227 may be disposed between the second vertical semiconductor pattern 228 and the first sub-layer 255. The first vertical semiconductor patterns 227 may not contact the substrate 100 due to the presence of horizontal extensions of the first sub-layers 255, whereas the second vertical semiconductor patterns 228 may contact the first vertical semiconductor pattern 227 and the substrate 100. An inner empty space surrounded by each of the second vertical semiconductor patterns 228 may be filled with the filling dielectric pattern 125 illustrated in FIG. 1C. Each of the vertical active patterns 230 may further include the capping semiconductor pattern 127 illustrated in FIG. 1C. That is, the capping semiconductor pattern 127 may be disposed on the first and second vertical active patterns 227 and 228 and the filling dielectric pattern 125.

In some embodiments, the second sidewall 173b of the second portion 168b and the second sidewall 172b of the first portion 168a in the respective stack-structures 170 may together constitute a single flat sidewall that extends in the first direction, as illustrated in FIG. 1B. Alternatively, referring to FIGS. 3A and 3B, the second sidewall 173b of the second portion 168b of the respective stack-structures 170 may have a different shape from that illustrated in FIG. 1B.

Figure 3A:
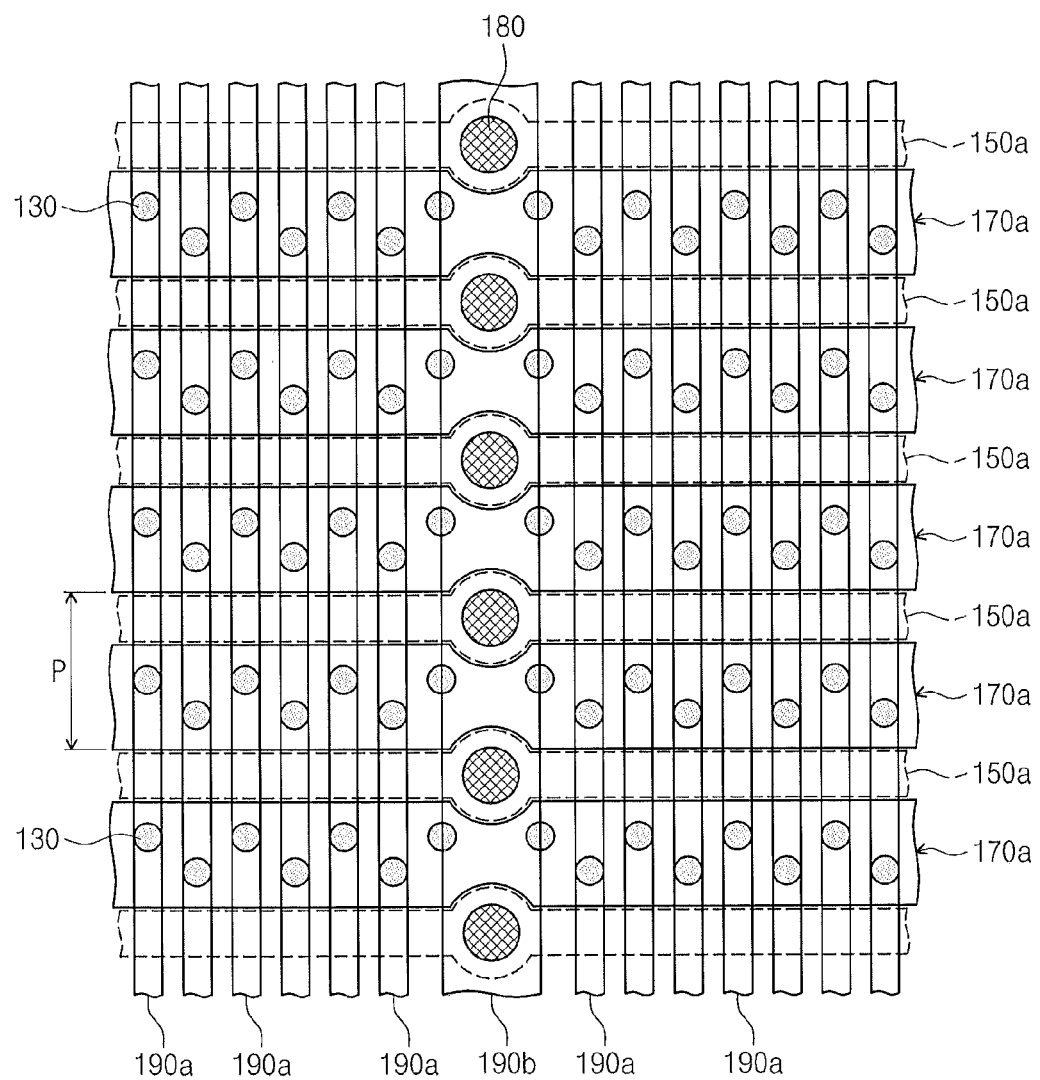
FIG. 3A is a plan view illustrating a three-dimensional semiconductor memory device according to some embodiments.
Figure 3B:
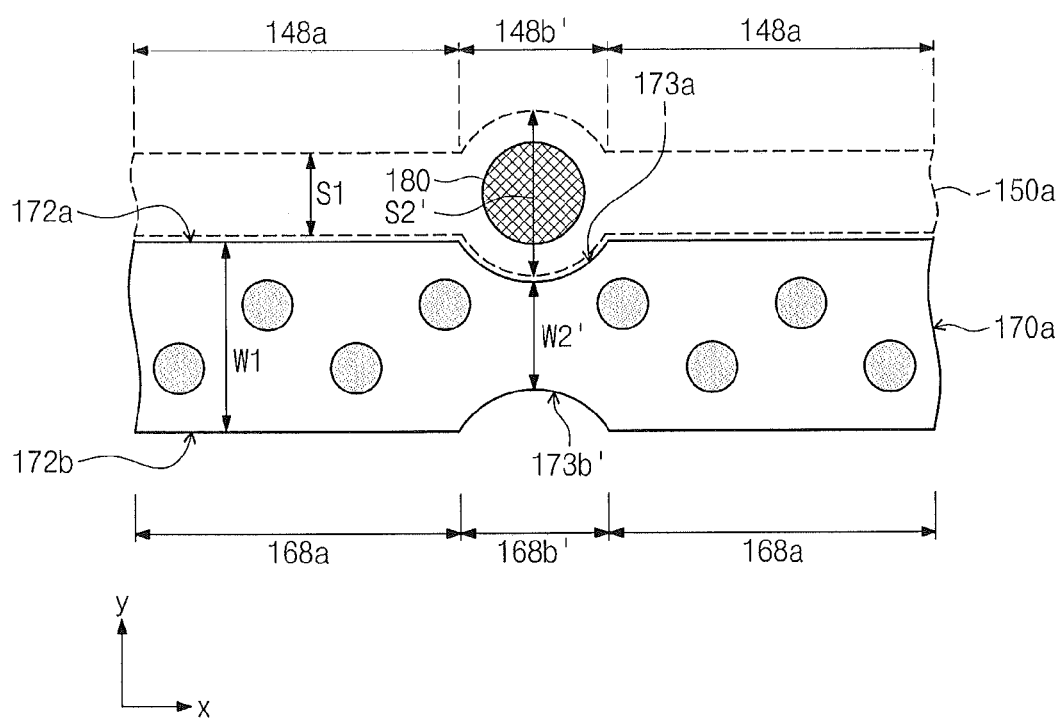
FIG. 3B is an enlarged view illustrating a portion of FIG. 3A.

FIG. 3A is a plan view illustrating a three-dimensional semiconductor memory device according to some embodiments, and FIG. 3B is an enlarged view illustrating a portion of FIG. 3A.

Referring to FIGS. 3A and 3B, a plurality of stack-structures 170a may have a different shape from the stack-structures 170 illustrated in FIG. 1A, when viewed from a plan view. For example, a pair of stack-structures 170a disposed adjacent opposing sides of the strapping contact plug 180 may have a symmetrical shape defined by the strapping contact plug 180. Each of the stack-structures 170a may include a first portion 168a and a second portion 168b', as illustrated in FIG. 3B. A first sidewall 173a of the second portion 168b' may have a concave shape with respect to a first sidewall 172a of the first portion 168a. Similarly, a second sidewall 173b' of the second portion 168b' may also have a concave shape with respect to a second sidewall 172b of the first portion 168a. In other words, both the first and second sidewalls 173a and 173b' of the second portion 168b' may be recessed toward a central point of the second portion 168b' of the stack-structure 170a. As a result, both sidewalls 173a and 173b' of the second portions 168b' of the pair of stack-structures 170a may exhibit a concave shape. In other words, both sidewalls 173a and 173b' adjacent the strapping contact plugs 180 may have a concave shape. In some embodiments, the stack-structures 170a may also be arrayed to have a substantially uniform pitch P in the second direction. Thus, a width of landing portions 148b' of common source regions 150a between the stack-structures 170a may be greater (e.g., may be relatively increased) in a limited area. In some embodiments, a sum of a maximum width S2' of the landing portion 148b' and a minimum width W2' of the second portion 168b' of the stack-structure 170a may be substantially equal to a sum of a width S1 of the non-landing portion 148a and a width W1 of the first portion 168a of the stack-structure 170a.

The vertical active patterns 230 and the multi-layered dielectric layer 260 described with reference to FIGS. 2A and 2B may also be applied to the three-dimensional semiconductor memory devices illustrated in FIGS. 3A and 3B.

According to some embodiments, the strapping contact plugs 180 may be disposed on respective ones of the landing portions 148b' of the common source regions 150a. Alternatively, in some embodiments, the strapping contact plugs 180 may not be disposed on some of the common source regions 150a (as illustrated in FIGS. 4A and 4B).

Figure 4A:
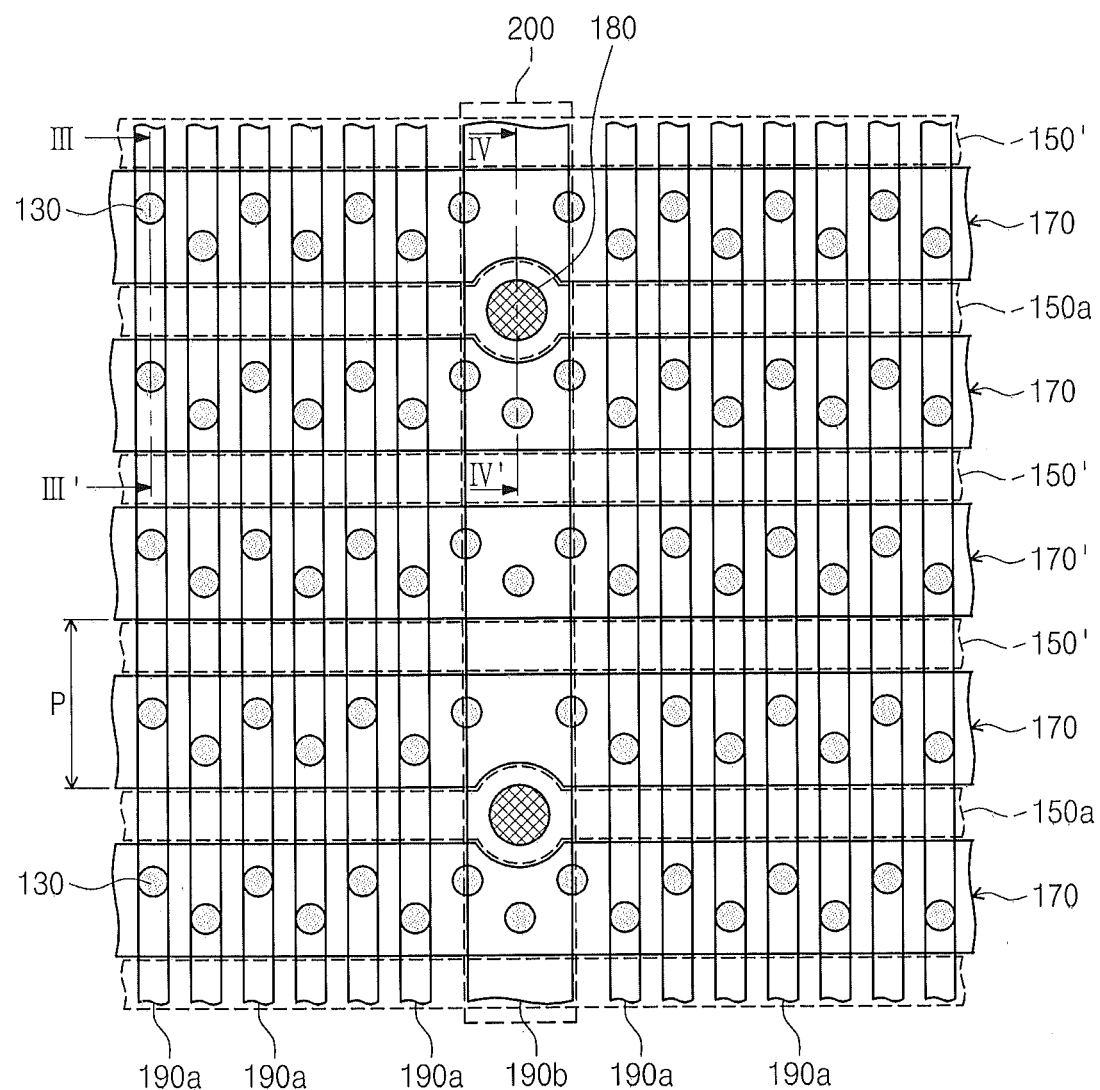
FIG. 4A is a plan view illustrating a three-dimensional semiconductor memory device according to some embodiments.

FIG. 4A is a plan view illustrating a three-dimensional semiconductor memory device according to some embodiments, and FIG. 4B is a merged cross-sectional view taken along lines III-III' and IV-IV' of FIG. 4A.

Referring to FIGS. 4A and 4B, strapping contact plugs 180 may be electrically connected to selected common source regions 150a among the plurality of common source regions. On the other hand, no strapping contact plug 180 may be disposed on non-selected common source regions 150' among the plurality of common source regions. The strapping contact plugs 180 may be arrayed in the second direction, and at least one of the non-selected common source regions 150' may be disposed between the couple of adjacent strapping contact plugs 180. The strapping contact plugs 180 may be electrically connected to a strapping line 190b. In some embodiments, the number of the strapping contact plugs 180 under the strapping line 190b may be less than that of the common source regions 150a and 150' under the strapping line 190b.

Each of the selected common source regions 150a electrically connected to the strapping contact plugs 180 may include the non-landing portion 148a and the landing portion 148b', as described with reference to FIGS. 3A and 3B. Accordingly, sidewalls of the second portions 168b' of the stack-structures 170a (e.g., portions along sides of the landing portion 148b' of the common source regions 150a) may have a concave shape, as illustrated in FIG. 3B.

Alternatively, given a pair of the stack-structures 170 with the strapping contact plug 180 therebetween, each of the pair of stack-structures 170 may include the first portion 168a and the second portion 168b, as described with reference to FIGS. 1A and 1B. In other words, in some embodiments, only one of the sidewalls of the respective second portions 168b may have a concave shape. As such, the pair of the stack-structures 170 at both sides of the strapping contact plug 180 may be disposed so that the concave sidewalls of the pair of the stack-structures 170 face the strapping contact plug 180 therebetween. In some embodiments, the non-selected common source regions 150' may not have the landing portion 148b or 148b'. That is, the non-selected common source regions 150' may substantially have a uniform width, and a width of the non-selected common source regions 150' may substantially equal to a width of the non-landing portions 148a of the selected common source regions 150a. As illustrated in FIG. 4A, in some embodiments, at least one additional stack-structure 170' having a uniform width may be disposed between a pair of the strapping contact plugs 180. In some embodiments, the stack-structures 170 and 170' may be arrayed to have a substantially uniform pitch P in the second direction.

As illustrated in FIG. 4B, a connection doped region 200 may be disposed in the substrate 100. The connection doped region 200 may have the same conductivity as the common source regions 150a and 150'. As illustrated in FIG. 4A, the connection doped region 200 may extend in the second direction to contact the non-selected common source regions 150' and the selected common source regions 150a. That is, the non-selected common source regions 150' and the selected common source regions 150a may be electrically connected to each other through the connection doped region 200. In some embodiments, the connection doped region 200 may be disposed under the strapping line 190b. That is, the connection doped region 200 may overlap the strapping line 190b, when viewed from the plan view of FIG. 4A. Thus, the connection doped region 200 may be connected to the landing portions 148b' of the selected common source regions 150a. The non-selected common source regions 150' may be electrically connected to the strapping contact plugs 180 on the selected common source regions 150a through the connection doped region 200.

FIGS. 5A to 5F are merged cross-sectional views taken along lines I-I' and II-II' of FIG. 1A illustrating methods of fabricating a three-dimensional semiconductor memory device according to some embodiments.

Figure 5A:
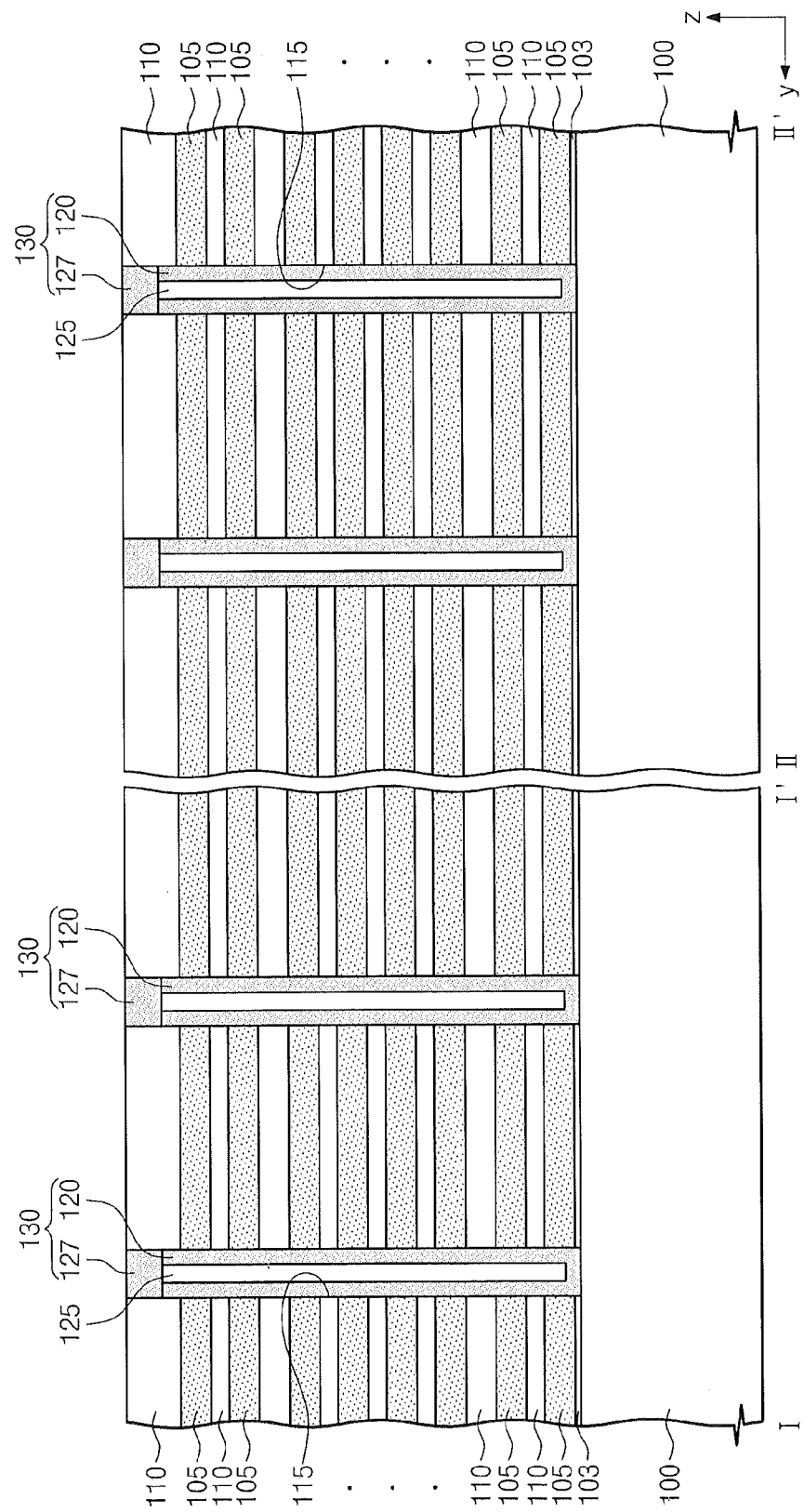

Referring to FIG. 5A, a buffer dielectric layer 103 may be formed on a substrate 100 doped with dopants of a first conductivity type. A sacrificial layer 105 and an insulation layer 110 may be alternately and repeatedly stacked on the buffer dielectric layer 103. The sacrificial layers 105 may be formed of a material layer having an etch selectivity with respect to the insulation layers 110. For example, the insulation layers 110 may be formed of an oxide layer, and the sacrificial layers 105 may be formed of a nitride layer.

The insulation layers 110, the sacrificial layers 105, and the buffer dielectric layer 103 are patterned to form channel holes 115. The channel holes 115 may expose the substrate 100. A semiconductor layer may be conformally formed on the substrate 100 having the channel holes 115, and a filling dielectric layer filling the channel holes 115 may be formed on the semiconductor layer. The filling dielectric layer may be formed of an oxide layer, a nitride layer, and/or an oxynitride layer. The filling dielectric layer and the semiconductor layer may be planarized until the topmost (e.g., farthest from the substrate 100) one of the insulation layers 110 is exposed, thereby forming a vertical semiconductor pattern 120 and a filling dielectric pattern 125 in the respective channel holes 115. The vertical semiconductor patterns 120 and the filling dielectric patterns 125 may be recessed so that top surfaces of the vertical semiconductor patterns 120 and the filling dielectric patterns 125 are located at a level lower (e.g., closer to the substrate 100) than a top surface of the topmost insulation layer 110. A capping semiconductor layer is then formed on the substrate 100 having the recessed vertical semiconductor patterns 120 and the recessed filling dielectric patterns 125. The capping semiconductor layer may fill the channel holes 115 on the vertical semiconductor patterns 120 and the filling dielectric patterns 125. The capping semiconductor layer may be planarized until the topmost insulation layer 110 is exposed, thereby forming a capping semiconductor pattern 127 in the respective channel holes 115 on the vertical semiconductor patterns 120 and the filling dielectric patterns 125. The capping semiconductor pattern 127 and the vertical semiconductor pattern 120 formed in each of the channel holes 115 may constitute a vertical active pattern 130. Dopants of a second conductivity type may be injected into the capping semiconductor patterns 127 to form drain regions.

Figure 5B:
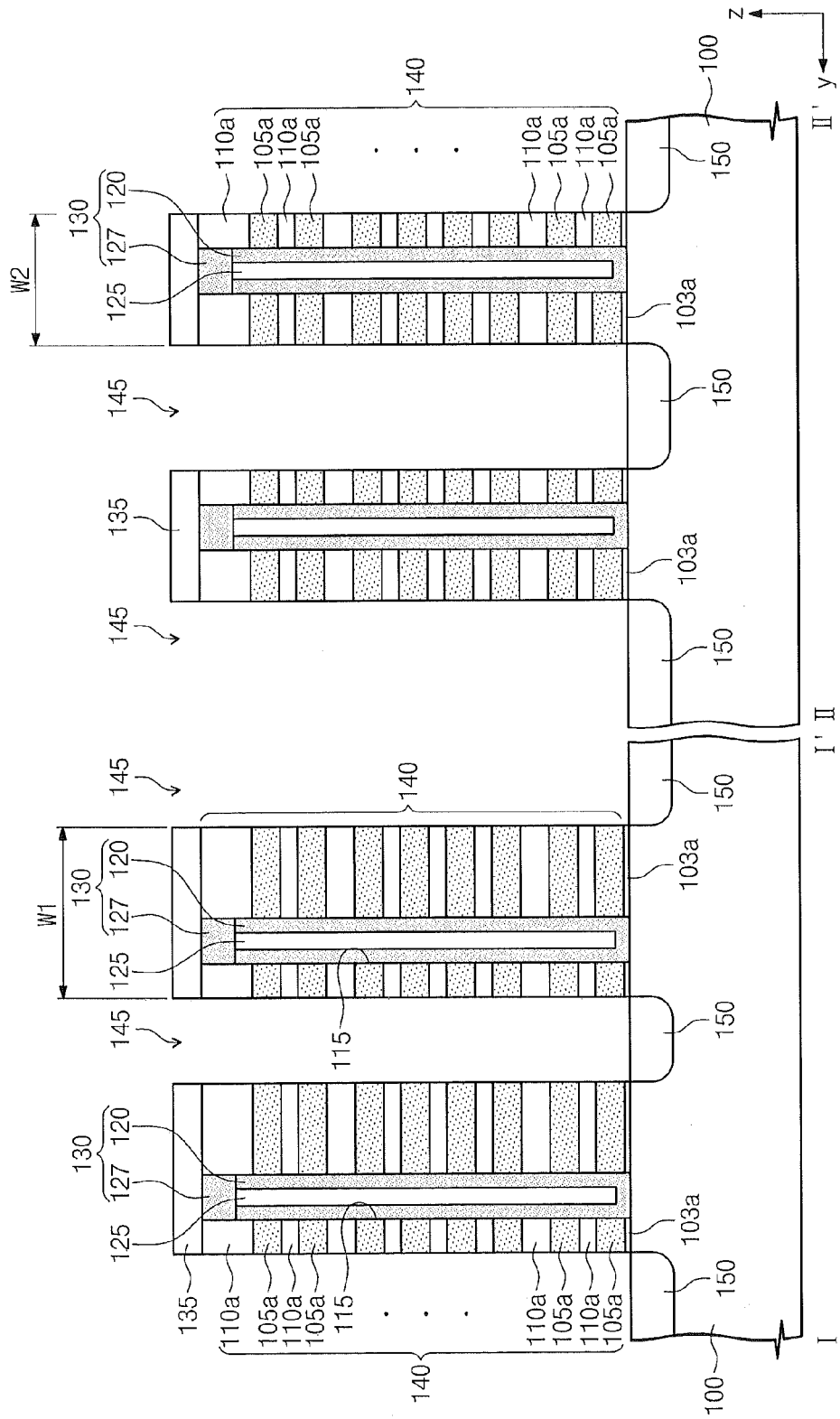

Referring to FIG. 5B, a capping dielectric layer may be formed on the vertical active patterns 130 and the topmost insulation layer 110. The capping dielectric layer, the insulation layers 110, the sacrificial layers 105, and the buffer dielectric layer 103 may be patterned to form trenches 145 defining a plurality of stack patterns. Each of the stack patterns may include a buffer dielectric pattern 103a, a preliminary mold structure 140, and a capping dielectric pattern 135 that are sequentially stacked. The trenches 145 may be formed between the stack patterns. Each of the preliminary mold structures 140 may include sacrificial patterns 105a and insulation patterns 110a that are alternately and repeatedly stacked. Thus, the sacrificial patterns 105a may be exposed by the trenches 145. Each of the preliminary mold structures 140 may further include the vertical active patterns 130.

The preliminary mold structures 140 may extend parallel to each other in a first direction when viewed from a plan view (e.g., the preliminary mold structures 140 may extend like the stack-structures 170 illustrated in FIG. 1A). The preliminary mold structures 140 may be arrayed in a second direction (e.g., a y-axis direction) substantially perpendicular to the first direction to have a substantially uniform pitch when viewed from a plan view. In some embodiments, each of the preliminary mold structures 140 may include a first portion and a second portion. The first portions of the preliminary mold structures 140 may have a first width W1 in the second direction, and the second portions of the preliminary mold structures 140 may have a width less than the first width W1 in the second direction. In more detail, the second portions of the preliminary mold structures 140 may have a second width W2 which corresponds to a minimum width of the second portions. The second width W2 may be less than the first width W1. The preliminary mold structures 140 may have substantially the same configuration as the stack-structures 170 of FIG. 1A when viewed from a plan view.

Dopants of the second conductivity type may be implanted into the substrate 100 below the trenches 145, thereby forming common source regions 150. Accordingly, the preliminary mold structures 140 may be used as implantation masks. Thus, in some embodiments, the common source regions 150 may be formed to have the same configuration as described with reference to FIGS. 1A and 1B due to the configuration of the preliminary mold structures 140.

Referring to FIG. 5C, the sacrificial patterns 105a exposed by the trenches 145 may be selectively removed to form empty regions 155. As a result, mold structures 140a may be formed. Each of the mold structures 140a may include the stacked insulation patterns 110a and the empty regions 155 between the stacked insulation patterns 110a. In some embodiments, the empty regions 155 may expose portions of a sidewall of the corresponding vertical active pattern 130.

Figure 5D:
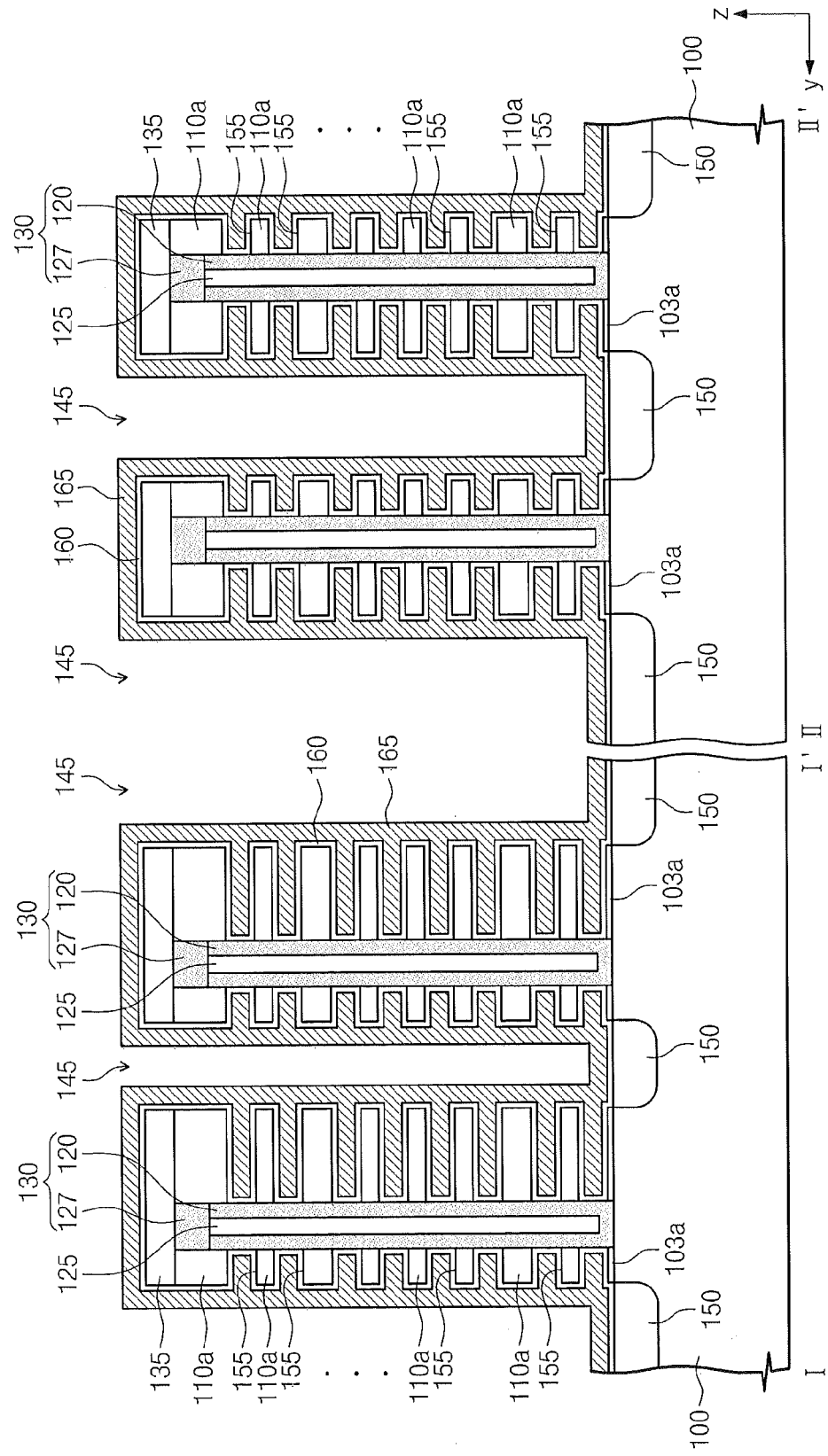

Referring to FIG. 5D, a multi-layered dielectric layer 160 may be conformally formed on the substrate 100 having the empty regions 155. The multi-layered dielectric layer 160 may be formed to a substantially uniform thickness on inner surfaces of the empty regions 155.

A gate conductive layer 165 filling the empty regions 155 may be formed on the substrate 100 having the multi-layered dielectric layer 160. In some embodiments, the gate conductive layer 165 may partially fill the trenches 145. However, the inventive concept may is not limited to embodiments in which the gate conductive layer 165 fills the empty regions 155 and partially fills the trenches 145.

Figure 5E:
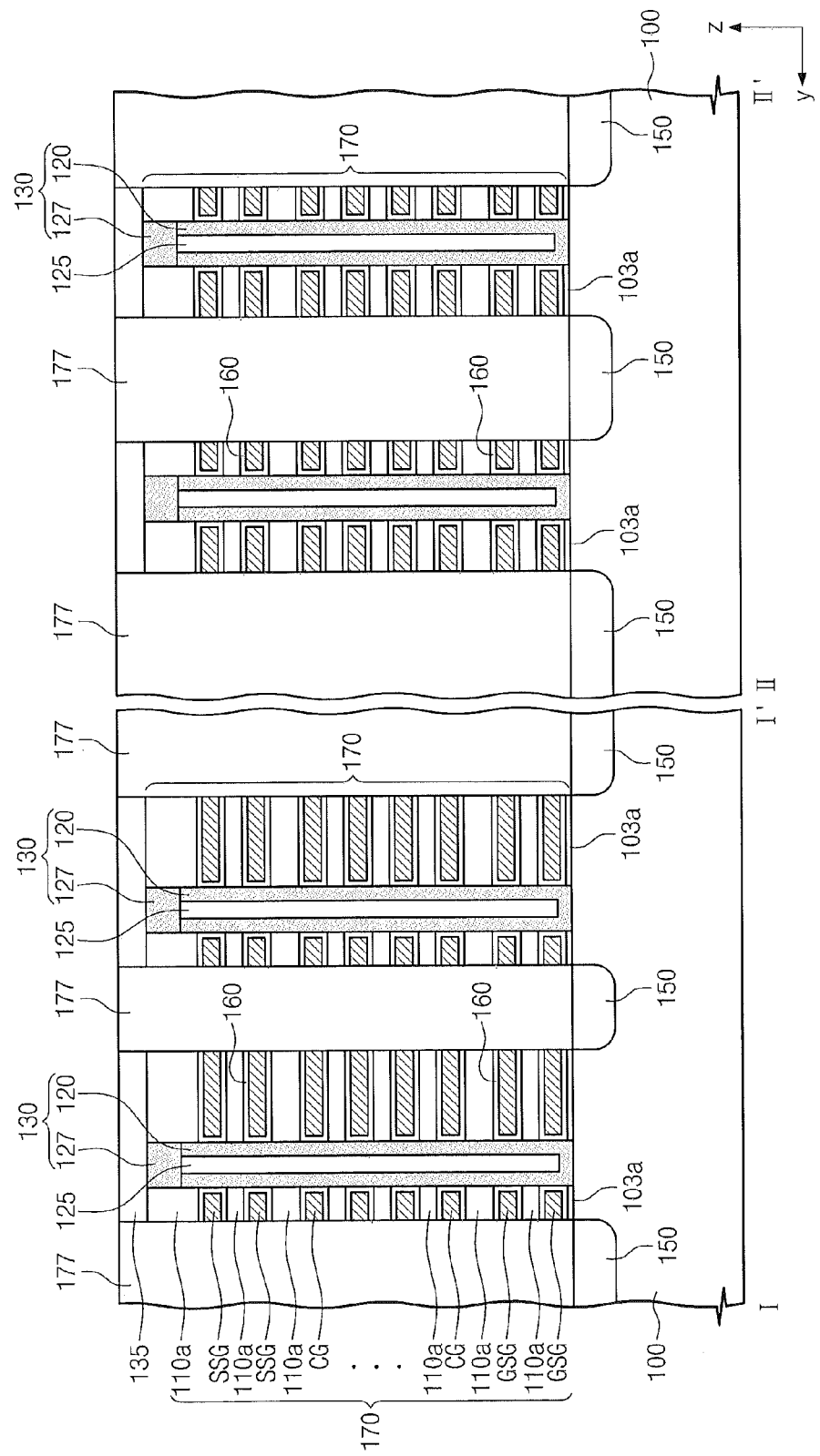

Referring to FIG. 5E, portions of the gate conductive layer 165 outside of the empty regions 155 may be removed to form gate patterns GSG, CG, and SSG filling the empty regions 155. Additionally, the gate patterns GSG, CG, and SSG may be separated from each other by removing the portions of the gate conductive layer 165 that are outside of the empty regions 155. The gate patterns GSG, CG, and SSG, and the insulation patterns 110a, may be alternately and repeatedly stacked on a portion of the substrate 100, and may constitute a stack-structure 170.

In some embodiments, portions of the multi-layered dielectric layer 160 that are formed outside of the empty regions 155 may be removed. Alternatively, in some embodiments, at least a portion of the multi-layered dielectric layer 160 formed outside the empty regions 155 may remain.

An isolation layer filling the trenches 145 may be formed on the substrate 100 having the gate patterns GSG, CG, and SSG. The isolation layer may be planarized to form isolation patterns 177 in the trenches 145.

Figure 5F:
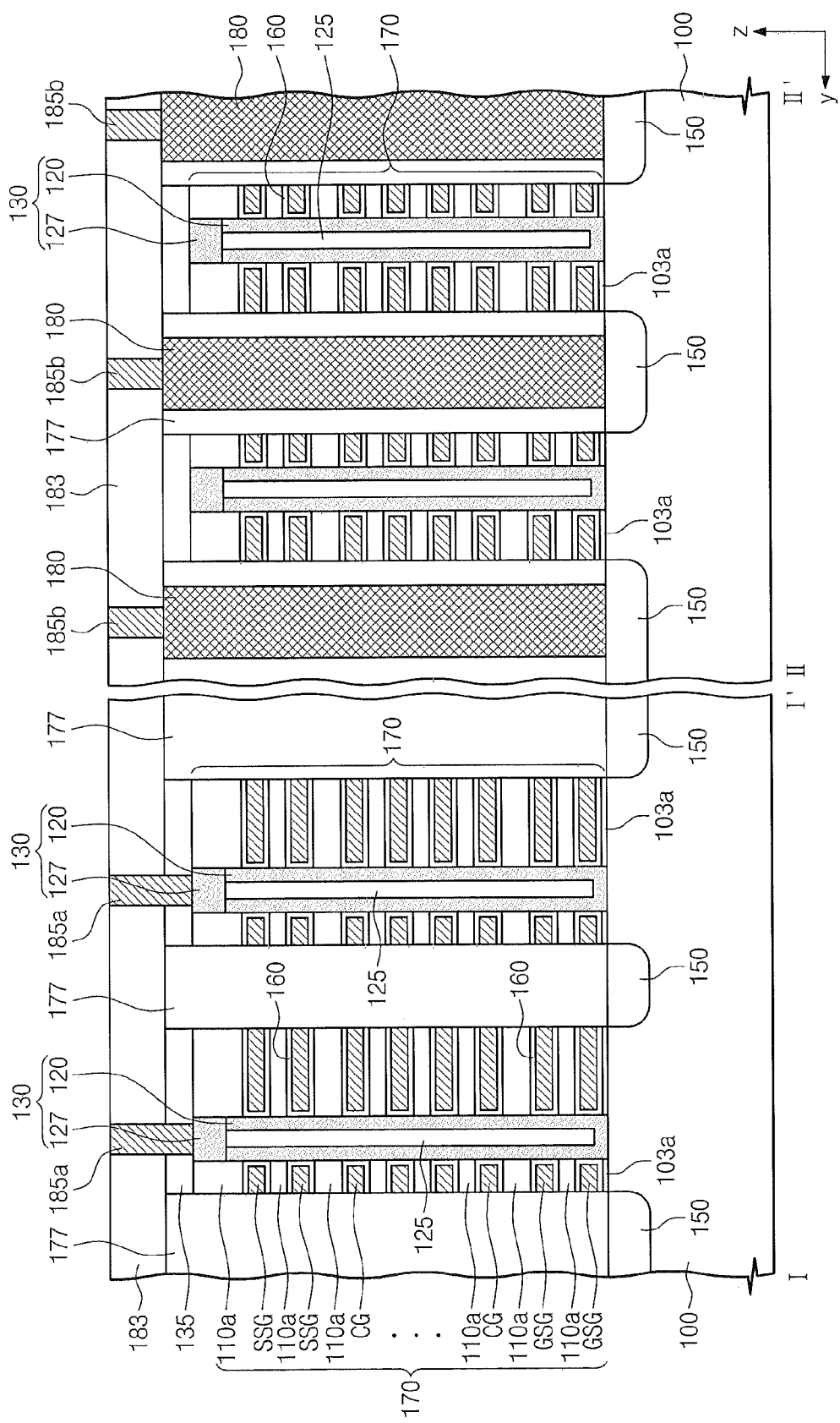

Referring to FIG. 5F, a plurality of strapping contact plugs 180 may be formed to penetrate the isolation patterns 177. The strapping contact plugs 180 may be electrically connected to respective ones of the common source regions 150.

An interlayer dielectric layer 183 may be formed on substantially an entire surface of the substrate having the strapping contact plugs 180. The interlayer dielectric layer 183 and the capping dielectric patterns 135 may be patterned to form holes exposing top surfaces of the vertical active patterns 130 in the first portions (indicated by the reference numeral '168a' in FIGS. 1A and 1B) of the stack-structures 170, and first conductive plugs 185a may be formed in respective ones of the holes. Thus, the first conductive plugs 185a may be electrically connected to respective ones of the vertical active patterns 130. In some embodiments, during formation of the first conductive plugs 185a, the first conductive plugs 185a may not be formed on the vertical active patterns 130 in the second portions (indicated by the reference numeral '168b' in FIGS. 1A and 1B) of the stack-structures 170. In other words, the vertical active patterns 130 in the second portions 168b of the stack-structures 170 may correspond to dummy vertical active patterns, as described with reference to FIGS. 1A-1C. A plurality of second conductive plugs 185b may be formed to penetrate the interlayer dielectric layer 183. The second conductive plugs 185b may be formed to contact respective ones of the strapping contact plugs 180. The first and second conductive plugs 185a and 185b may be formed simultaneously.

Bit lines 190a and a strapping line 190b (e.g., as illustrated in FIGS. 1A-1C) may be formed on the interlayer dielectric layer 183. As a result, the three-dimensional semiconductor memory device described with reference to FIGS. 1A-1C may be provided using the processes illustrated in FIGS. 5A-5F.

Figure 6A:
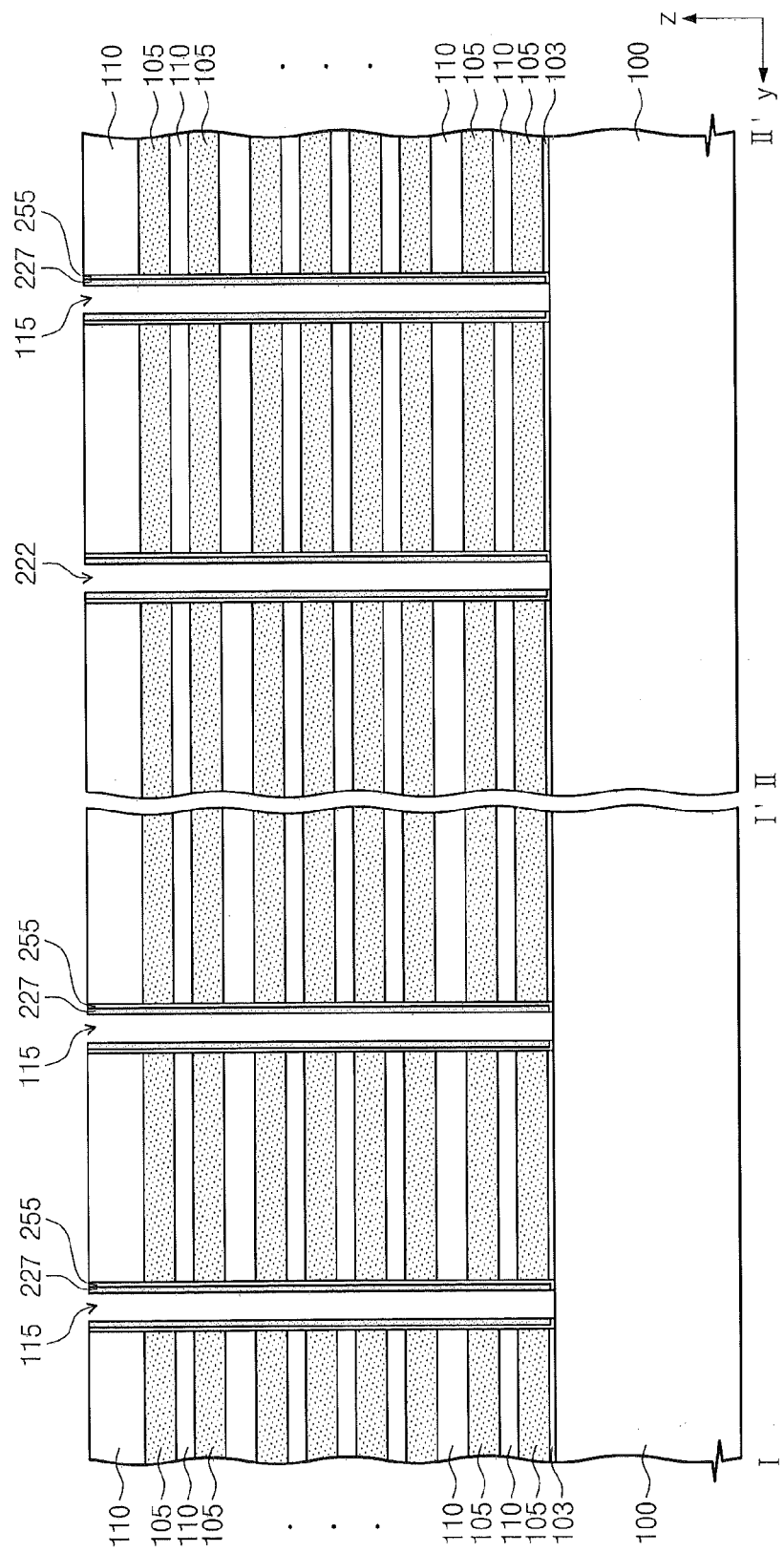
FIGS. 6A and 6B are merged cross-sectional views taken along lines I-I' and II-II' of FIG. 1A that illustrate methods of fabricating a three-dimensional semiconductor memory device according to some embodiments.
Figure 6B:
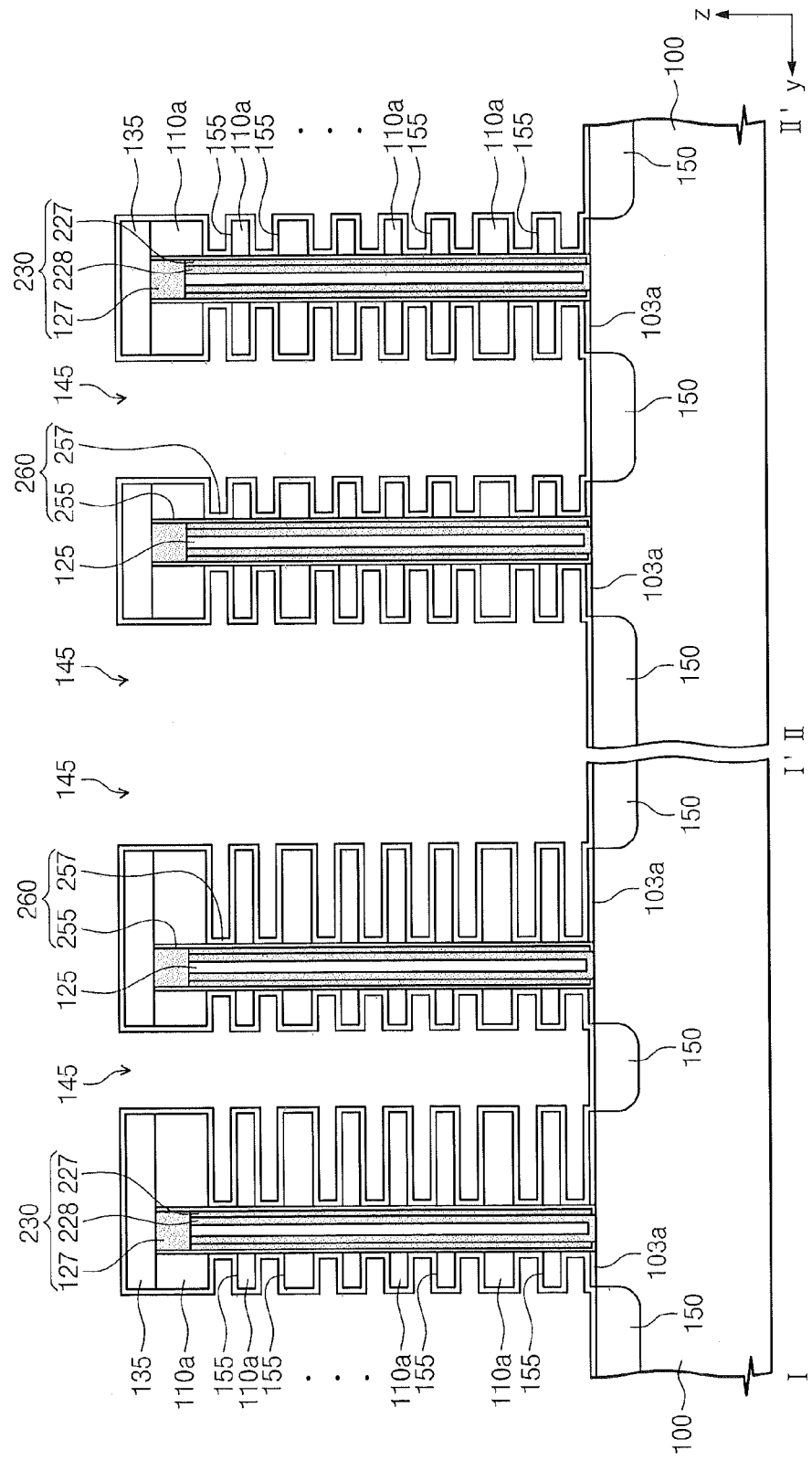

FIGS. 6A and 6B are merged cross-sectional views taken along lines I-I' and II-II' of FIG. 1A illustrating methods of fabricating a three-dimensional semiconductor memory device according to some embodiments.

Referring to FIG. 6A, a buffer dielectric layer 103 may be formed on a substrate 100, and sacrificial layers 105 and insulation layers 110 may be alternately and repeatedly stacked on the buffer dielectric layer 103. The insulation layers 110, the sacrificial layers 105 and the buffer dielectric layer 103 may be patterned to form channel holes 115.

A first sub-layer 255 may be conformally formed on the substrate 100 having the channel holes 115. A first semiconductor layer may be conformally formed on the first sub-layer 255. The first semiconductor layer and the first sub-layer 255 may be anisotropically etched until the substrate 100 under the channel holes 115 is exposed. As a result, first vertical semiconductor patterns 227 may be formed on sidewalls of the channel holes 115. The first sub-layer 255 may be disposed between the sidewalls of the channel holes 115 and the first vertical semiconductor patterns 227. The first sub-layer 255 on the bottom surface of the channel holes 115 and on the topmost (e.g., farthest from the substrate 100) insulation layer 110 may be removed during the anisotropic etching process.

Referring to FIG. 6B, a second semiconductor layer may be conformally formed on the substrate 100 having the first vertical semiconductor patterns 227, and a filling dielectric layer filling the channel holes 115 may be formed on the second semiconductor layer. The filling dielectric layer and the second semiconductor layer may be planarized until the topmost insulation layer 110 is exposed. As a result, a second vertical semiconductor pattern 228 and a filling dielectric pattern 125 may be formed in each of the channel holes 115. In at least one of the channel holes 115, the second vertical semiconductor pattern 228 may contact the first vertical semiconductor pattern 227 and the substrate 100 under the channel hole 115. The first and second vertical semiconductor patterns 227 and 228 and the filling dielectric patterns 125 may be recessed, and capping semiconductor patterns 127 may be formed in the channel holes 115 on the recessed first and second vertical semiconductor patterns 227 and 228 and the recessed filling dielectric patterns 125. The first and second vertical semiconductor patterns 227 and 228 and the capping semiconductor pattern 127 in each of the channel holes 115 may constitute a vertical active pattern 230. A drain region may be formed in at least a portion of each of the capping semiconductor patterns 127.

According to some embodiments, a capping dielectric layer may be formed on the substrate having the drain regions. The capping dielectric layer, the insulation layers 110, the sacrificial layers 105, and the buffer dielectric layer 103 may be patterned to form trenches 145 defining a plurality of stack patterns. Each of the stack patterns may include a buffer dielectric pattern 103a, a preliminary mold structure, and a capping dielectric pattern 135 that are sequentially stacked. The trenches 145 may be formed between the stack patterns. Each of the preliminary mold structures may include sacrificial patterns and insulation patterns 110a that are alternately and repeatedly stacked. The sacrificial patterns may be removed to form empty regions 155. The empty regions 155 may expose the first sub-layer 255 on sidewalls of the vertical semiconductor patterns 230.

A second sub-layer 257 may be conformally formed on the substrate 100 having the empty regions 155. The second sub-layer 257 may be formed to a substantially uniform thickness on inner surfaces of the empty regions 155. The first and second sub-layers 255 and 257 may constitute a multi-layered dielectric layer 260. Subsequent processes may be performed using the methods described with reference to FIGS. 5D and 5F. As a result, the three-dimensional semiconductor memory device described with reference to FIGS. 2A and 2B may be provided using the processes illustrated in FIGS. 6A and 6B (and, in some embodiments, further using the processes illustrated in FIGS. 5D and 5F).

In some embodiments, referring to the fabrication methods of the three-dimensional semiconductor memory device described with reference to FIGS. 5A-5F, the preliminary mold structures 140 shown in FIG. 5B may be formed to have the same planar configurations as the stack-structures 170a illustrated in FIGS. 3A and 3B. Accordingly, the three-dimensional semiconductor memory device described with reference to FIGS. 3A and 3B may be provided using the processes illustrated in FIGS. 5A-5F.

Figure 7:
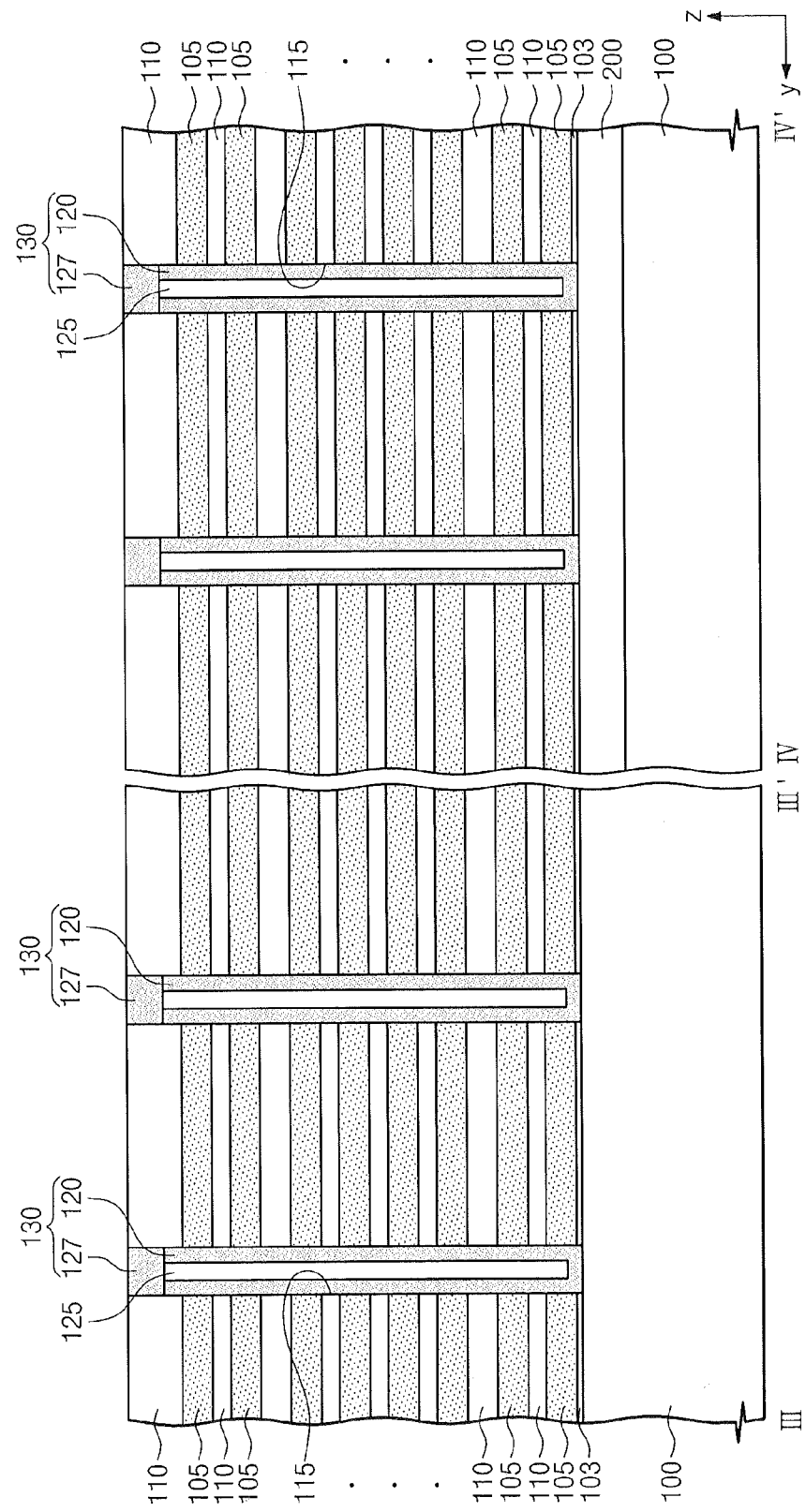
FIG. 7 is a merged cross-sectional view taken along lines III-III' and IV-IV' of FIG. 4A that illustrates methods of fabricating a three-dimensional semiconductor memory device according to some embodiments.

Methods of fabricating the three-dimensional semiconductor memory device illustrated in FIGS. 4A and 4B may be similar to the fabrication methods described with reference to FIGS. 5A-5F. However, there may be some differences between the methods of fabricating the three-dimensional semiconductor memory device illustrated in FIGS. 4A and 4B and the methods illustrated in FIGS. 5A-5F. For example, referring to FIG. 7, the connection doped region 200 of FIGS. 4A and 4B may be formed before forming the sacrificial layers 105 and the insulation layers 110. The connection doped region 200 may be formed using a mask pattern that defines the connection doped region 200. The buffer dielectric layer 103 may be used as an ion implantation buffer layer during an ion implantation process for forming the connection doped region 200. Alternatively, the buffer dielectric layer 103 may be formed after forming the connection doped region 200. In addition, the preliminary mold structures 140 illustrated in FIG. 5B may be formed to have the same planar configurations as the stack-structures 170 and 170' illustrated in FIG. 4A. Other fabrication processes may be performed using the methods described with reference to FIGS. 5A-5F. As a result, the three-dimensional semiconductor memory device illustrated in FIGS. 4A and 4B may be provided using the methods illustrated in FIGS. 5A-5F and FIG. 7.

Figure 8A:
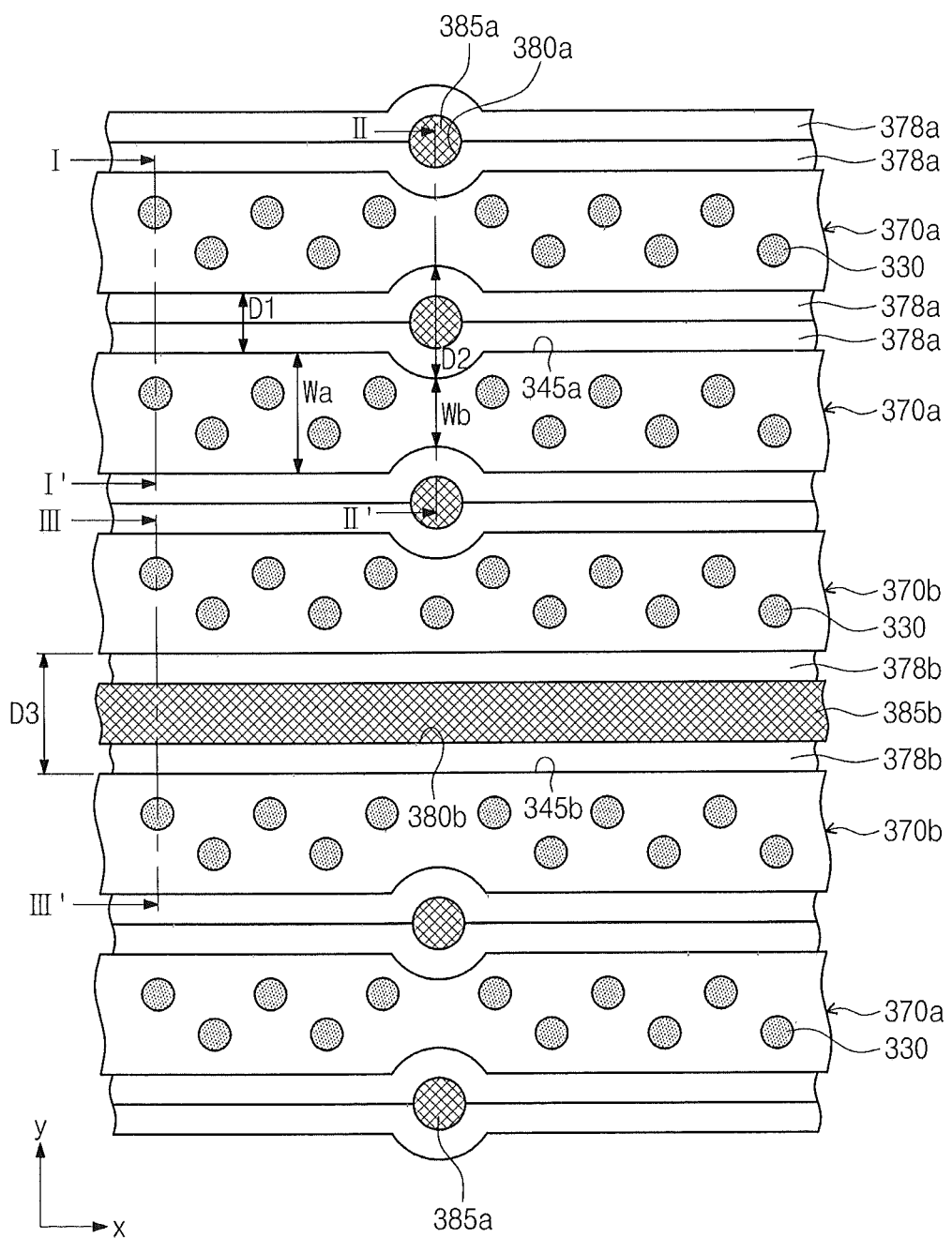
FIG. 8A is a plan view illustrating a three-dimensional semiconductor memory device according to some embodiments.
Figure 8B:
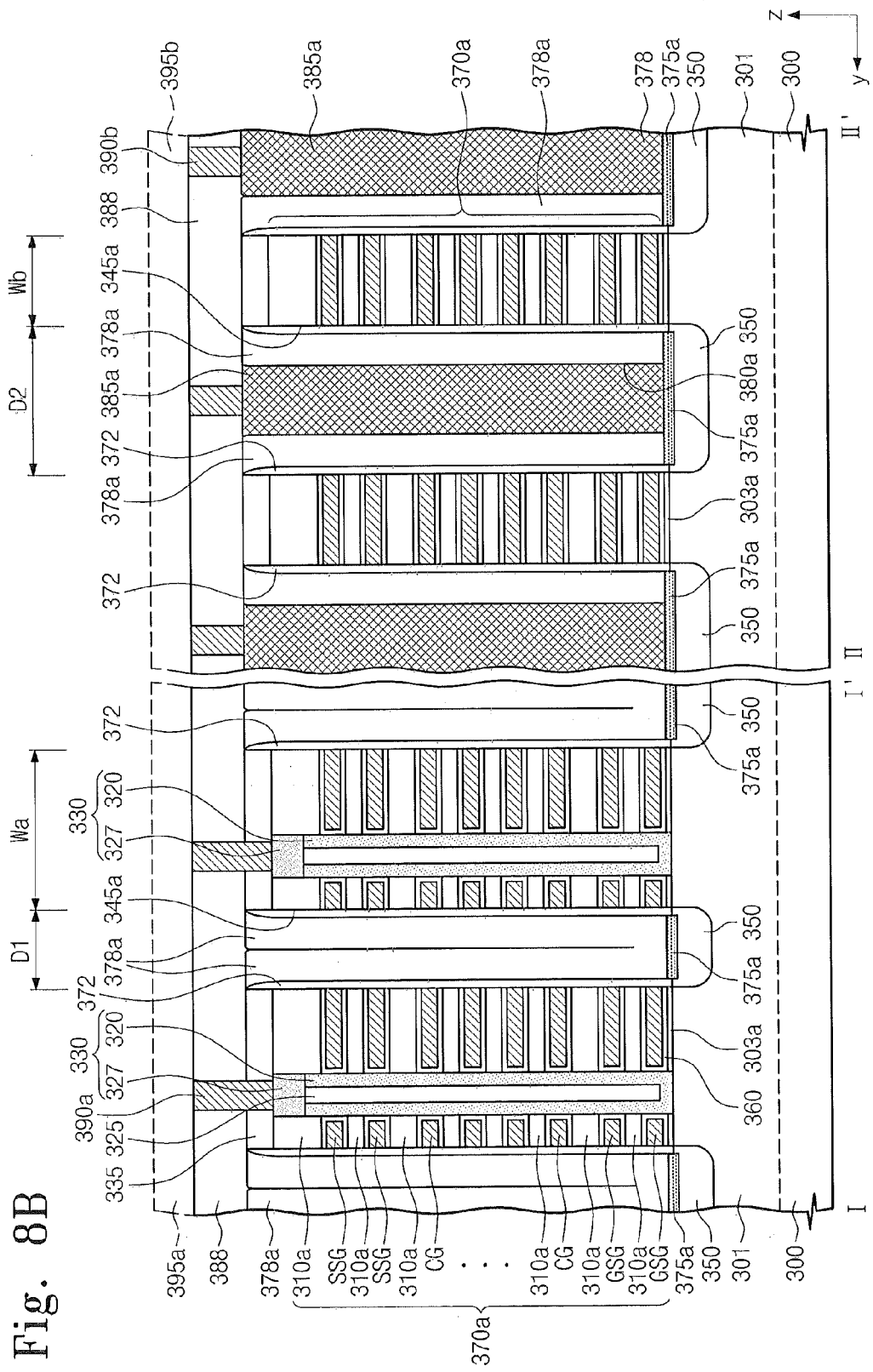
FIG. 8B is a merged cross-sectional view taken along lines I-I' and II-II' of FIG. 8A.
Figure 8C:
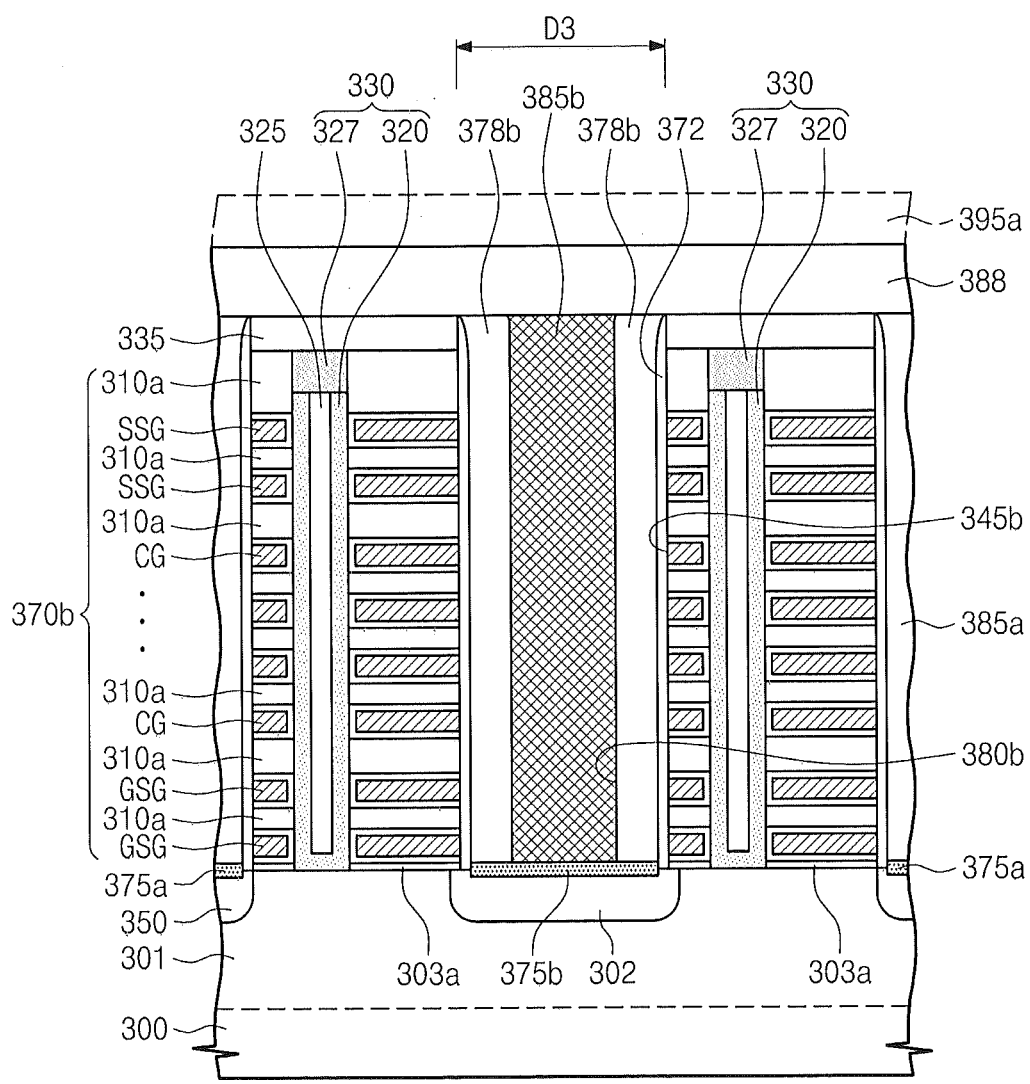
FIG. 8C is a cross-sectional view taken along a line III-III' of FIG. 8A.
Figure 8D:
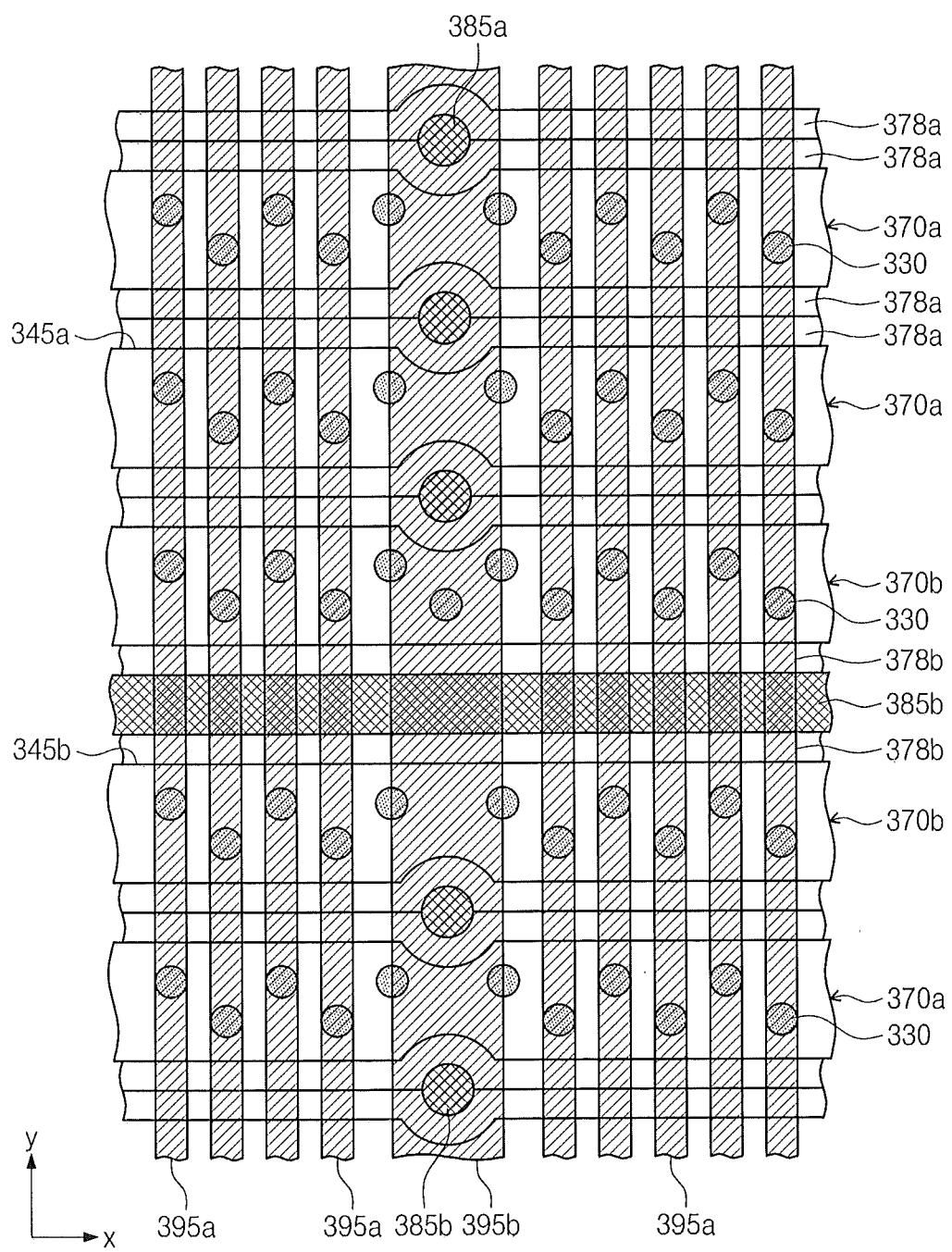
FIG. 8D is a plan view adding bit lines and a strapping line to the three-dimensional semiconductor memory device of FIG. 8A.

FIG. 8A is a plan view illustrating a three-dimensional semiconductor memory device according to some embodiments, FIG. 8B is a merged cross-sectional view taken along lines I-I' and II-II' of FIG. 8A, and FIG. 8C is a cross-sectional view taken along a line III-III' of FIG. 8A. FIG. 8D is a plan view adding bit lines and a strapping line to the three-dimensional semiconductor memory device of FIG. 8A.

Referring to FIGS. 8A-8C, a well region 301 doped with dopants of a first conductivity type may be disposed in a substrate 300. A plurality of stack-structures 370a and 370b may be disposed on the well region 301. As illustrated in FIG. 8A, the plurality of stack-structures 370a and 370b may extend substantially in parallel in a first direction. The plurality of stack-structures 370a and 370b may be separated from each other in a second direction substantially perpendicular to the first direction. The first and second directions may be parallel to a top surface of the substrate 300. Therefore, the first direction may correspond to an x-axis direction of FIG. 8A, and the second direction may correspond to a y-axis direction of FIG. 8A.

Each of the stack-structures 370a and 370b may include gate patterns GSG, CG, and SSG, and insulation patterns 310a, that are alternately and repeatedly stacked, as illustrated in FIGS. 8B and 8C. The gate patterns GSG, CG, and SSG of each of the stack-structures 370a and 370b may include at least one ground selection gate pattern (GSG), a plurality of cell gate patterns (CG) stacked on the ground selection gate pattern (GSG), and at least one string selection gate pattern (SSG) stacked on the topmost (e.g., farthest from the substrate 300) cell gate pattern (CG). In some embodiments, each of the stack-structures 370a and 370b may include a plurality of ground selection gate patterns (GSG) stacked under the bottommost (e.g., closest to the substrate 300) cell gate (CG) and/or a plurality of string selection gate patterns (SSG) stacked on the topmost cell gate (CG). The insulation patterns 310a of the respective stack-structures 370a and 370b may be designed to have various different thicknesses suitable for the characteristics of the device.

The insulation patterns 310a may include an oxide material layer. The gate patterns GSG, CG, and SSG may include a conductive material layer. For example, the gate patterns GSG, CG, and SSG may include at least one of a doped semiconductor (e.g., a doped silicon layer or the like), a metal layer (e.g., a tungsten layer, a copper layer, an aluminum layer, or the like), a conductive metal nitride layer (e.g., a titanium nitride layer, a tantalum nitride, layer or the like) and a transition metal layer (e.g., a titanium layer, a tantalum layer, or the like).

A plurality of vertical active patterns 330 may penetrate each of the stack-structures 370a and 370b. The vertical active patterns 330 may contact the well region 301. Each of the vertical active patterns 330 may include a vertical semiconductor pattern 320 having one of various shapes (e.g., a pipe shape or a macaroni shape). An inner portion of each of the vertical semiconductor patterns 320 may be filled with a filling dielectric pattern 325. Each of the vertical active patterns 330 may further include a capping semiconductor pattern 327 disposed on the filling dielectric pattern 325 and on the vertical semiconductor pattern 320. The vertical semiconductor patterns 320 and the capping semiconductor patterns 327 may include the same semiconductor material layer as the substrate 300. For example, when the substrate 300 is a silicon substrate, the vertical semiconductor patterns 320 and the capping semiconductor patterns 327 may include a silicon layer. The vertical semiconductor patterns 320 and the capping semiconductor patterns 327 may have a polycrystalline structure or a single crystalline structure. The vertical semiconductor patterns 320 may be doped with dopants of the first conductivity type or may be an undoped semiconductor layer. A drain region may be disposed in at least a portion of each of the capping semiconductor patterns 327. The drain regions may be doped with dopants of a second conductivity type that is different from the first conductivity type. Bottom surfaces of the drain regions may be located at a level that is adjacent top surfaces of the topmost (e.g., farthest from the substrate 300) string selection gate patterns (SSG).

A multi-layered dielectric layer 360 (illustrated in FIG. 8B) may be disposed between the sidewalls of the vertical active patterns 330 and respective ones of the gate patterns GSG, CG, and SSG. The multi-layered dielectric layer 360 may include a tunnel dielectric layer, a charge storage layer, and a blocking dielectric layer. The tunnel dielectric layer may be adjacent the sidewalls of the vertical active patterns 330, and the blocking dielectric layer may be adjacent the gate patterns GSG, CG, and SSG. The charge storage layer may be disposed between the tunnel dielectric layer and the blocking dielectric layer. The tunnel dielectric layer may include an oxide material layer and/or an oxynitride material layer. The blocking dielectric layer may include a high-k dielectric layer (e.g., a metal oxide layer such as a hafnium oxide layer and/or an aluminum oxide layer) having a dielectric constant higher than that of the tunnel dielectric layer. In addition, the blocking dielectric layer may further include a barrier dielectric layer having an energy band gap higher than the high-k dielectric layer. The barrier dielectric layer may be disposed between the high-k dielectric layer and the charge storage layer. The charge storage layer may include a dielectric layer having traps that are capable of storing charges. For example, the charge storage layer may include an oxide material layer and/or a metal oxide layer. If the multi-layered dielectric layer 360 is between one of the cell gate patterns (CG) and the vertical active patterns 330, then it may be used as a data storage element (e.g., to store logic data). In contrast, if the multi-layered dielectric layer 360 is between the selection gate patterns GSG or SSG and the respective vertical active patterns 330, then it may be used as a selection transistor gate dielectric layer. At least a portion of the multi-layered dielectric layer 360 may extend horizontally to cover top surfaces and bottom surfaces of the respective gate patterns GSG, CG and SSG. In some embodiments, all layers (e.g., the tunnel dielectric layer, the charge storage layer, and the blocking dielectric layer) of the multi-layered dielectric layer 360 may extend horizontally to cover the top surfaces and the bottom surfaces of the gate patterns GSG, CG, and SSG (e.g., as illustrated in FIG. 8C).

Each of the vertical active patterns 330 may provide a single vertical cell string. The vertical cell string may include a plurality of cell transistors that are sequentially stacked and electrically connected in series. The vertical cell string may further include at least one ground selection transistor stacked under the bottommost (e.g., closest to the substrate 300) cell transistor and at least one string selection transistor on the topmost (e.g., farthest from the substrate 300) cell transistor. In each of the vertical cell strings, the cell transistors may be defined at cross points of the vertical active pattern 330 and the cell gate patterns (CG). Further, the ground selection transistors may be defined at cross points of the vertical active pattern 330 and the ground selection gate patterns (GSG), and the string selection transistors may be defined at cross points of the vertical active pattern 330 and the string selection gate patterns (SSG). Each of the ground selection transistors, the cell transistors, and the string selection transistors in the vertical cell string may include a vertical channel region that is defined at a sidewall of the vertical active pattern 330. The ground selection transistor having the bottommost (e.g., closest to the substrate 300) ground selection gate pattern (GSG) may further include a horizontal channel region that is defined in the substrate 300 below the bottommost ground selection gate pattern (GSG).

A plurality of buffer dielectric patterns 303a may be disposed between the stack-structures 370a and 370b and the substrate 300. Accordingly, the vertical active patterns 330 may extend toward the substrate 300 (e.g., may protrude between adjacent buffer dielectric patterns 303a toward the substrate 300). In other words, even though the buffer dielectric patterns 303a are present (e.g., on opposing sidewalls of each of the vertical active patterns 330), the vertical active patterns 330 may be in contact with the well region 301. Each of the buffer dielectric patterns 303a may include an oxide material. A capping dielectric pattern 335 may be disposed on each of the stack-structures 370a and 370b, and on the vertical active pattern 330 penetrating the respective one of the stack-structures 370a and 370b. Opposing sidewalls of the capping dielectric pattern 335 may be vertically self-aligned with opposing sidewalls of the stack-structure 370a or 370b thereunder. Each of the capping dielectric patterns 335 may include an oxide material, a nitride material, and/or an oxynitride material.

Referring to FIGS. 8A-8C, the plurality of stack-structures may include first stack-structures 370a and second stack-structures 370b. As illustrated in FIG. 8A, a first trench 345a may be defined between a pair of adjacent first stack-structures 370a. The first trench 345a may extend in the first direction. The first stack-structures 370a may be arrayed to have a substantially uniform pitch in the second direction. A common source region 350 may be disposed in the substrate 300 under each of the first trenches 345a. In more detail, as illustrated in FIG. 8B, the common source region 350 may be formed in the well region 301 under each of the first trenches 345a. The common source regions 350 may be doped with dopants of the second conductivity type. That is, the common source regions 350 may be doped with dopants of a different conductivity type from the well region 301. Bottom surfaces of the common source regions 350 may be located at a higher level than a bottom surface of the well region 301. The common source regions 350 may also extend in the first direction due to the first trenches 345a.

Each of the first trenches 345a may include a first region and a second region. The first and second regions of each of the first trenches 345a may be alternately arrayed in the first direction. The first and second regions of the first trenches 345a may each have a width in the second direction. In more detail, the first regions of the first trenches 345a may have a first width D1, and the second regions of the first trenches 345a may have a second width D2. In some embodiments, the second width D2 may be greater than the first width D1. The first width D1 of the first regions may be substantially uniform. In contrast, the second width D2 of the second regions may vary according to a position in the first direction. Each of the common source regions 350 may include a non-landing portion and a landing portion, due to a planar shape of the respective first trenches 345a. Therefore, a width of the landing portions may be greater than that of the non-landing portions. The non-landing portions of the common source regions 350 may be disposed under the first regions of the first trenches 345a. Similarly, the landing portions of the common source regions 350 may be disposed under the second regions of the first trenches 345a.

A pair of first insulating spacers 378a may be disposed on opposing sidewalls within each of the first trenches 345a. The opposing sidewalls of the first trenches 345a may extend substantially in the first direction. In some embodiments, the pair of first insulating spacers 378a in the respective first regions of the first trenches 345a may contact (e.g., directly contact) each other, whereas the pair of first insulating spacers 378a in the respective second regions of the first trenches 345a may be separated from each other. This may be because the second width D2 of the second regions is greater than the first width D1 of the first regions. As a result, a hole 380a surrounded by the pair of first insulating spacers 378a may be defined in each of the second regions of the first trenches 345a. The first insulating spacers 378a may have a substantially uniform width. The first insulating spacers 378a may include an oxide material, a nitride material, and/or an oxynitride material.

Each of the pair of adjacent first stack-structures 370a defining the first trench 345a may include a first portion adjacent the first region of the first trench 345a and a second portion adjacent the second region of the first trench 345a. The first and second portions may have a width in the second direction. The width Wb of the second portions may be less than the width Wa of the first portions. This may be because the second width D2 of the second regions is greater than the first width D1 of the first regions. One of the opposing sidewalls of each of the first trenches 345a may include both a sidewall of the first portions of the first stack-structures 370a and a sidewall of the second portions of the first stack-structures 370a. The sidewall of the second portion may have a concave shape.

Strapping contact plugs 385a may be disposed in respective holes 380a. The strapping contact plugs 385a may be electrically connected to the corresponding common source regions 350. The first stack-structures 370a and the strapping contact plugs 385a may be alternately arrayed in the second direction (e.g., as illustrated in FIG. 8A). Each of the strapping contact plugs 385a may include a conductive material. For example, each of the strapping contact plugs 385a may include at least one of a metal layer (e.g., a tungsten layer, a copper layer, an aluminum layer, or the like), a conductive metal nitride layer (e.g., a titanium nitride layer, a tantalum nitride layer, or the like), and a transition metal layer (e.g., a titanium layer, a tantalum layer, or the like).

As illustrated in FIG. 8A, a second trench 345b may be defined between a pair of adjacent second stack-structures 370b. The second trench 345b may also extend in the first direction. The second trench 345b may have a third width D3 in the second direction. The third width D3 of the second trench 345b may be substantially uniform. A well pickup region 302 may be disposed in the well region 301 under the second trench 345b. The well pickup region 302 may be doped with dopants of the same conductivity type (e.g., the first conductivity type) as the well region 301. Also, the well pickup region 302 may have a higher dopant concentration than the well region 301.

A pair of second insulating spacers 378b may be disposed on opposing sidewalls within the second trench 345b, respectively. The opposing sidewalls of the second trench 345b may extend substantially in parallel in the first direction. The third width D3 of the second trench 345b may be greater than the first width D1 of the first regions of the first trenches 345a. The pair of second insulating spacers 378b may be separated from each other. A groove 380b may be defined between the pair of second insulating spacers 378b. The groove 380b may also extend in the first direction.

A well conductive line 385b may be disposed in the groove 380b and may be electrically connected to the well pickup region 302. As a result, the well conductive line 385b may be electrically connected to the well region 301. In an operation mode, a well bias (e.g., a given voltage) may be supplied to the well region 301 through the well conductive line 385b. The well conductive line 385b may extend in the first direction. A top (e.g., farthest from the substrate 300) surface of the well conductive line 385b may be located at substantially the same level as top surfaces of the strapping contact plugs 385a. That is, the top surface of the well conductive line 385b may be substantially coplanar with the top surfaces of the strapping contact plugs 385a. The well conductive line 385b may include a conductive material. For example, the well conductive line 385b may include at least one of a metal layer (e.g., a tungsten layer, a copper layer, an aluminum layer, or the like), a conductive metal nitride layer (e.g., a titanium nitride layer, a tantalum nitride layer, or the like), and a transition metal layer (e.g., a titanium layer, a tantalum layer, or the like). In some embodiments, the well conductive line 385b may include the same conductive material as the strapping contact plugs 385a.

As illustrated in FIG. 8B, first metal-semiconductor compound material patterns 375a may be disposed on top surfaces of the common source regions 350, respectively. The first metal-semiconductor compound material patterns 375a may be disposed under the first insulating spacers 378a. The strapping contact plugs 385a may contact the first metal-semiconductor compound material patterns 375a, respectively. Each of the strapping contact plugs 385a may be electrically connected to one of the common source regions 350 through one of the first metal-semiconductor compound material patterns 375a.

When viewed from a plan view, each of the first metal-semiconductor compound material patterns 375a may have a line shape extending in the first direction (e.g., extending similar to the common source regions 350). Thus, the electrical resistance of the common source regions 350 may be significantly reduced (e.g., may be relatively low). Each of the first metal-semiconductor compound material patterns 375a may include a first portion disposed on the non-landing portion of the respective common source regions 350 and a second portion disposed on the landing portion of the respective common source regions 350. From a planar point of view, a width of the second portions of the first metal-semiconductor compound material patterns 375a may be greater than that of the first portions of the first metal-semiconductor compound material patterns 375a. The strapping contact plugs 385a may contact respective second portions of the first metal-semiconductor compound material patterns 375a. Each of the first metal-semiconductor compound material patterns 375a may include a compound material having a semiconductor element of the substrate 300 and a metal element. For example, each of the first metal-semiconductor compound material patterns 375a may include a metal silicide layer such as a cobalt silicide layer, a titanium silicide layer, and/or a nickel silicide layer.

As illustrated in FIG. 8C, a second metal-semiconductor compound material pattern 375b may be disposed on the well pickup region 302. The second metal-semiconductor compound material pattern 375b may be disposed under the second insulating spacers 378b (e.g., between the second insulating spacers 378b and the well pickup region 302). The well conductive line 385b may contact (e.g., directly contact) the second metal-semiconductor compound material pattern 375b. Thus, the well conductive line 385b may be electrically connected to the well region 301 through the second metal-semiconductor compound material pattern 375b and the well pickup region 302. From a planar point of view, the second metal-semiconductor compound material pattern 375b may also extend in the first direction (e.g., like the well pickup region 302). As a result, the electrical resistance of the well pickup region 302 may be significantly reduced (e.g., may be relatively low). In some embodiments, the second metal-semiconductor compound material pattern 375b may include a metal silicide layer such as a cobalt silicide layer, a titanium silicide layer, and/or a nickel silicide layer. The second metal-semiconductor compound material pattern 375b may be formed of the same material layer as the first metal-semiconductor compound material pattern 375a.

In some embodiments, protection spacers 372 may be disposed on inner sidewalls of the first and second trenches 345a and 345b. For example, each of the first metal-semiconductor compound material patterns 375a may be disposed on the common source region 350 between a pair of adjacent protection spacers 372 in each of the first trenches 345a. Each of the protection spacers 372 in the first trenches 345a may be disposed between a sidewall of the first trench 345a and a sidewall of the first insulating spacer 378a. Similarly, the second metal-semiconductor compound material pattern 375b may be disposed on the well pickup region 302 between a pair of adjacent protection spacers 372 in the second trench 345b. Each of the protection spacers 372 in the second trench 345b may be disposed between a sidewall of the second trench 345b and a sidewall of the second insulating spacer 378b. Each of the protection spacers 372 may include an oxide material, a nitride material, and/or an oxynitride material.

An interlayer dielectric layer 388 may be disposed on the substrate 300 having the strapping contact plugs 385a and the well conductive line 385b. The interlayer dielectric layer 388 may include an oxide material, a nitride material, and/or an oxynitride material. Bit lines 395a may be disposed on the interlayer dielectric layer 388. The bit lines 395a may be electrically connected to upper portions (e.g., portions farthest from the substrate 300) of the vertical active patterns 330. In particular, the bit lines 395a may be electrically connected to the drain regions in the vertical active patterns 330. The bit lines 395a may be electrically connected to the upper portions of the vertical active patterns 330 through first conductive plugs 390a. The first conductive plugs 390a may penetrate the interlayer dielectric layer 388 and the capping dielectric patterns 335 to contact the vertical active patterns 330.

A strapping line 395b may also be disposed on the interlayer dielectric layer 388. The strapping line 395b may be electrically connected to the strapping contact plugs 385a. The strapping line 395b may be electrically connected to the strapping contact plugs 385a through second conductive plugs 390b. The second conductive plugs 390b may penetrate the interlayer dielectric layer 388 to contact the strapping contact plugs 385a.

The bit lines 395a and the strapping line 395b may be located at substantially the same level from the top surface of the substrate 300. In other words, the bit lines 395a and the strapping line 395b may be substantially coplanar. In some embodiments, an interconnection line may be disposed on the interlayer dielectric layer 388. The interconnection line may be electrically connected to the well conductive line 385b. The interconnection line may be disposed at substantially the same level as the bit lines 395a and the strapping line 395b. The interconnection line may be electrically connected to one end or both ends of the well conductive line 385b.

Each of the first and second conductive plugs 390a and 390b may include at least one of a metal layer (e.g., a tungsten layer, a copper layer, an aluminum layer, or the like), a conductive metal nitride layer (e.g., a titanium nitride layer, a tantalum nitride layer, or the like), and a transition metal layer (e.g., a titanium layer, a tantalum layer, or the like). Each of the bit lines 395a and the strapping line 395b may include at least one of a metal layer (e.g., a tungsten layer, a copper layer, an aluminum layer, or the like), a conductive metal nitride layer (e.g., a titanium nitride layer, a tantalum nitride layer, or the like) and a transition metal layer (e.g., a titanium layer, a tantalum layer, or the like).

FIG. 8D illustrates the bit lines 395a and the strapping line 395b on the plan view of FIG. 8A.

Referring to FIG. 8D, the bit lines 395a and the strapping line 395b may extend substantially in parallel. The bit lines 395a and the strapping line 395b may cross over the stack-structures 370a and 370b. The strapping line 395b may overlap some of the vertical active patterns 330 penetrating the stack-structures 370a and 370b, as illustrated in FIG. 8D. The vertical active patterns 330 overlapping the strapping line 395b may correspond to dummy vertical active patterns. In addition, the vertical active patterns 330 partially overlapping the strapping line 395b may also correspond to the dummy vertical active patterns. The dummy vertical active patterns may not be electrically connected to the bit lines 395a.

Referring to FIGS. 8B and 8C, the second stack-structures 370b may correspond to dummy patterns. That is, the vertical active patterns 330 penetrating the second stack-structures 370b may also correspond to the dummy vertical active patterns. Thus, the vertical active patterns 330 penetrating the second stack-structures 370b may not be electrically connected to the bit lines 395a. In some embodiments, the first conductive plug 390a may not be disposed on the vertical active patterns 330 that penetrate the second stack-structures 370b to act as the dummy vertical active patterns, as illustrated in FIG. 8C. Similarly, the first conductive plug 390a may not be disposed on the dummy vertical active patterns of the vertical active patterns 330 penetrating the first stack-structures 370a. The dummy vertical active patterns penetrating the first stack-structures 370a may partially overlap the strapping line 395b or may be adjacent the strapping line 395b when viewed from a plan view.

According to some embodiments of the three-dimensional semiconductor memory devices, the common source regions 350 may be electrically connected to the strapping line 395b through the strapping contact plugs 385a. Thus, electrical resistance of the common source regions 350 may be reduced. In addition, the well region 301 may be electrically connected to the well conductive line 385b. Thus, electrical resistance of the well region 301 may be reduced. As a result, the reliability of the three-dimensional semiconductor memory devices may be improved (e.g., may be relatively high).

Moreover, the strapping contact plugs 385a may be disposed in the respective holes 380a defined by the first insulating spacers 378a. Furthermore, the well conductive line 385b may be disposed in the groove 380b defined by the second insulating spacers 378b. That is, the strapping contact plugs 385a and the well conductive line 385b may be self-aligned by the first and second insulating spacers 378a and 378b. Thus, an alignment margin between the strapping contact plugs 385a and the common source regions 350 may not be required. Similarly, an alignment margin between the well conductive line 385b and the well pickup region 302 may not be required. As a result, the three-dimensional semiconductor memory devices may be improved/optimized to have high reliability and high integration density.

Figure 9:
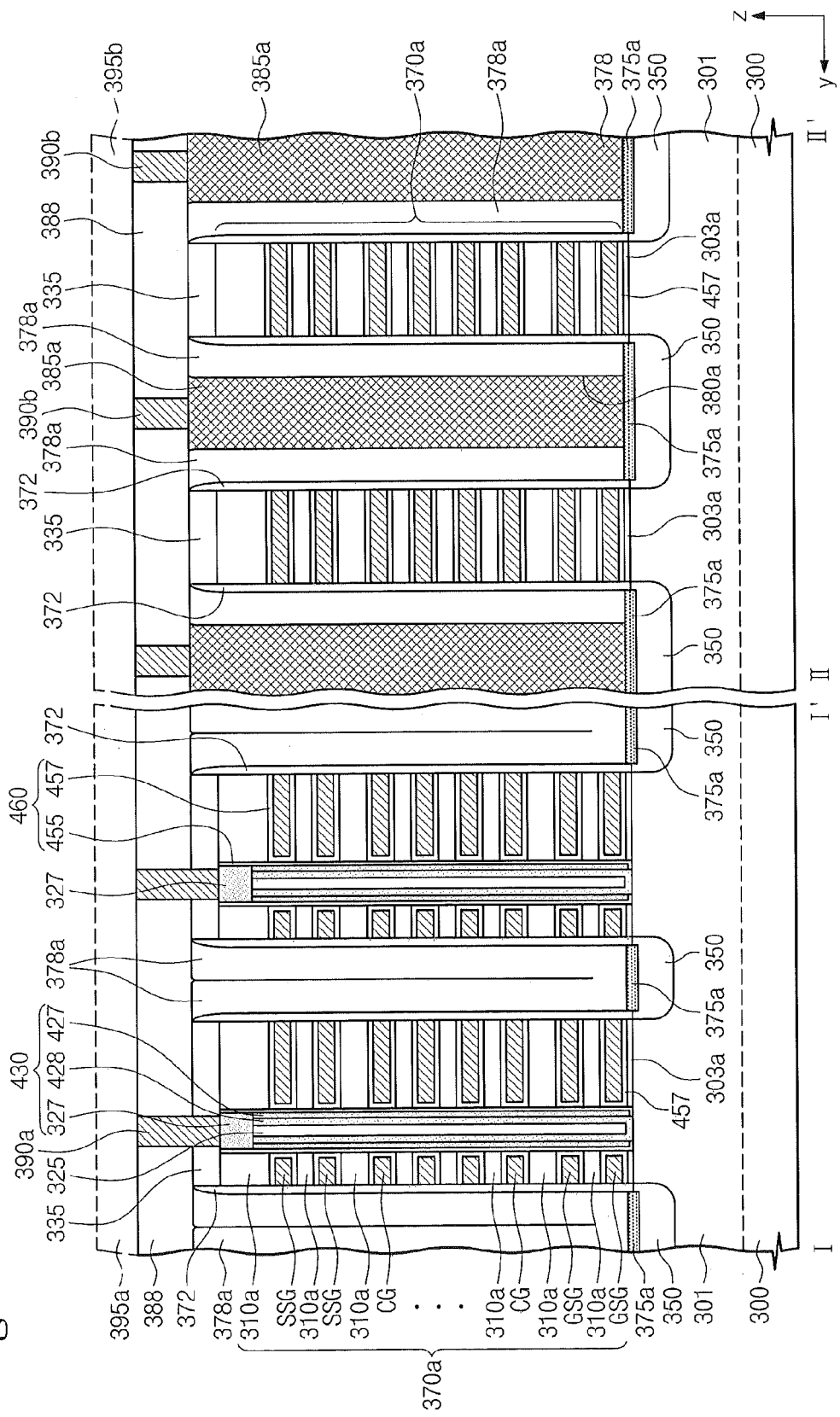
FIG. 9 is a merged cross-sectional view taken along lines I-I' and II-II' of FIG. 8A that illustrates the three-dimensional semiconductor memory device according to some embodiments.

FIG. 9 is a merged cross-sectional view taken along lines I-I' and II-II' of FIG. 8A to illustrate some embodiments of the three-dimensional semiconductor memory devices of FIGS. 8A-8D. Some embodiments of FIG. 9 may be different from FIGS. 8A-8D in terms of a configuration of a multi-layered dielectric layer.

Referring to FIG. 9, a multi-layered dielectric layer 460 may be disposed between vertical active patterns 430 and the gate patterns GSG, CG, and SSG. The multi-layered dielectric layer 460 may include a tunnel dielectric layer, a charge storage layer, and a blocking dielectric layer. The tunnel dielectric layer, the charge storage layer, and the blocking dielectric layer of some embodiments of FIG. 9 may be formed of the same material layers as the tunnel dielectric layer, the charge storage layer, and the blocking dielectric layer described with reference to FIGS. 8A-8C.

The multi-layered dielectric layer 460 may include a first sub-layer 455 and a second sub-layer 457. The first sub-layer 455 may extend vertically to intervene between the vertical active patterns 430 and the insulation patterns 310a. The second sub-layer 457 may horizontally extend to cover the bottom surfaces and the top surfaces of the gate patterns GSG, CG, and SSG. The first sub-layer 455 may include at least a portion of the tunnel dielectric layer, and the second sub-layer 457 may include at least a portion of the blocking dielectric layer. Any one of the first and second sub-layers 455 and 457 may include the charge storage layer. In some embodiments, the first sub-layer 455 may include the tunnel dielectric layer, the charge storage layer, and the barrier dielectric layer (e.g., a portion of the blocking dielectric layer), and the second sub-layer 457 may include the high-k dielectric layer (e.g., another portion of the blocking dielectric layer). However, the inventive concept is not limited to such embodiments. That is, the first and second sub-layers 455 and 457 may have a variety of different combinations.

Each of the vertical active patterns 430 may include a first vertical semiconductor pattern 427 and a second vertical semiconductor pattern 428. The first vertical semiconductor patterns 427 may be disposed between the second vertical semiconductor patterns 428 and the first sub-layers 455. The first vertical semiconductor patterns 427 may not contact the well region 301 due to the presence of horizontal extensions of the first sub-layers 455, whereas the second vertical semiconductor patterns 428 may contact (e.g., directly contact) the first vertical semiconductor pattern 427 and the well region 301. The second vertical semiconductor patterns 428 may have various shapes (e.g., a macaroni shape or a pipe shape). An inner empty space surrounded by each of the second vertical semiconductor patterns 428 may be filled with the filling dielectric pattern 325 (e.g., the filling dielectric pattern 325 illustrated in FIGS. 8B and 8C). Each of the vertical active patterns 430 may further include the capping semiconductor pattern 327 (e.g., the capping semiconductor pattern 327 illustrated in FIGS. 8B and 8C). The first and second vertical semiconductor patterns 427 and 428 may include the same semiconductor layer as the substrate 300. The first and second vertical semiconductor patterns 427 and 428 may be doped with dopants of the first conductivity type. Alternatively, first and second vertical semiconductor patterns 427 and 428 may be undoped semiconductor patterns (e.g., intrinsic semiconductor patterns). A drain region doped with dopants of the second conductivity type may be formed in at least a portion of each of the capping semiconductor patterns 327.

Referring to FIGS. 8A-9, in some embodiments, the protection spacers 372 and the metal-semiconductor compound material patterns 375a and 375b may be applied to the three-dimensional semiconductor memory devices (e.g., the three-dimensional semiconductor memory devices described with reference to FIGS. 1A-1C, the three-dimensional semiconductor memory devices described with reference to FIGS. 2A and 2B, the three-dimensional semiconductor memory devices described with reference to FIGS. 3A and 3B, and/or the three-dimensional semiconductor memory devices described with reference to FIGS. 4A and 4B).

FIGS. 10A, 11A, 12A, 13A, 14A, 15A, 16A, and 17A are merged cross-sectional views taken along lines I-I' and II-II' of FIG. 8A to illustrate methods of fabricating a three-dimensional semiconductor memory device according to some embodiments, and FIGS. 10B, 11B, 12B, 13B, 14B, 15B, 16B, and 17B are cross-sectional views taken along lines III-III' of FIG. 8A to illustrate methods of fabricating a three-dimensional semiconductor memory device according to some embodiments.

Figure 10A:
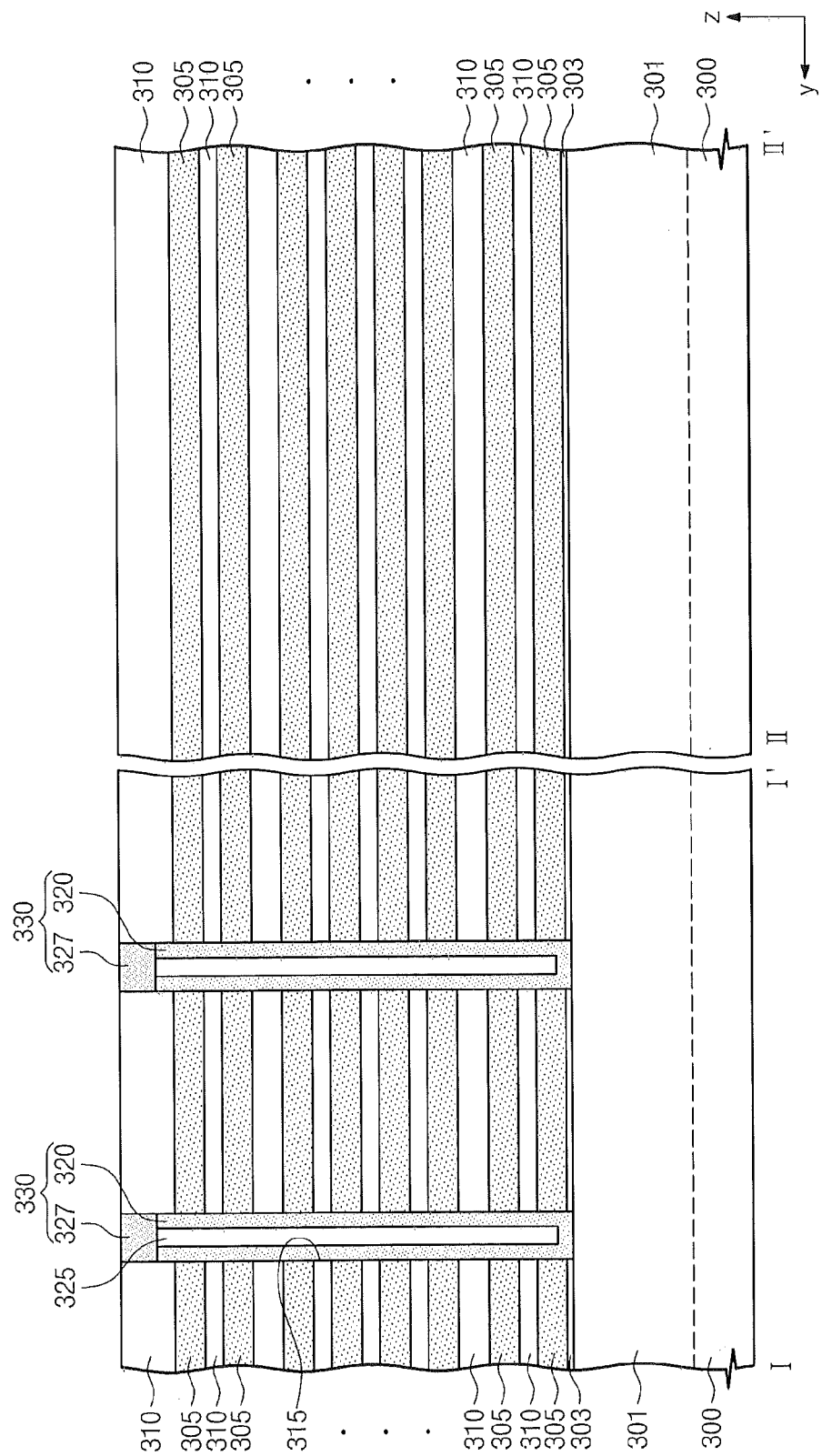
Figure 10B:
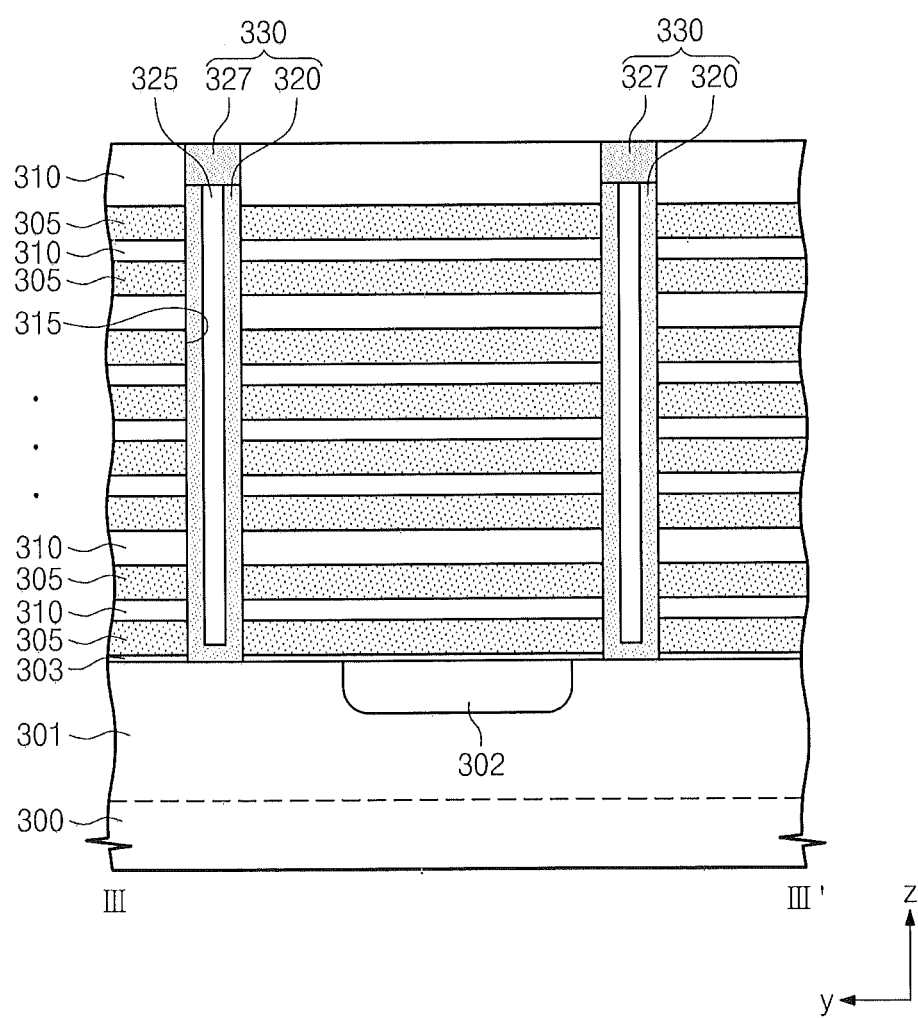

Referring to FIGS. 10A and 10B, dopants of a first conductivity type may be provided in a substrate 300 to form a well region 301. A well pickup region 302 may be formed in a portion of the well region 301, as illustrated in FIG. 10B. The well pickup region 302 may be doped with dopants of the same conductivity type as the well region 301. Dopant concentration of the well pickup region 302 may be higher than that of the well region 301.

A buffer dielectric layer 303 may be formed on the substrate 300 having the well region 301. Sacrificial layers 305 and insulation layers 310 may be alternately and repeatedly stacked on the buffer dielectric layer 303. The sacrificial layers 305 may be formed of a material layer having an etch selectivity with respect to the insulation layers 310. For example, the insulation layers 310 may be formed of an oxide layer, and the sacrificial layers 305 may be formed of a nitride layer. The buffer dielectric layer 303 may be formed of an oxide layer.

The insulation layers 310, the sacrificial layers 305, and the buffer dielectric layer 303 may be patterned to form a plurality of channel holes 315 exposing the well regions 301. A conformal semiconductor layer may be then formed on the substrate 300 having the channel holes 315, and a filling dielectric layer may be formed on the semiconductor layer. The filling dielectric layer may be formed to fill the channel holes 315. The filling dielectric layer and the semiconductor layer may be planarized until the topmost (e.g., farthest from the substrate 300) insulation layer 310 is exposed, thereby forming a vertical semiconductor pattern 320 and a filling dielectric pattern 325 in each of the channel holes 315. The vertical semiconductor patterns 320 and the filling dielectric patterns 325 may be recessed so that topmost (e.g., farthest from the substrate 300) surfaces of the vertical semiconductor patterns 320 and the filling dielectric patterns 325 may be located at a lower level (e.g., closer to the substrate 300) than a top surface of the topmost insulation layer 310. A capping semiconductor layer may be formed on the substrate 300 having the recessed vertical semiconductor patterns 320 and the recessed filling dielectric patterns 325. The capping semiconductor layer may fill the channel holes 315 provided on the recessed vertical semiconductor patterns 320 and the recessed filling dielectric patterns 325. The capping semiconductor layer may be planarized until the topmost insulation layer 310 is exposed, thereby forming a plurality of capping semiconductor patterns 327. Each of the vertical semiconductor patterns 320 and the capping semiconductor pattern 327 thereon may constitute a vertical active pattern 330. Dopants of a second conductivity type may be provided into top portions of the vertical active patterns 330 to form a plurality of drain regions.

Figure 11A:
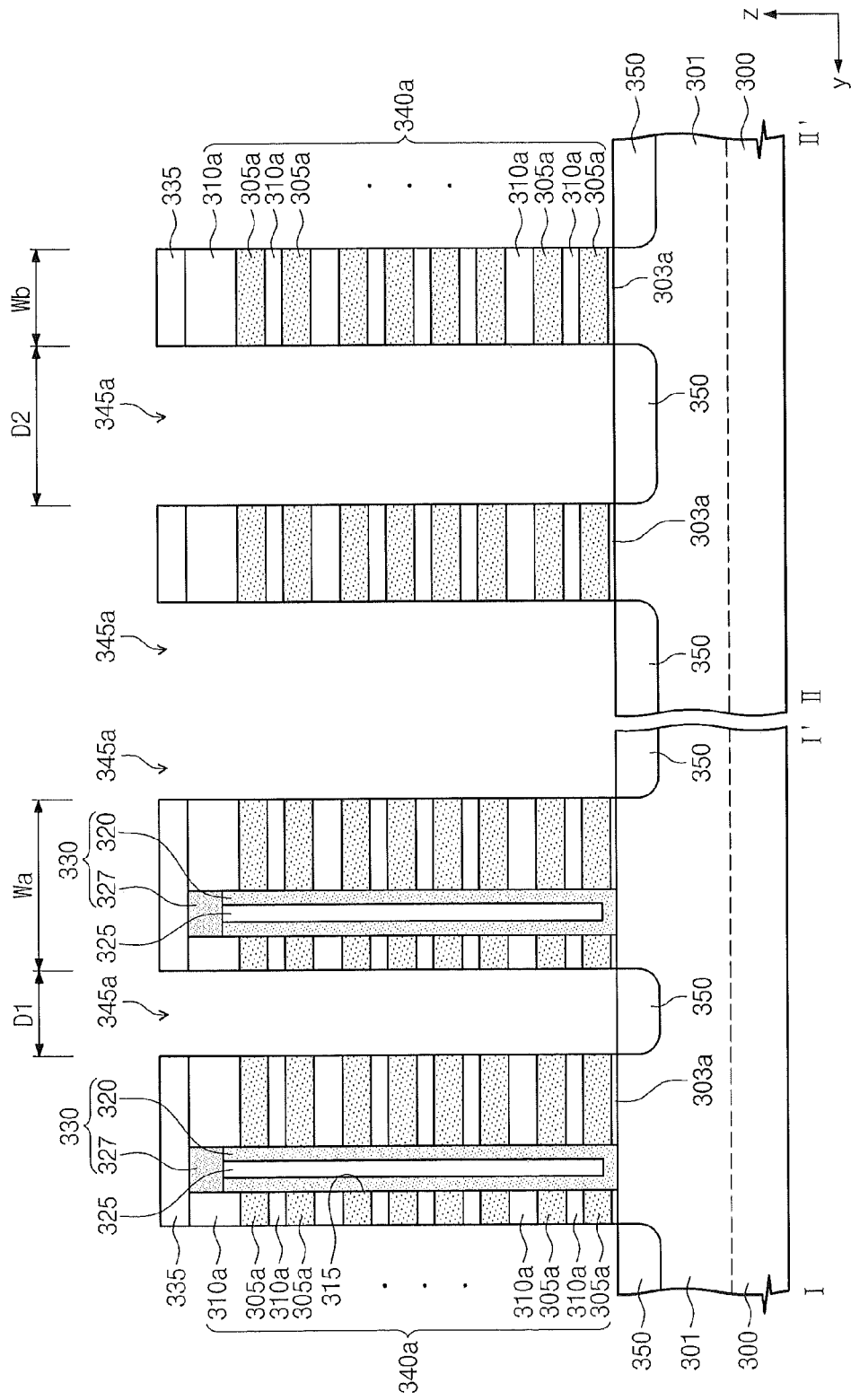
Figure 11B:
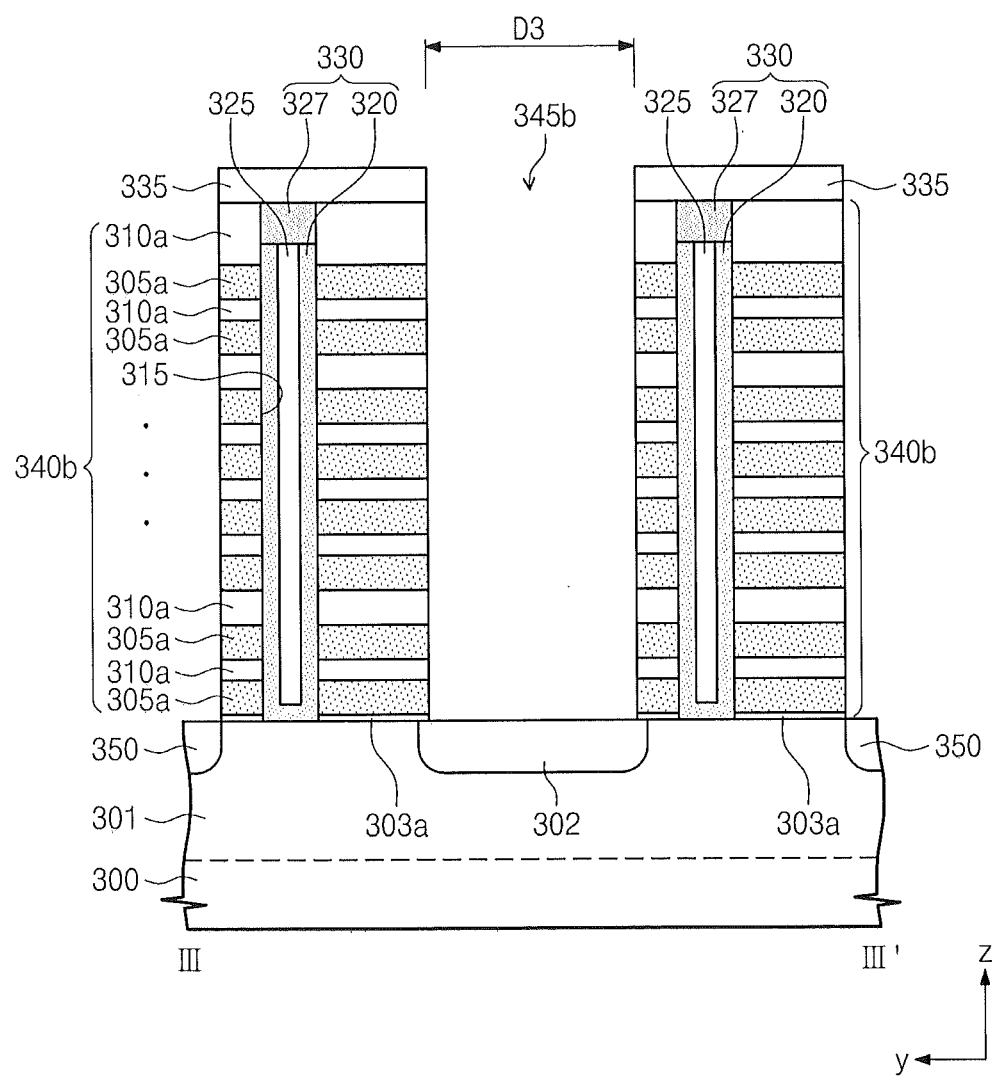

Referring to FIGS. 11A and 11B, a capping dielectric layer may be formed on the substrate 300 having the drain regions. The capping dielectric layer, the insulation layers 310, and the sacrificial layers 305 may be patterned to form trenches 345a and 345b defining a plurality of mold patterns 340a and 340b. As a result, capping dielectric patterns 335 may be formed on the mold patterns 340a and 340b, respectively. The respective capping dielectric patterns 335 may be vertically self-aligned with the respective mold patterns 340a and 340b thereunder. That is, sidewalls of each of the capping dielectric patterns 335 may be vertically self-aligned with sidewalls of the corresponding one of the mold patterns 340a and 340b.

Each of the mold patterns 340a and 340b may include sacrificial patterns 305a and insulation patterns 310a that are alternately and repeatedly stacked. The plurality of mold patterns may include first mold patterns 340a and second mold patterns 340b. The trenches may include first trenches 345a and a second trench 345b. The first trenches 345a may be defined between a pair of adjacent first mold patterns 340a, as illustrated in FIG. 11A. The second trench 345b may be defined between a pair of adjacent second mold patterns 340b, as illustrated in FIG. 11B. The first and second mold patterns 340a and 340b may have the same planar shape as the first and second stack-structures 370a and 370b illustrated in FIG. 8A, respectively. That is, the planar shape of the first mold patterns 340a may be the same as that of the first stack-structures 370a illustrated in FIG. 8A, and the planar shape of the second mold patterns 340b may be the same as that of the second stack-structures 370b illustrated in FIG. 8A.

As illustrated in FIG. 11A, each of the first trenches 345a may include a first region having a first width D1 and a second portion having a second width D2. The second width D2 may be greater than the first width D1. Each of the first mold patterns 340a may include a first portion adjacent the first region of the respective first trenches 345a, and a second portion adjacent the second region of the respective first trenches 345a. A width Wb of the second portion of the respective first mold patterns 340a may be less than a width Wa of the first portion of the respective first mold patterns 340a. As illustrated in FIG. 11B, the second trench 345b may have a third width D3. The second trench 345b may have substantially a uniform width.

Referring to FIGS. 11A and 11B, dopants of the second conductivity type may be injected into the well region 301 under the first trenches 345a to form common source regions 350. The substrate 300 under the second trench 345b may be protected by a mask pattern while the dopants of the second conductivity type may be injected into the well region 301 under the first trenches 345a. The well pickup region 302 may be located under the second trench 345b.

In some embodiments, the well pickup region 302 may be formed in the well region 301 before forming the buffer dielectric layer 303, and the second trench 345b may be aligned with the well pickup region 302. Alternatively, in some embodiments, the well pickup region 302 may be formed after formation of the second trench 345b. For example, after a mask pattern covering the substrate 300 under the first trenches 345a is formed, dopants of the first conductivity type may be injected into the well region 301 under the second trench 345b to form the well pickup region 302. As such, the well pickup region 302 may be formed to be self-aligned with the second trench 345b.

The buffer dielectric layer 303 under the first and second trenches 345a and 345b may be removed after formation of the common source regions 350. Alternatively, the buffer dielectric layer 303 under the first and second trenches 345a and 345b may be removed during formation of the first and second trenches 345a and 345b. If the buffer dielectric layer 303 under the first and second trenches 345a and 345b may be removed, buffer dielectric patterns 303a may be formed under the mold patterns 340a and 340b.

Figure 12A:
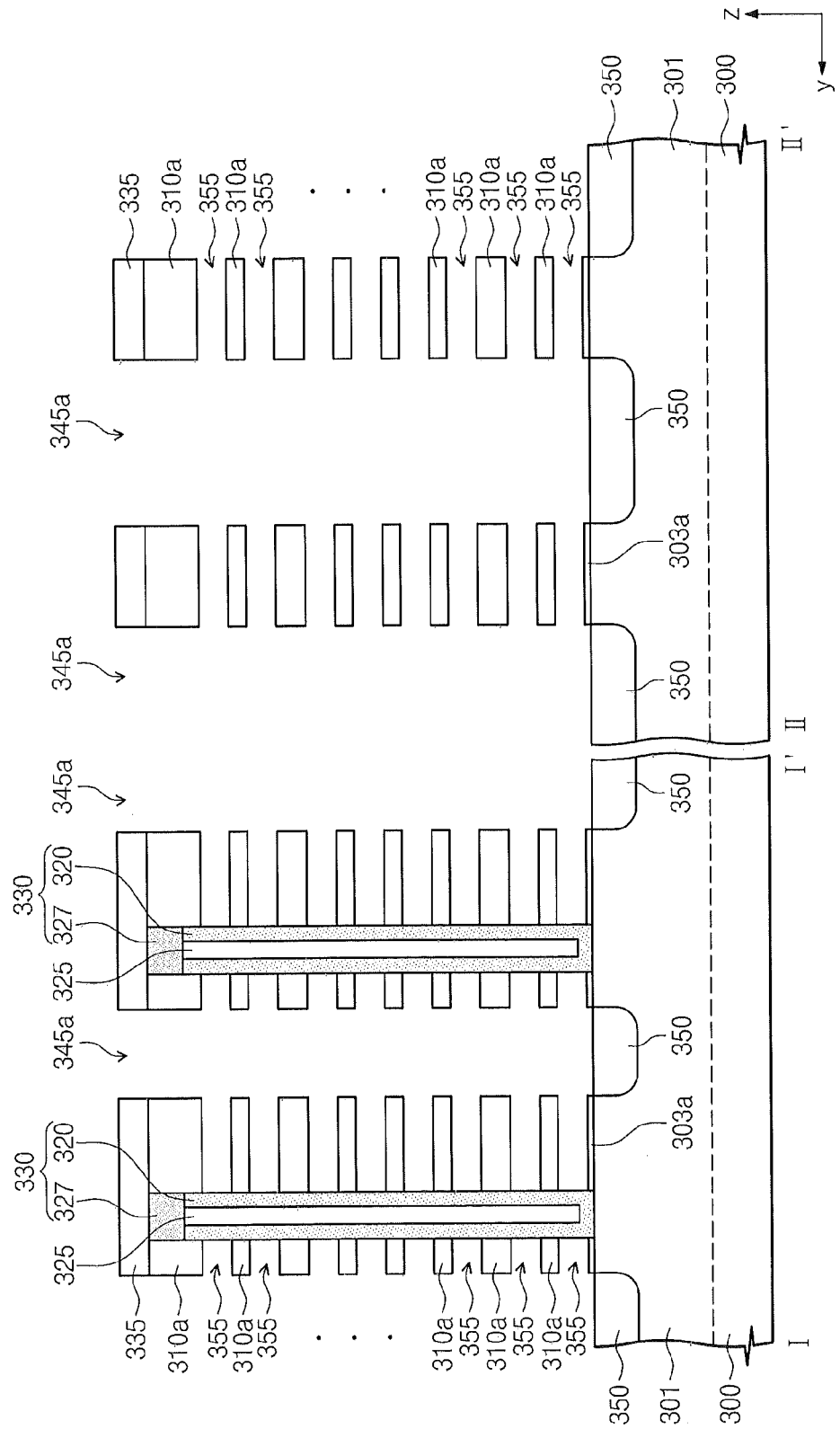
Figure 12B:
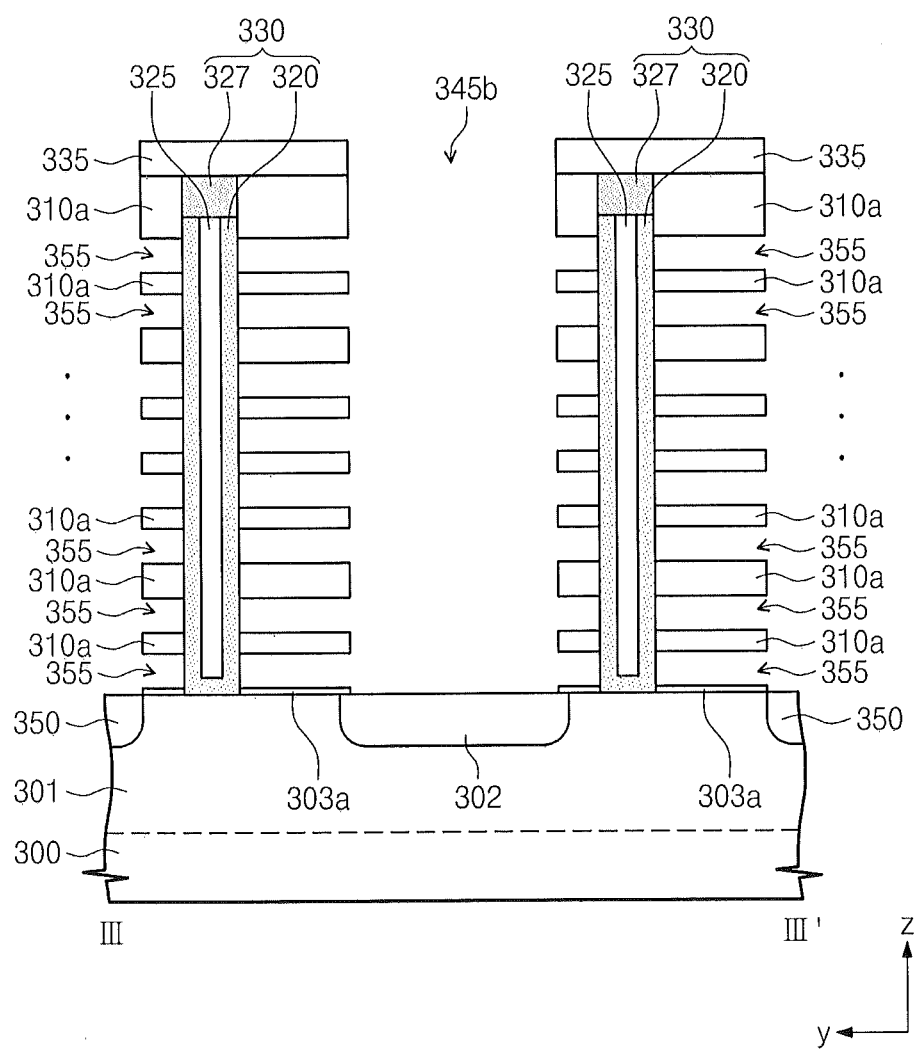

Referring to FIGS. 12A and 12B, the sacrificial patterns 305a may be removed to form empty regions 355. The empty regions 355 may expose some portions of sidewalls of the vertical active patterns 330. The insulation patterns 310a may be formed of a material layer having an etch selectivity with respect to the sacrificial patterns 305a. Thus, the insulation patterns 310a may still remain even though the sacrificial patterns 305a are removed. The insulation patterns 310a may be supported by the vertical active patterns 330. The empty regions 355 may be disposed between the stacked insulation patterns 310a.

Figure 13A:
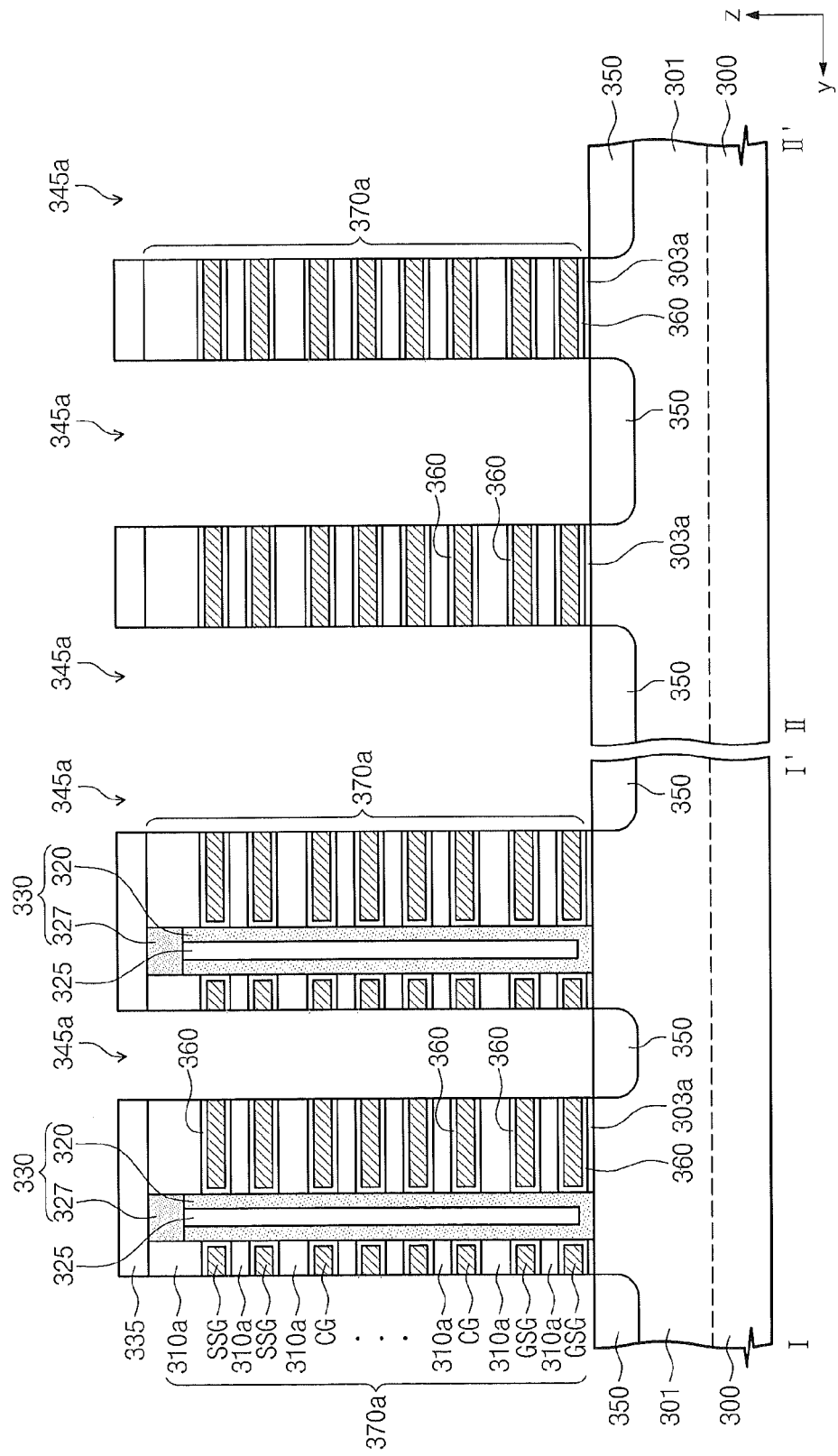
Figure 13B:
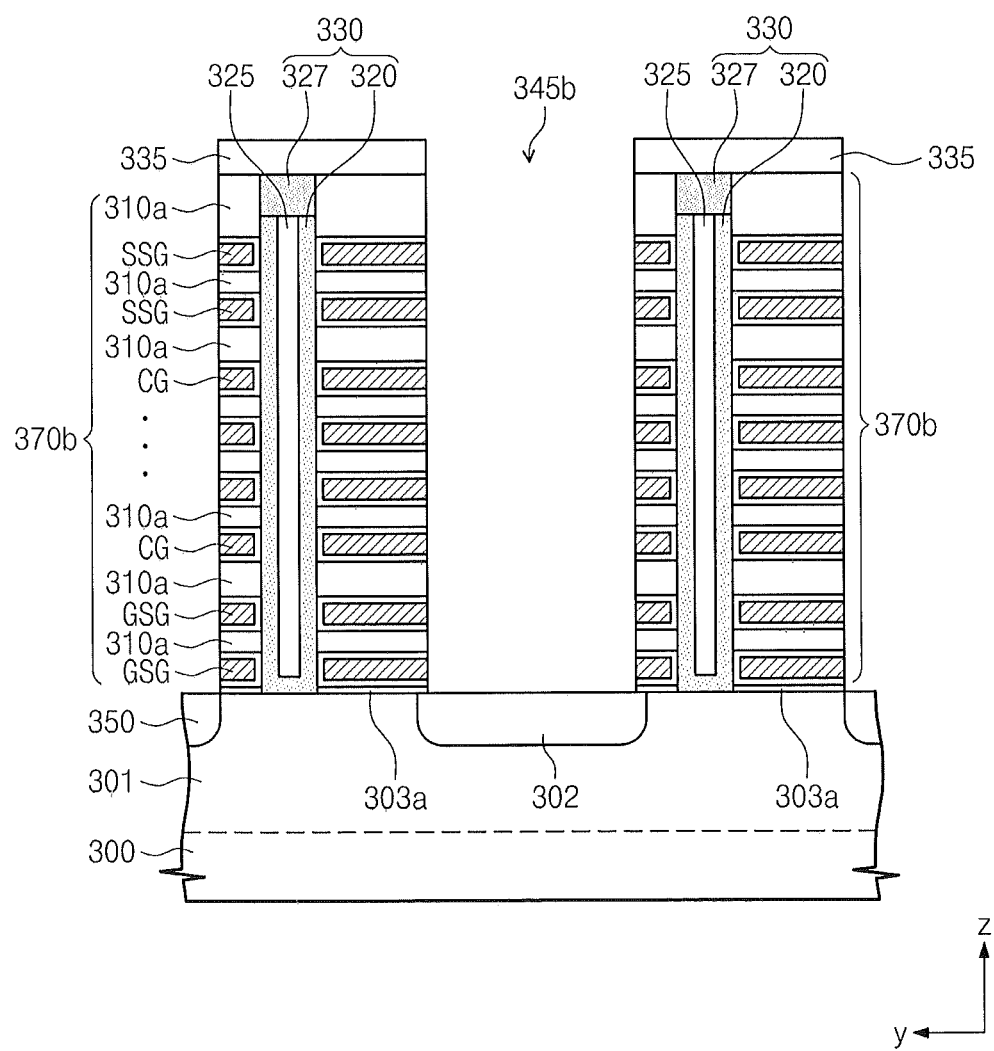

Referring to FIGS. 13A and 13B, a multi-layered dielectric layer 360 may be conformally formed on the substrate 300 having the empty regions 355, and a gate conductive layer filling the empty regions 355 may be formed on the multi-layered dielectric layer 360. Portions of the gate conductive layer that are formed outside of the empty regions 355 may be removed to form gate patterns GSG, CG, and SSG filling the empty regions 355. As a result, a plurality of stack-structures 370a and 370b may be formed on the substrate 300. Each of the stack-structures 370a and 370b may include the gate patterns GSG, CG, and SSG, and the insulation patterns 310a that are alternately and repeatedly stacked. Portions of the multi-layered dielectric layer 360 that are formed outside of the empty regions 355 may be removed after forming the gate patterns GSG, CG, and SSG.

The plurality of stack-structures may include first stack-structures 370a and second stack-structures 370b. Each of the first trenches 345a may be defined between a pair of adjacent first stack-structures 370a, and the second trench 345b may be defined between a pair of adjacent second stack-structures 370b.

Figure 14A:
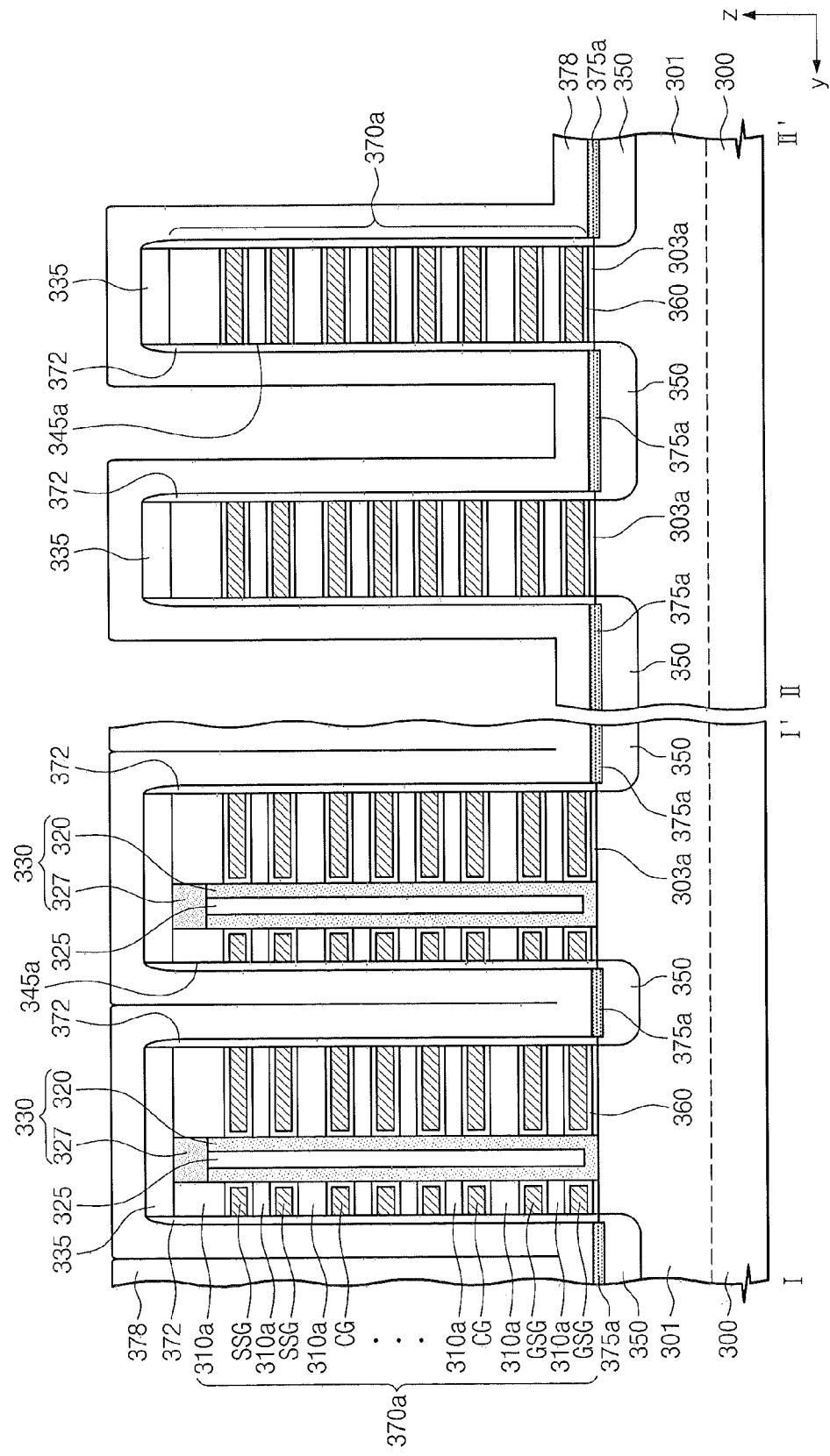
Figure 14B:
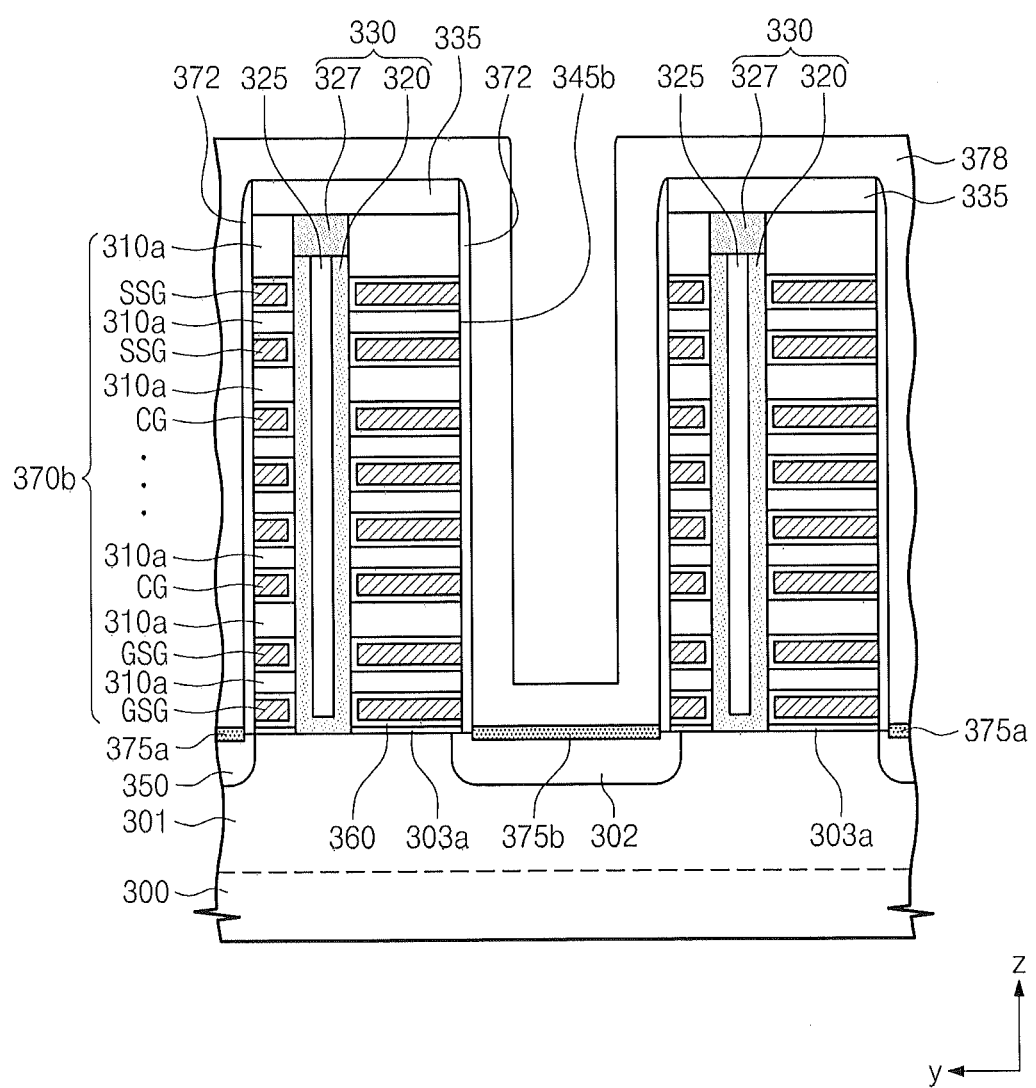

Referring to FIGS. 14A and 14B, a protection spacer layer may be conformally formed on the substrate 300 having the gate patterns GSG, CG, and SSG. The protection spacer layer may be anisotropically etched to form protection spacers 372 on sidewalls of the first and second trenches 345a and 345b.

First metal-semiconductor compound patterns 375a may be formed on the common source regions 350 after formation of the protection spacers 372. Similarly, a second metal-semiconductor compound pattern 375b may be formed on the well pickup region 302. The first and second metal-semiconductor compound patterns 375a and 375b may be simultaneously formed using a self-aligned silicide (e.g., SALICIDE) technique. For example, a metal layer may be formed on the substrate 300 having the protection spacers 372. The metal layer may contact (e.g., directly contact) the common source regions 350 and the well pickup region 302. An annealing process may be performed so that metal atoms in the metal layer react on semiconductor atoms in the common source regions 350 and the well pickup region 302. As a result, the first metal-semiconductor compound patterns 375a may be formed on the common source regions 350, and the second metal-semiconductor compound pattern 375b may be formed on the well pickup region 302. An unreacted metal layer may then be removed. The metal formation process and the annealing process may be performed using an in-situ technique. The metal layer may be formed of a cobalt layer, a nickel layer, or a titanium layer.

An insulating spacer layer 378 may be formed on the substrate 300 having the metal-semiconductor compound patterns 375a and 375b. In some embodiments, the insulating spacer layer 378 may fill the first regions of the first trenches 345a, whereas the insulating spacer layer 378 may be conformally formed in the second regions of the first trenches 345a. This may be because the second width D2 of the second regions is greater than the first width D1 of the first regions. In addition, the insulating spacer layer 378 may also be conformally formed in the second trench 345b.

Figure 15A:
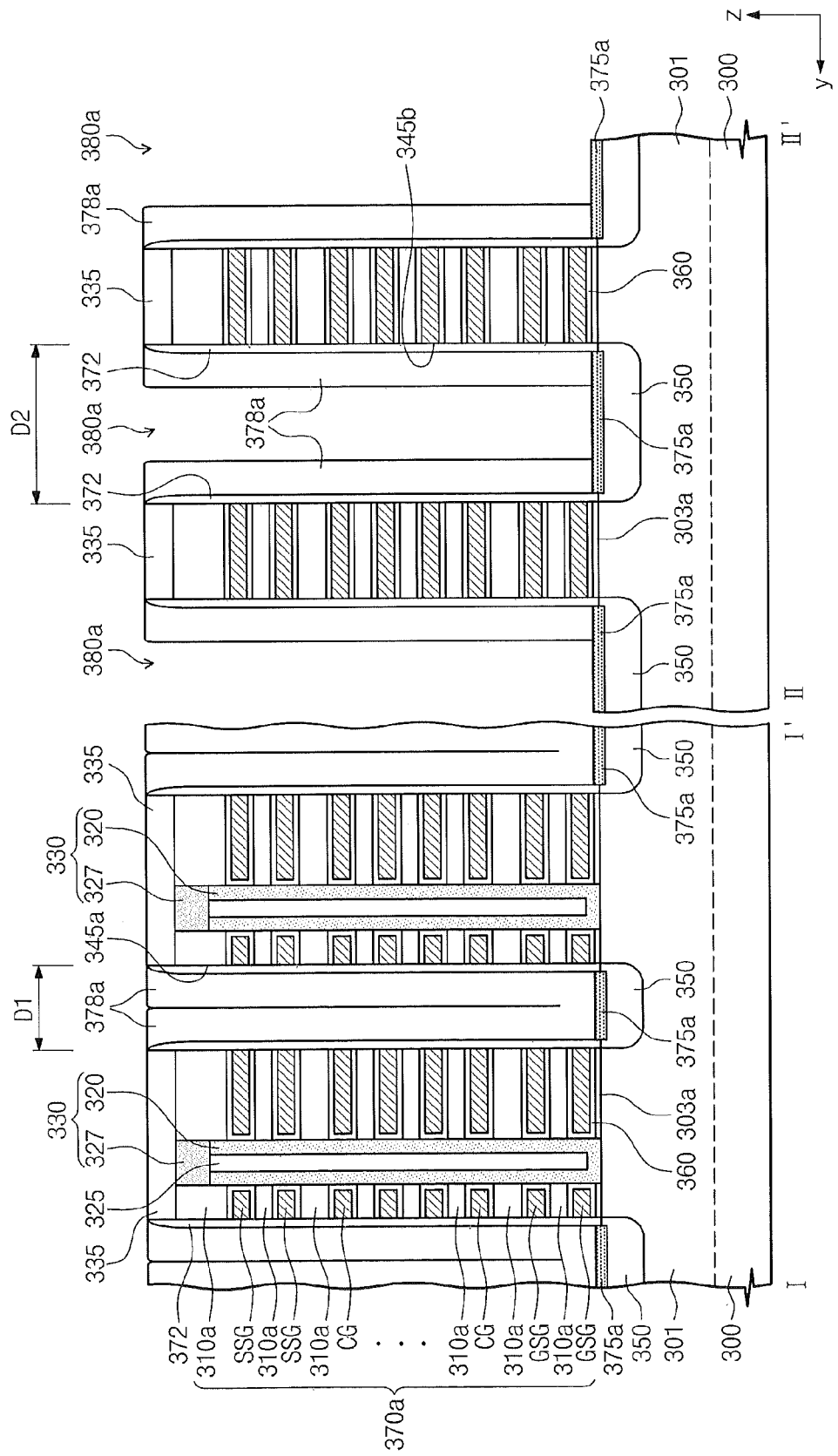
Figure 15B:
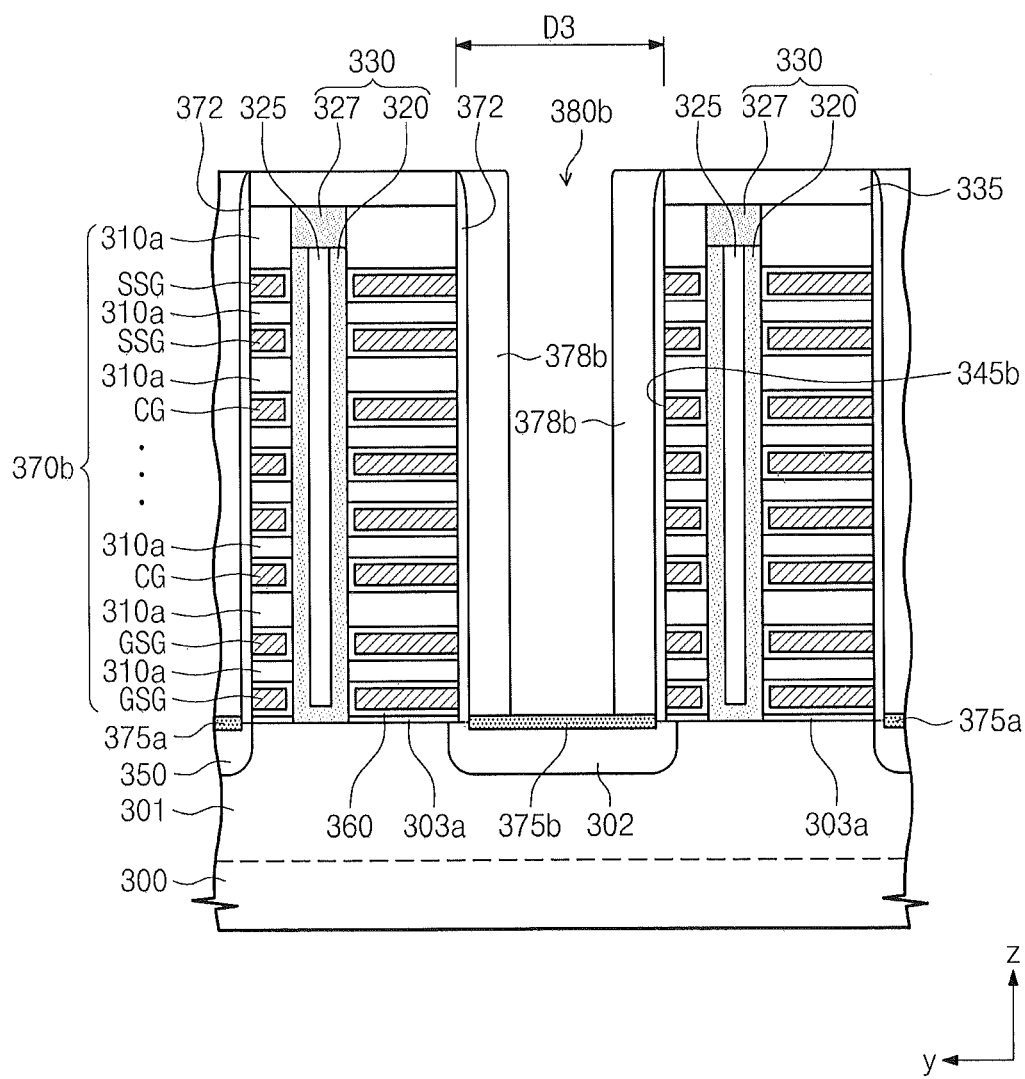

Referring to FIGS. 15A and 15B, the insulating spacer layer 378 may be anisotropically etched to form first insulating spacers 378a and second insulating spacers 378b. The first insulating spacers 378a may be formed on sidewalls (e.g., opposing sidewalls) of the first trenches 345a and the second insulating spacers 378b may be formed on sidewalls (e.g., opposing sidewalls) of the second trench 345b.

Each of the first trenches 345a may include the first region having the first width D1 and the second region having the second width D2. The pair of first insulating spacers 378a in each of the first regions may be in contact (e.g., direct contact) with each other, as illustrated in FIG. 15A. In contrast, the pair of first insulating spacers 378a in each of the second regions may be separated from each other, as further illustrated in FIG. 15A. Thus, a hole 380a surrounded by the first insulating spacers 378a may be provided in each of the second regions of the first trenches 345a. The holes 380a in the second regions may expose the first metal-semiconductor compound patterns 375a under the second regions.

The pair of second insulating spacers 378b in the second trench 345b may be separated from each other, as illustrated in FIG. 15B. Thus, a groove 380b may be provided between the pair of second insulating spacers 378b in the second trench 345b. The groove 380b may expose the second metal-semiconductor compound patterns 375b under the second trench 345b.

Figure 16A:
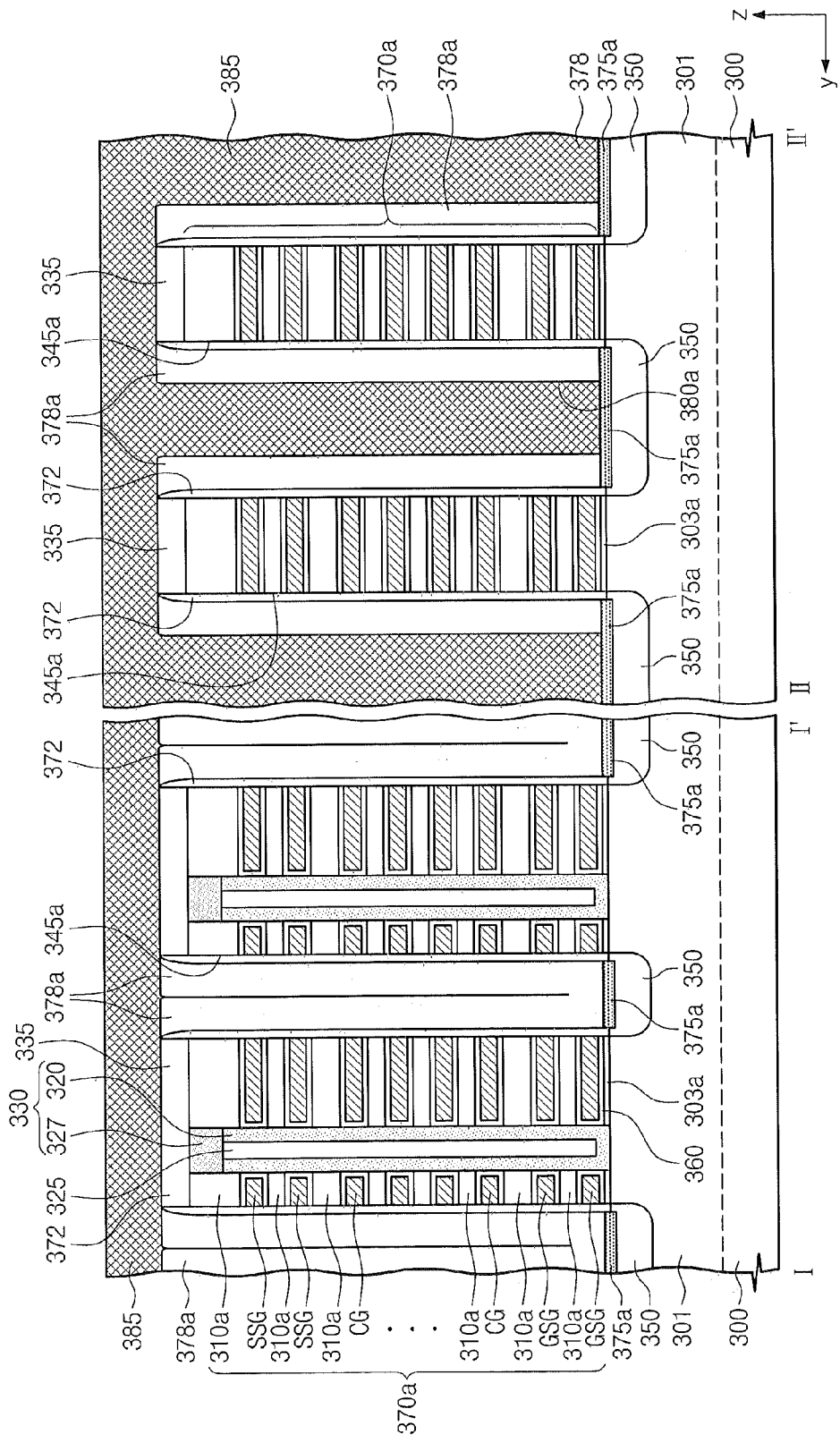
Figure 16B:
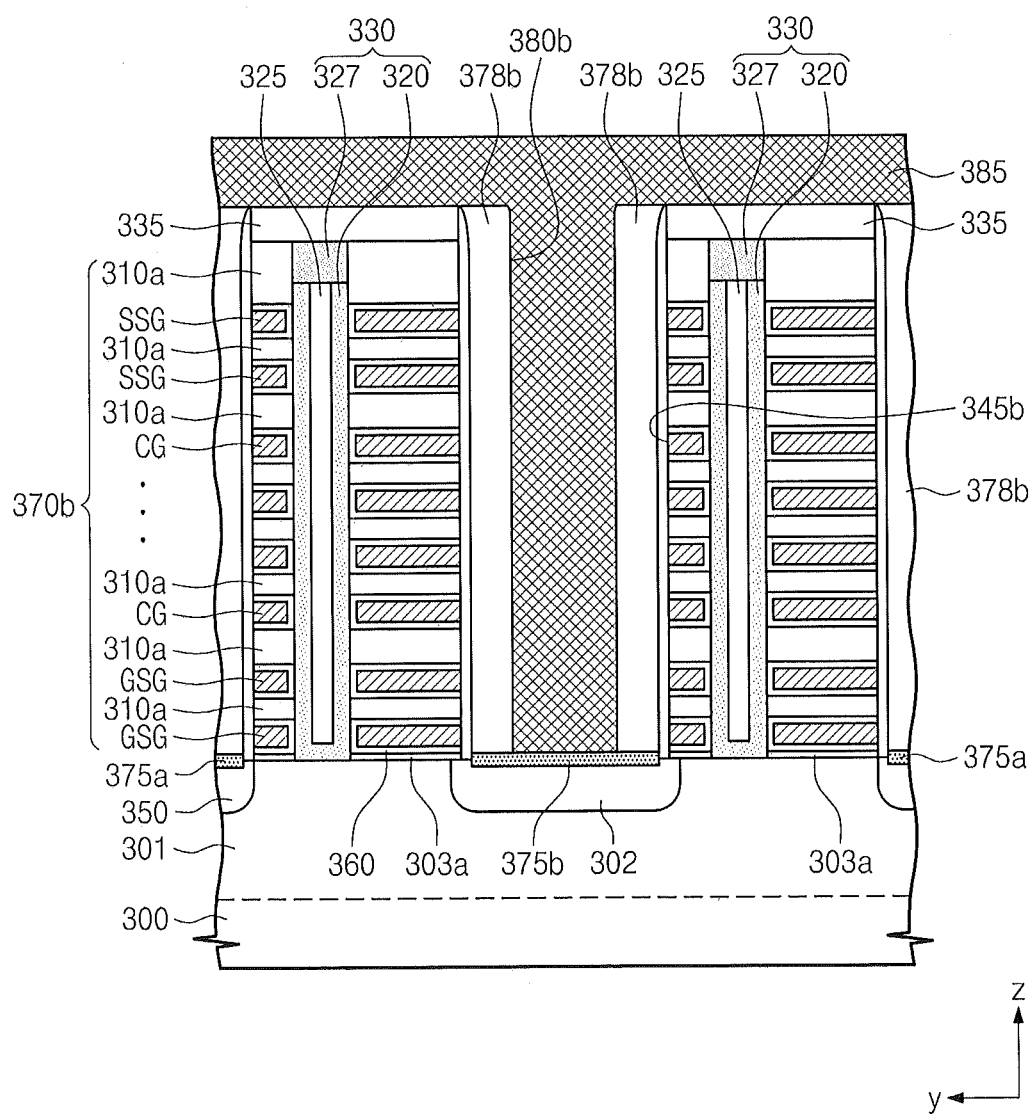

Referring to FIGS. 16A and 16B, a conductive layer 385 may be formed on the substrate 300 having the first and second insulating spacers 378a and 378b. The conductive layer 385 may be formed to substantially fill the holes 380a and the groove 380b.

Figure 17A:
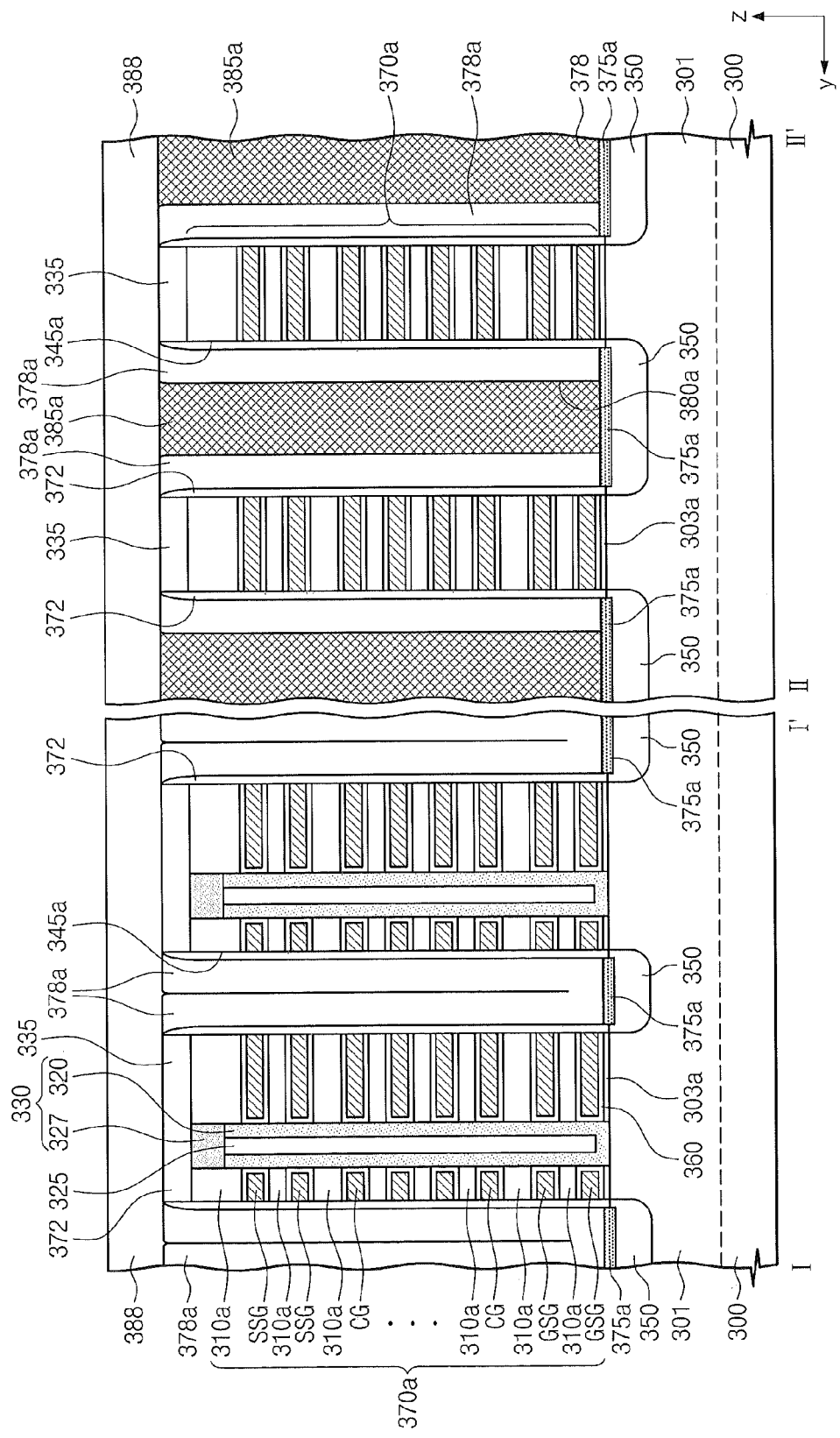
Figure 17B:
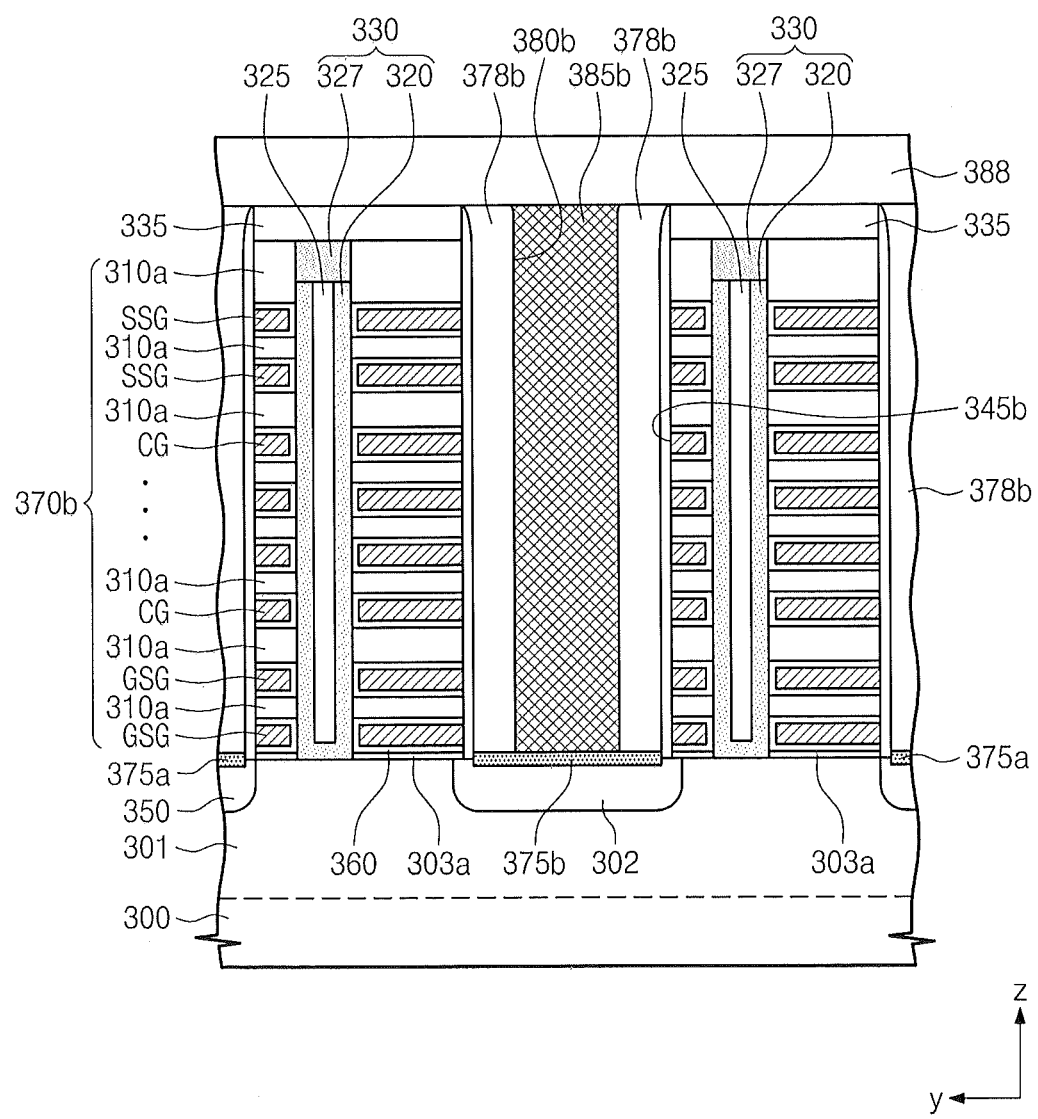

Referring to FIGS. 17A and 17B, the conductive layer 385 may be planarized until the insulating spacers 378a and 378b and/or the capping dielectric patterns 335 are exposed (e.g., surfaces farthest from the substrate 300 are exposed). As a result, strapping contact plugs 385a filling the holes 380a may be formed, and a well conductive line 385b filling the groove 380b may be formed. Some portions of the conductive layer 385 may remain on the first insulating spacers 378a in the first regions of the first trenches 345a after planarization of the conductive layer 385. The residues of the conductive layer 385 may be removed using a cleaning process. Alternatively, the residues of the conductive layer 385 may remain without use of the cleaning process. Even though the residues of the conductive layer 385 may remain, the residues of the conductive layer 385 may be electrically isolated by a subsequently-formed interlayer insulating layer. Thus, the residues of the conductive layer 385 may not significantly affect the operation of the three-dimensional semiconductor memory devices.

An interlayer insulating layer 388 may be then formed on the substrate 300 having the strapping contact plugs 385a and well conductive line 385b. Subsequently, first and second conductive plugs 390a and 390b penetrating the interlayer insulating layer 388 may be formed (e.g., as illustrated in FIG. 8B), and bit lines 395a and strapping line 395b may be formed on the interlayer insulating layer 388 (e.g., as illustrated in FIGS. 8B-8D. Accordingly, the three-dimensional semiconductor memory devices described with reference to FIGS. 8A-8D may be provided using the methods illustrated in FIGS. 10A-17B.

According to the fabrication methods of some embodiments, the holes 380a and the groove 380b may be formed to be self-aligned to the insulating spacers 378a and 378b, respectively. Thus, the reliability of the three-dimensional semiconductor memory devices may be improved, and process margin may be increased in fabrication of the three-dimensional semiconductor memory devices.

Figure 18A:
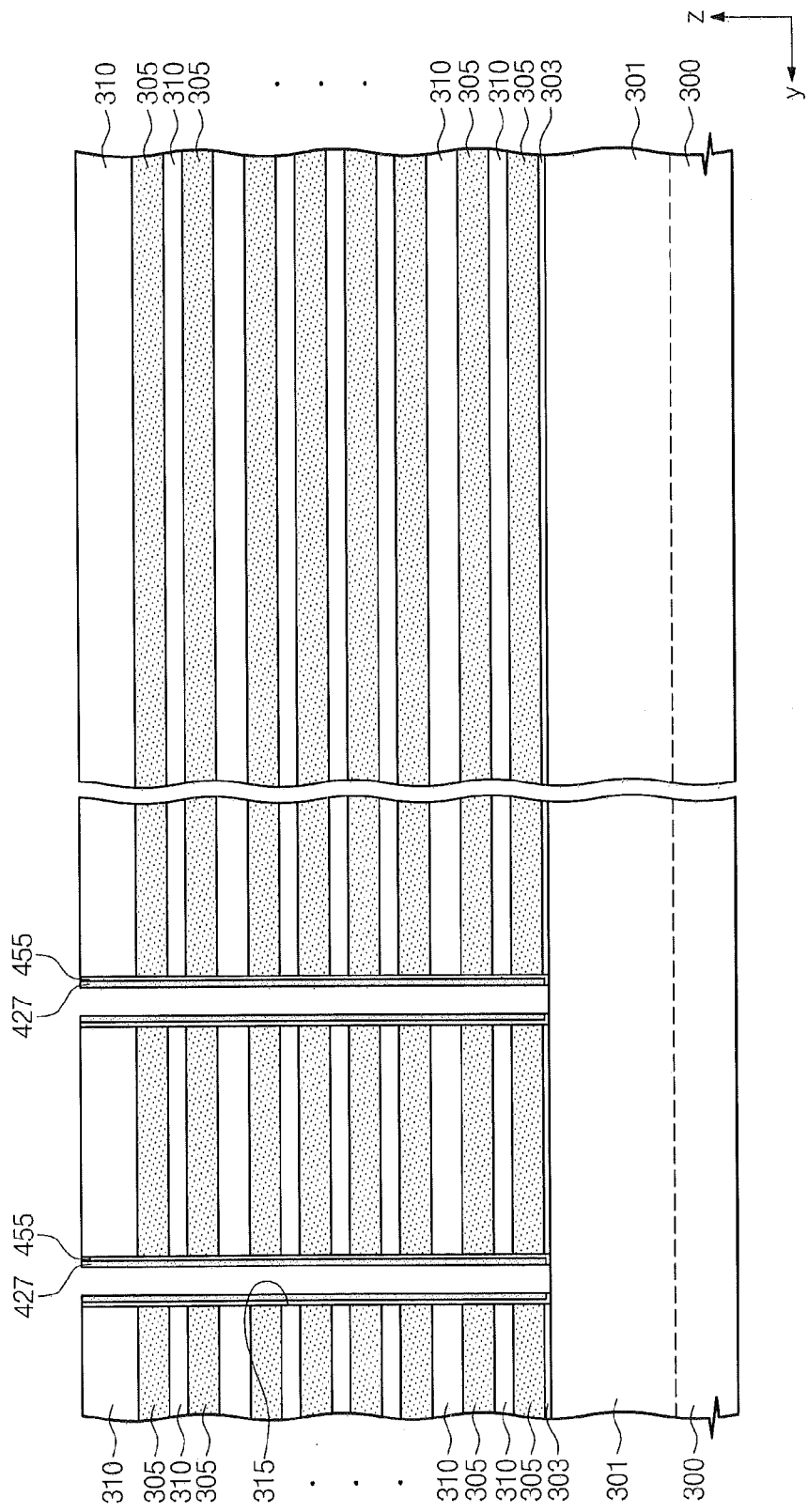
FIGS. 18A to 18C are merged cross-sectional views taken along lines I-I' and II-II' of FIG. 8A that illustrate methods of fabricating a three-dimensional semiconductor memory device of FIG. 9.
Figure 18B:
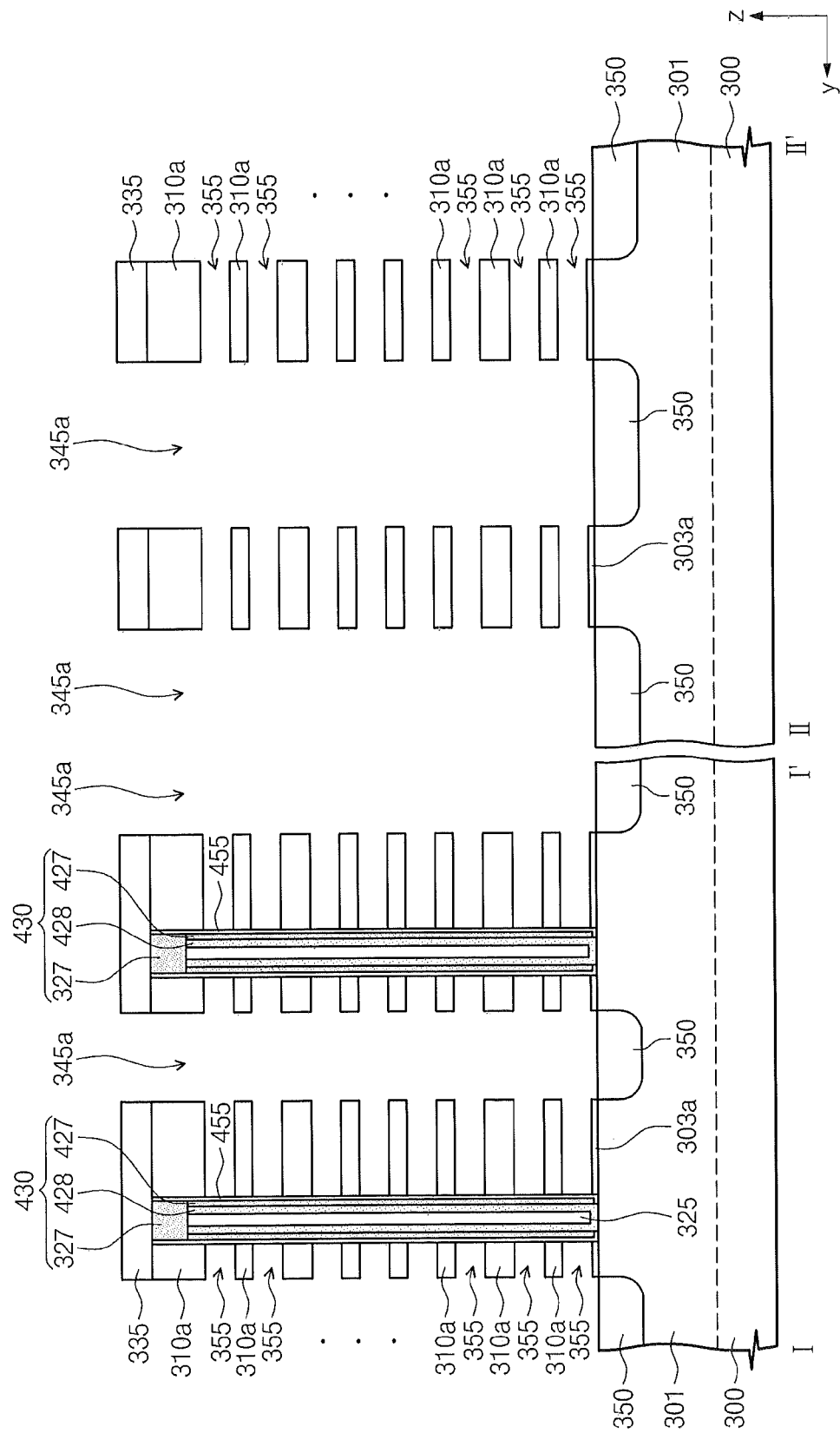
Figure 18C:
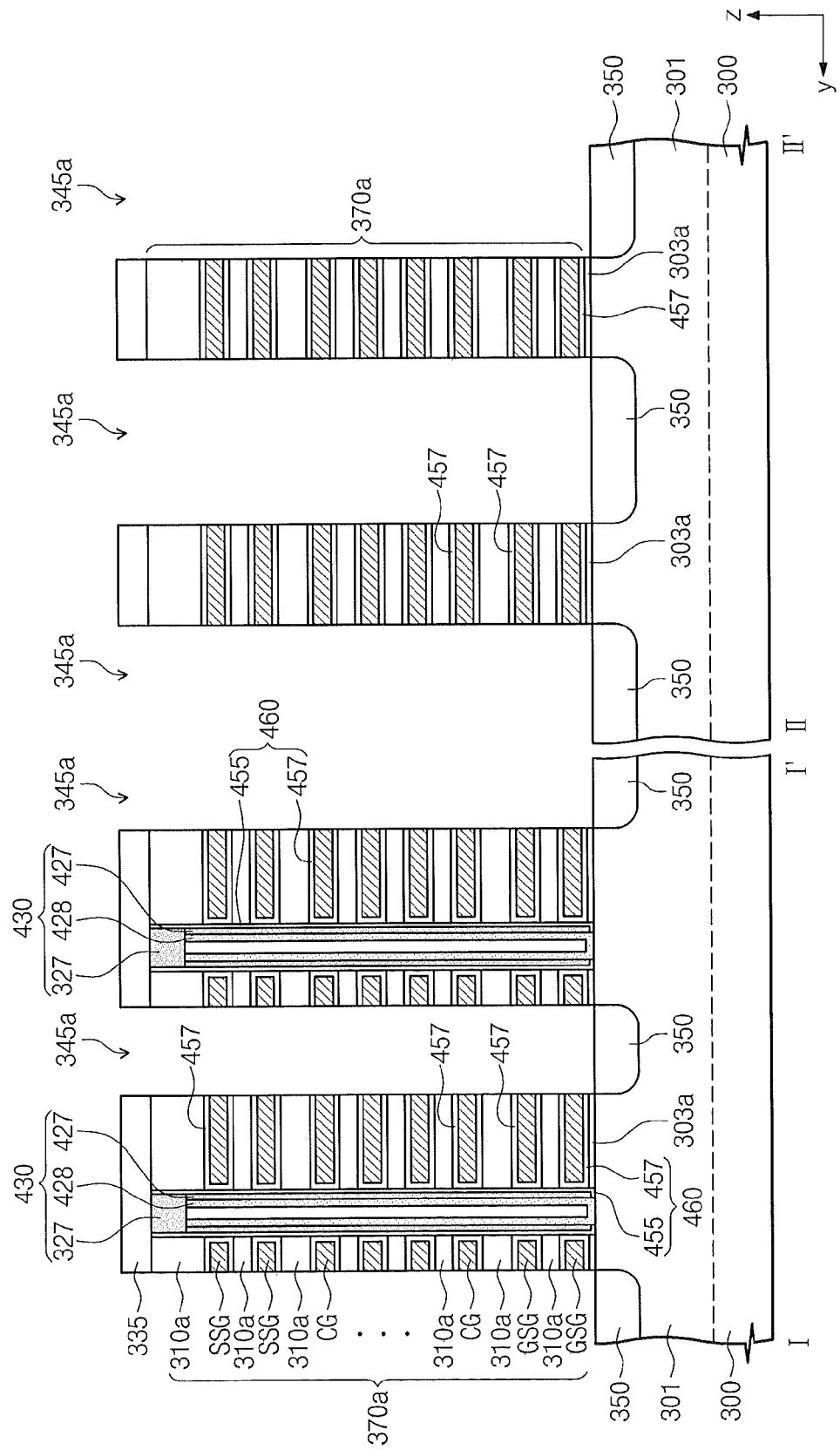

FIGS. 18A-18C are merged cross-sectional views taken along lines I-I' and II-II' of FIG. 8A to illustrate methods of fabricating a three-dimensional semiconductor memory device of FIG. 9.

Referring to FIG. 18A, a first sub-layer 455 may be conformally formed on a substrate 300 after formation of channel holes 315. A first semiconductor layer may be conformally formed on the first sub-layer 455. The first semiconductor layer and the first sub-layer 455 may be anisotropically etched until a well region 301 under the channel holes 315 is exposed. As a result, first vertical semiconductor patterns 427 may be formed on sidewalls of the channel holes 315. Due to the presence of the first sub-layer 455 in the channel holes 315, the first vertical semiconductor patterns 427 may not contact the well region 301.

Referring to FIG. 18B, a second semiconductor layer may be conformally formed on the substrate 300 having the first vertical semiconductor patterns 427, and a filling dielectric layer substantially filling the channel holes 315 may be formed on the second semiconductor layer. The filling dielectric layer and the second semiconductor layer may be planarized until the topmost (e.g., farthest from the substrate 300) insulation layer 310 is exposed, thereby forming a second vertical semiconductor pattern 428 and a filling dielectric pattern 325 surrounded by the second vertical semiconductor pattern 428 in each of the channel holes 315. Each of the second vertical semiconductor patterns 428 may contact (e.g., directly contact) the first vertical semiconductor pattern 427 and the well region 301 in the channel hole 315. The first and second vertical semiconductor patterns 427 and 428, and the filling dielectric patterns 325, may be recessed so that topmost (e.g., farthest from the substrate 300) surfaces of the first and second vertical semiconductor patterns 427 and 428, and the filling dielectric patterns 325, are located at a lower level (e.g., closer to the substrate 300) than a top surface of the topmost insulation layer 310. Capping semiconductor patterns 327 may be formed to fill the channel holes 315 on the recessed first and second vertical semiconductor patterns 427 and 428, and the recessed filling dielectric patterns 325. The first and second vertical semiconductor patterns 427 and 428, and the capping semiconductor pattern 327, in each of the channel holes 315 may constitute a vertical active pattern 430.

A capping dielectric layer may be formed on the substrate 300 having the capping semiconductor patterns 327. The capping dielectric layer, the insulation layers 310, and the sacrificial layers 305 may be patterned to form first trenches 345a. A second trench (e.g., the second trench 345b of FIG. 8C) may formed during formation of the first trenches 345a. The first trenches 345a may expose sacrificial patterns, and the sacrificial patterns may be removed to form empty regions 355. The empty regions 355 may expose the first sub-layers 455 on sidewalls of the vertical active patterns 430.

Referring to FIG. 18C, a second sub-layer 457 may be conformally formed on the substrate 300 having the empty regions 355, and a gate conductive layer may be formed on the second sub-layer 457. The gate conductive layer may be formed to substantially fill the empty regions 355. Portions of the gate conductive layer that are formed outside of the empty regions 355 may be removed to form gate patterns GSG, CG, and SSG substantially filling the empty regions 355. The first sub-layer 455 and the second sub-layer 457 may constitute a multi-layered dielectric layer 460. Subsequent processes may be performed using the methods illustrated in FIGS. 14A-17A and FIGS. 14B-17B.

Components of the three-dimensional semiconductor memory devices according to some embodiments may be combined/implemented in various forms.

For example, the three-dimensional semiconductor memory devices may be encapsulated using various packaging techniques. For example, the three-dimensional semiconductor memory devices according to some embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique, and a wafer-level processed stack package (WSP) technique.

The package in which a three-dimensional semiconductor memory device according to some embodiments is mounted may further include at least one semiconductor device (e.g., a controller, a memory device, and/or a hybrid device) having a different function from the three-dimensional semiconductor memory device.

Figure 19:
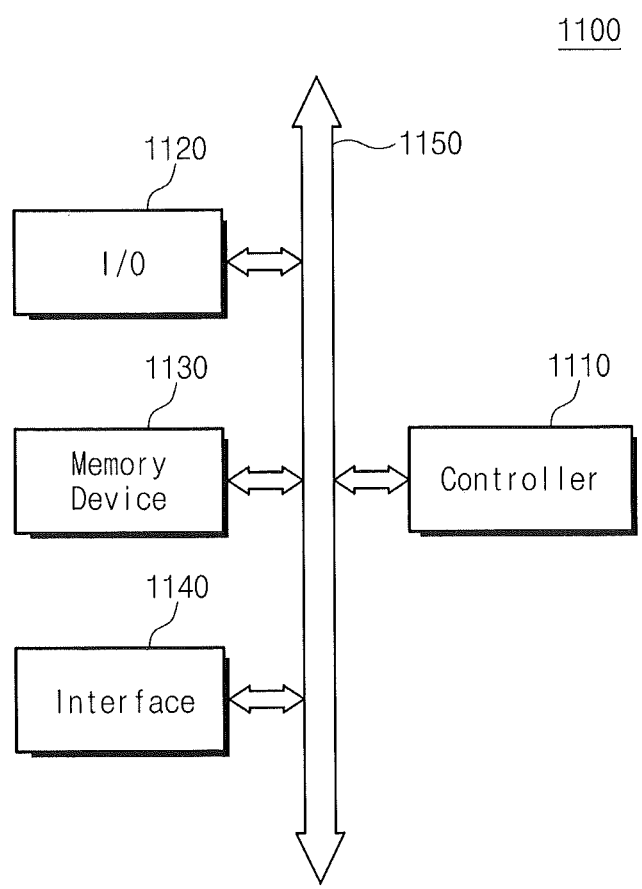
FIG. 19 is a schematic block diagram illustrating an example of electronic systems including three-dimensional semiconductor memory devices according to some embodiments.

FIG. 19 is a schematic block diagram illustrating an example of electronic systems including three-dimensional semiconductor memory devices according to some embodiments.

Referring to FIG. 19, an electronic system 1100 according to some embodiments may include a controller 1110, an input/output (I/O) unit 1120, a memory device 1130, an interface unit 1140, and a data bus 1150. At least two among the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device. Another logic device may have a similar function to any one of the microprocessor, the digital signal processor, and the microcontroller. The I/O unit 1120 may include a keypad, a keyboard, or a display unit. The memory device 1130 may store data and/or commands. The memory device 1130 may include at least one of the three-dimensional semiconductor memory devices according to some of embodiments described herein. The memory device 1130 may further include another type of semiconductor memory devices (e.g., a type that is different from the three-dimensional semiconductor memory devices described herein). For example, the memory device 1130 may further include a magnetic memory device, a phase change memory device, a dynamic random access memory (DRAM) device, and/or a static random access memory (SRAM) device. The interface unit 1140 may transmit electrical data to a communication network or may receive electrical data from a communication network. The interface unit 1140 may operate wirelessly or by cable. For example, the interface unit 1140 may include an antenna for wireless communication or a transceiver for cable communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card, or another electronic product. The other electronic product may receive or transmit information data wirelessly.

Figure 20:
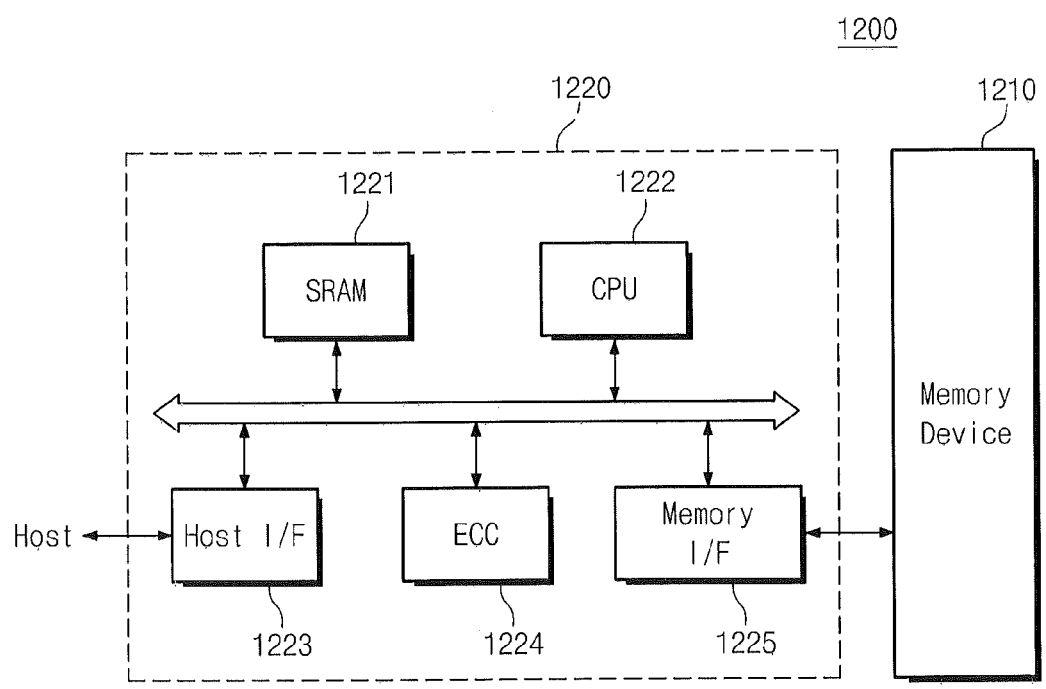
FIG. 20 is a schematic block diagram illustrating an example of memory cards including three-dimensional semiconductor memory devices according to some embodiments.

FIG. 20 is a schematic block diagram illustrating an example of memory cards including the three-dimensional semiconductor memory devices according to some embodiments.

Referring to FIG. 20, a memory card 1200 according to some embodiments may include a memory device 1210. The memory device 1210 may include at least one of the three-dimensional semiconductor memory devices according to some of the embodiments described herein. In some embodiments, the memory device 1210 may further include another type of semiconductor memory devices (e.g., a type that is different from the three-dimensional semiconductor memory devices described herein). For example, the memory device 1210 may further include a magnetic memory device, a phase change memory device, a dynamic random access memory (DRAM) device, and/or a static random access memory (SRAM) device. The memory card 1200 may include a memory controller 1220 that controls data communication between a host and the memory device 1210.

The memory controller 1220 may include a processing unit (e.g., a central processing unit (CPU)) 1222 that controls overall operations of the memory card 1200. In addition, the memory controller 1220 may include an SRAM device 1221 used as an operation memory of the processing unit 1222. Moreover, the memory controller 1220 may further include a host interface (I/F) unit 1223 and a memory interface (I/F/) unit 1225. The host interface unit 1223 may be configured to include a data communication protocol. The memory interface unit 1225 may control the communication between the memory controller 1220 and the memory device 1210. The memory controller 1220 may further include an error check and correction (ECC) block 1224. The ECC block 1224 may detect and correct errors of data that are read out from the memory device 1210. The memory card 1200 may further include a read-only memory (ROM) device that stores code data to interface with the host. The memory card 1200 may be used as a portable data storage card. Alternatively, the memory card 1200 may replace hard disks of computer systems with solid state disks of the computer systems.

According to some embodiments, strapping contact plugs may contact (e.g., directly contact) respective common source regions. Thus, the electrical resistance of each of the common source regions may be reduced/minimized. Further, each of the strapping contact plugs may be disposed adjacent/beside a second portion of a stack-structure, and the second portion of the stack-structure may have a relatively narrow width. Thus, a planar area of a portion of each of the common source regions electrically connected to the strapping contact plugs may be increased/maximized (e.g., may be relatively large) within a limited area because of the presence of the relatively-narrow second portions of the stack-structures. Accordingly, the three-dimensional semiconductor memory devices according to some embodiments may be improved/optimized to have high reliability and high integration density.

While the inventive concept has been particularly shown and described with reference to various embodiments thereof, it will be understood by those of ordinary skill in the art that various changes in form and details may be made therein without departing from the spirit and scope of the inventive concept as defined by the following claims. Therefore, the above-disclosed subject matter is to be considered illustrative and not restrictive.

What is claimed is:

1. A three-dimensional semiconductor memory device comprising:
    a stack-structure extending in a first direction on a substrate, the stack-structure including gate patterns and insulation patterns that are alternately and repeatedly stacked, the stack-structure including a first portion and a second portion, and the second portion of the stack-structure having a narrower width than the first portion in a second direction substantially perpendicular to the first direction;
    a plurality of vertical active patterns penetrating the stack-structure;
    a multi-layered dielectric layer between a sidewall of one of the plurality of vertical active patterns and corresponding ones of the gate patterns;
    a common source region in the substrate adjacent one side of the stack-structure; and
    a strapping contact plug on the common source region, wherein the strapping contact plug is adjacent the second portion of the stack-structure having the narrower width.

2. The device of claim 1:
    wherein the first portion of the stack-structure has opposing first and second sidewalls extending substantially in parallel with the first direction;
    wherein the second portion of the stack-structure has opposing first and second sidewalls;
    wherein the first sidewall of the second portion of the stack-structure is recessed toward the second sidewall of the second portion of the stack-structure to have a concave shape when viewed from a plan view; and
    wherein the strapping contact plug is adjacent the first sidewall of the second portion of the stack-structure.

3. The device of claim 2, wherein the second sidewalls of the first and second portions of the stack-structure define a substantially flat sidewall that extends substantially in the first direction.

4. The device of claim 2, wherein the second sidewall of the second portion of the stack-structure is recessed toward the first sidewall of the second portion of the stack-structure to have a concave shape when viewed from a plan view.

5. The device of claim 1:
    wherein the common source region extends substantially in the first direction;
    wherein the common source region includes a non-landing portion adjacent the first portion of the stack-structure and a landing portion adjacent the second portion of the stack-structure;
    wherein the landing portion and the non-landing portion each have a width in the second direction; and
    wherein the width of the landing portion is greater than that of the non-landing portion.

6. The device of claim 1, further comprising an isolation pattern on the common source region,
    wherein the strapping contact plug penetrates the isolation pattern to be electrically connected to the common source region.

7. The device of claim 1, further comprising an insulating spacer on a sidewall of the stack-structure,
    wherein a portion of the insulating spacer is between the strapping contact plug and the second portion of the stack-structure, and wherein the strapping contact plug contacts the insulating spacer.

8. The device of claim 1, further comprising:
    a bit line electrically connected to an upper end of the one of the plurality of vertical active patterns; and
    a strapping line electrically connected to the strapping contact plug.

9. The device of claim 8:
    wherein the bit line and the strapping line are substantially coplanar; and
    wherein the bit line and the strapping line extend substantially in the second direction.

10. The device of claim 1, wherein the multi-layered dielectric layer covers top and bottom surfaces of the corresponding ones of the gate patterns.

11. A three-dimensional semiconductor memory device comprising:
    a plurality of stack-structures extending in parallel in a first direction on a substrate, the plurality of stack-structures being separated from each other in a second direction substantially perpendicular to the first direction, and each of the plurality of stack-structures including gate patterns and insulation patterns that are alternately and repeatedly stacked;
    a plurality of vertical active patterns penetrating respective ones of the plurality of stack-structures;
    a plurality of multi-layered dielectric layers between respective sidewalls of the plurality of vertical active patterns and respective ones of the gate patterns;
    a plurality of common source regions formed in the substrate under trenches defined between the plurality of stack-structures; and
    a strapping contact plug electrically connected to one of the plurality of common source regions, wherein the strapping contact plug is between a pair of the plurality of stack-structures, wherein at least one stack-structure in the pair of the plurality of stack-structures includes a first portion and a second portion, wherein the first and second portions each have a width substantially in the second direction, wherein the width of the second portion is less than that of the first portion, and wherein the strapping contact plug is adjacent one side of the second portion having the width that is less than that of the first portion.

12. The device of claim 11:

wherein the one of the plurality of common source regions that is electrically connected to the strapping contact plug includes a non-landing portion and a landing portion;

wherein the landing portion has a greater width than the non-landing portion in the second direction; and wherein the landing portion is one among a plurality of landing portions arrayed in the second direction along with a plurality of second portions of the plurality of stack-structures.

13. The device of claim 11:

wherein the strapping contact plug includes a plurality of strapping contact plugs, and the plurality of strapping contact plugs are electrically connected to respective ones of the plurality of common source regions;

wherein each of the plurality of stack-structures includes a first portion and a second portion; and wherein the plurality of strapping contact plugs and the second portions of the stack-structures are alternately and repeatedly arrayed in the second direction.

14. The device of claim 11, further comprising:

a connection doped region in the substrate to electrically connect the plurality of common source regions to each other, the connection doped region extending in the second direction; and a strapping line electrically connected to a top surface of the strapping contact plug, wherein the strapping line extends substantially in the second direction, and wherein a quantity of strapping contact plugs connected to the strapping line is less than a quantity of the common source regions.

15. The device of claim 11, further comprising a pair of insulating spacers on opposing sidewalls of each of the trenches, wherein one of the trenches is on the one of the plurality of common source regions that is electrically connected to the strapping contact plug, and includes a first region adjacent the first portion of the at least one stack-structure and a second region adjacent the second portion of the at least one stack-structure, wherein the pair of insulating spacers contact each other in the first region, and are separated from each other in the second region to define a hole surrounded by the pair of insulating spacers, and wherein the strapping contact plug is in the hole.

16. A three-dimensional semiconductor device comprising:

first and second stack structures each including gate patterns and an insulating pattern between the gate patterns;

first and second active patterns penetrating the first and second stack structures, respectively;

a common source region between the first and second stack structures;

a strapping contact plug on a first portion of the common source region that is between second and third portions of the common source region, wherein a distance between the first and second stack structures is longer in the first portion of the common source region than in either of the second and third portions of the common source region; and a strapping line on the first and second stack structures and on the strapping contact plug.

17. The device of claim 16:

wherein the first portion of the common source region borders a recessed area in the first stack structure;

wherein the common source region extends in a first direction from the first portion thereof to the second or third portion thereof; and wherein the distance between the first and second stack structures is defined in a second direction substantially perpendicular to the first direction.

18. The device of claim 16:

wherein the first portion of the common source region borders first and second recessed areas in the first and second stack structures, respectively;

wherein the common source region extends in a first direction from the first portion thereof to the second or third portion thereof; and wherein the distance between the first and second stack structures is defined in a second direction substantially perpendicular to the first direction.

19. The device of claim 16, further comprising a metal-semiconductor compound material pattern between the strapping contact plug and the common source region.

20. The device of claim 16, further comprising first and second insulating spacers on first and second sidewalls of the strapping contact plug such that the first and second insulating spacers are between the strapping contact plug and the first and second stack structures, respectively.

* * * * *